(12) United States Patent
Okuyama et al.

(10) Patent No.: US 7,129,515 B2
(45) Date of Patent: *Oct. 31, 2006

(54) LIGHTING SYSTEM

(75) Inventors: Hiroyuki Okuyama, Kanagawa (JP); Masato Doi, Kanagawa (JP); Goshi Biwa, Kanagawa (JP); Toyoharu Oohata, Kanagawa (JP); Tomoyuki Kikutani, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/098,302

(22) Filed: Mar. 31, 2005

(65) Prior Publication Data

US 2005/0167678 A1 Aug. 4, 2005

Related U.S. Application Data

(63) Continuation of application No. 10/062,687, filed on Jan. 30, 2002, now Pat. No. 6,924,500, which is a continuation of application No. PCT/JP01/06212, filed on Jul. 18, 2001.

(30) Foreign Application Priority Data

| Jul. 18, 2000 | (JP) | ............... P2000-217508 |
| Jul. 18, 2000 | (JP) | ............... P2000-217663 |
| Jul. 18, 2000 | (JP) | ............... P2000-217799 |
| Jul. 18, 2000 | (JP) | ............... P2000-218034 |
| Jul. 18, 2000 | (JP) | ............... P2000-218101 |
| Jun. 29, 2001 | (JP) | ............... P2001-200183 |

(51) Int. Cl.
*H01L 29/20* (2006.01)
*H01L 31/036* (2006.01)

(52) U.S. Cl. .................. 257/13; 257/103; 257/E33.003
(58) Field of Classification Search .................. 257/15, 257/22, 76, E33.003, E33.025, E33.028; 372/5, 43.01, 44.011
See application file for complete search history.

(56) References Cited

U.S. PATENT DOCUMENTS

| 5,814,839 | A  | * | 9/1998  | Hosoba .................... 257/96 |
| 5,981,977 | A  | * | 11/1999 | Furukawa et al. .......... 257/94 |
| 6,320,209 | B1 | * | 11/2001 | Hata et al. ................. 257/190 |
| 6,924,500 | B1 | * | 8/2005  | Okuyama et al. .......... 257/13 |

FOREIGN PATENT DOCUMENTS

| JP | 09129974 A | * | 5/1997 |
| JP | 10312971 A | * | 11/1998 |

OTHER PUBLICATIONS

Tachibana et al., "Selective growth of InGaN quantum dot structures and their microphotoluminescence at room temperature," May 29, 2000, Applied Physics Letters, vol. 76, No. 22, pp. 3212-3214.*

* cited by examiner

*Primary Examiner*—Carl Whitehead, Jr.
*Assistant Examiner*—Jennifer M Dolan
(74) *Attorney, Agent, or Firm*—Bell, Boyd & Lloyd LLC

(57) ABSTRACT

Semiconductor light-emitting devices are provided. The semiconductor light-emitting devices include a substrate and a crystal layer selectively grown thereon at least a portion of the crystal layer is oriented along a plane that slants to or diagonally intersect a principal plane of orientation associated with the substrate thereby for example, enhancing crystal properties, preventing threading dislocations, and facilitating device miniaturization and separation during manufacturing and use thereof.

1 Claim, 71 Drawing Sheets

PRIOR ART

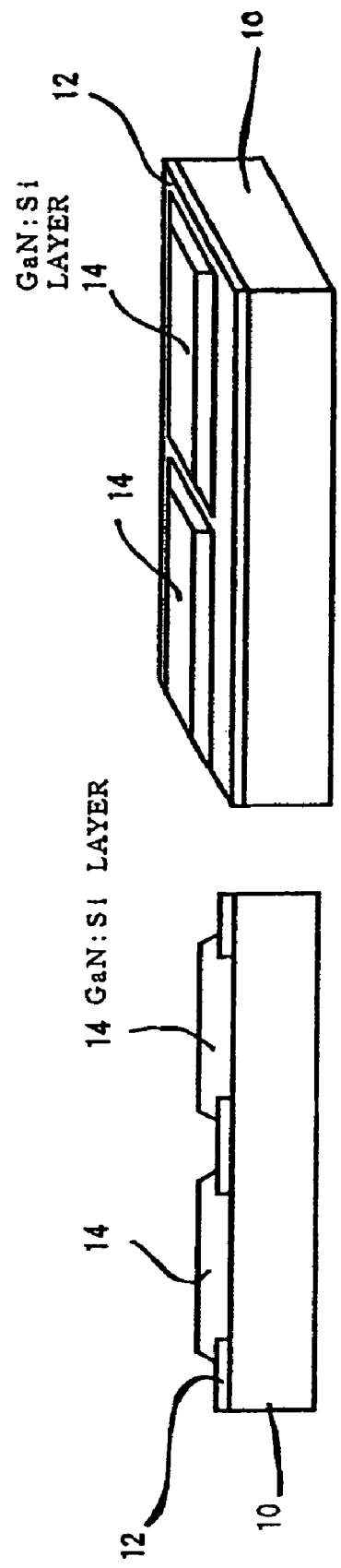

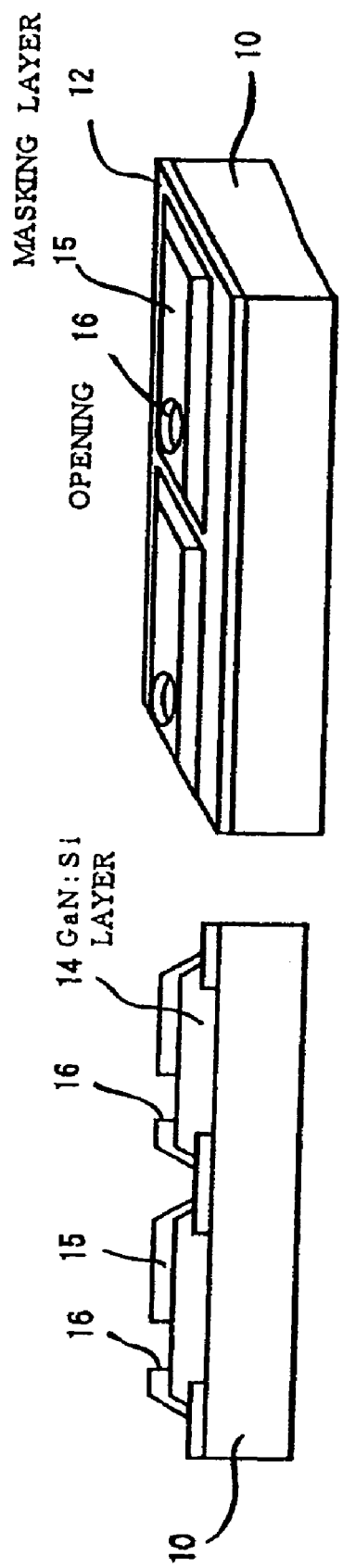
FIG. 5A / FIG. 5B

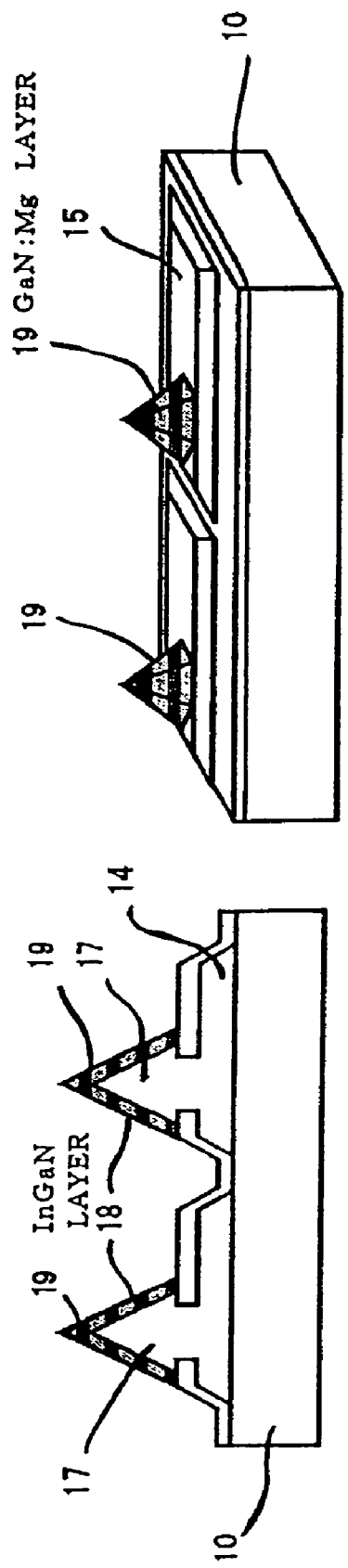

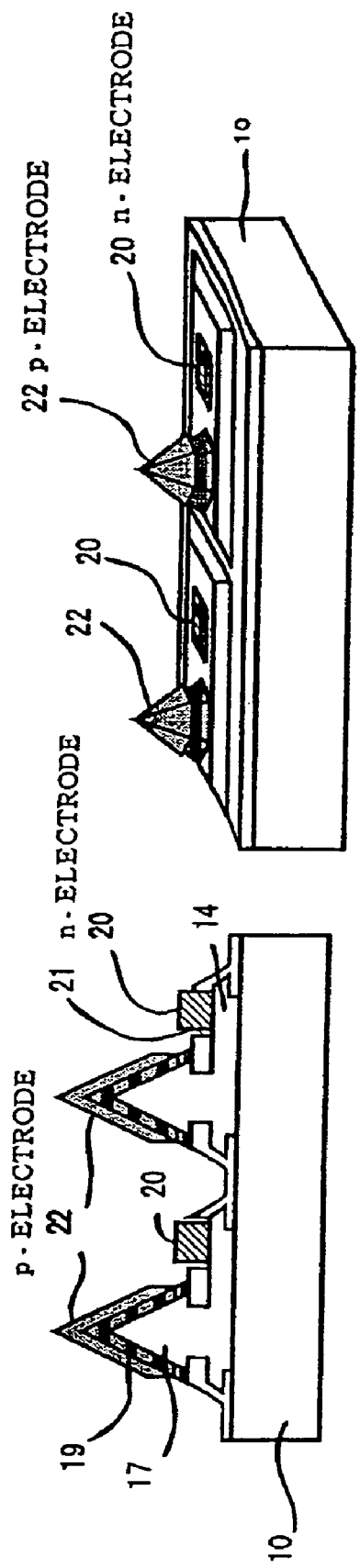

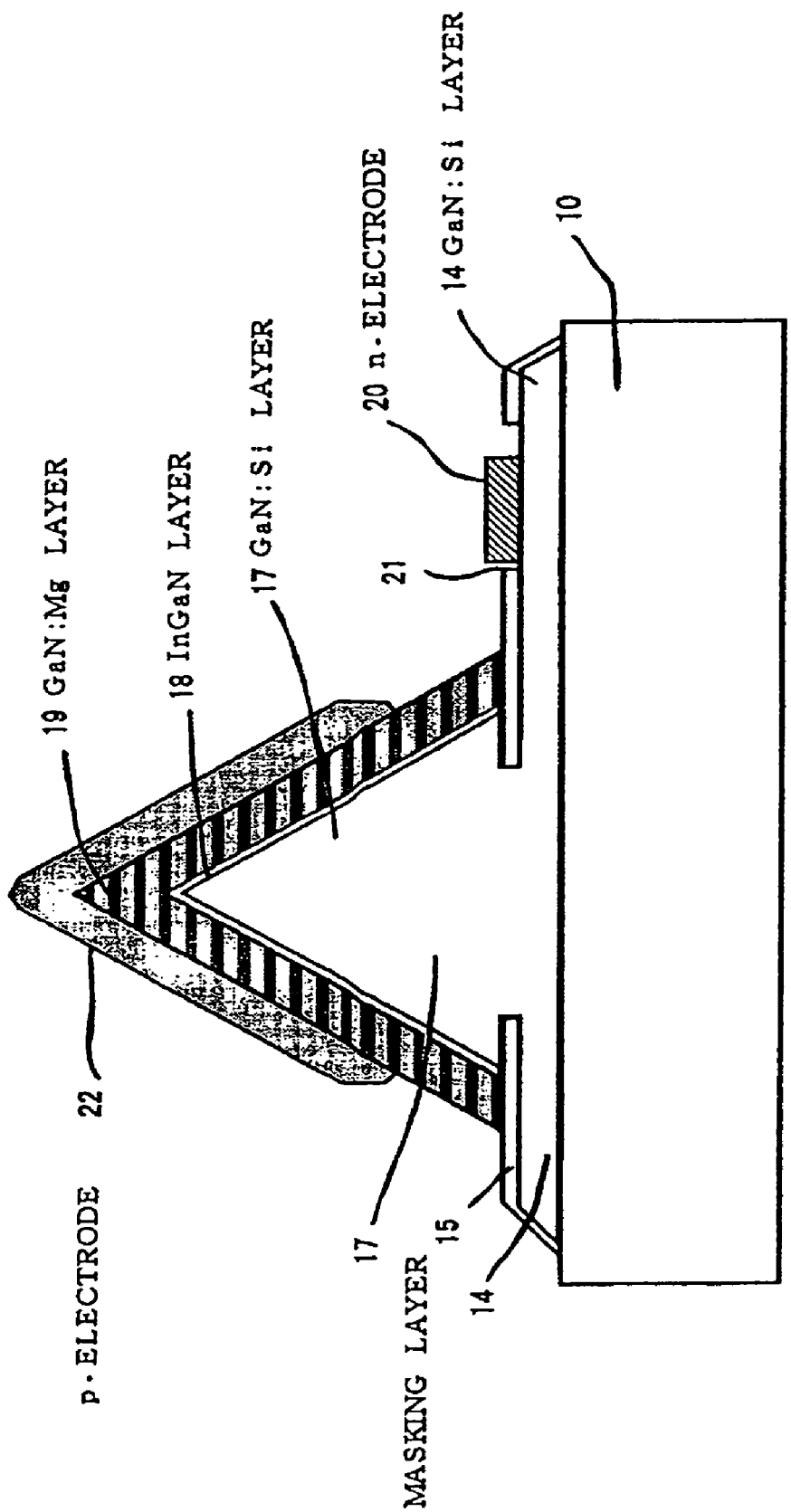

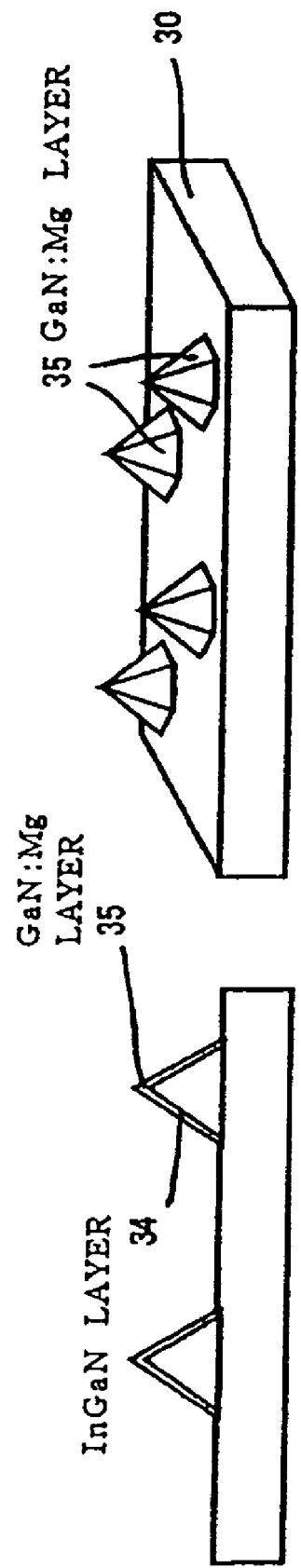

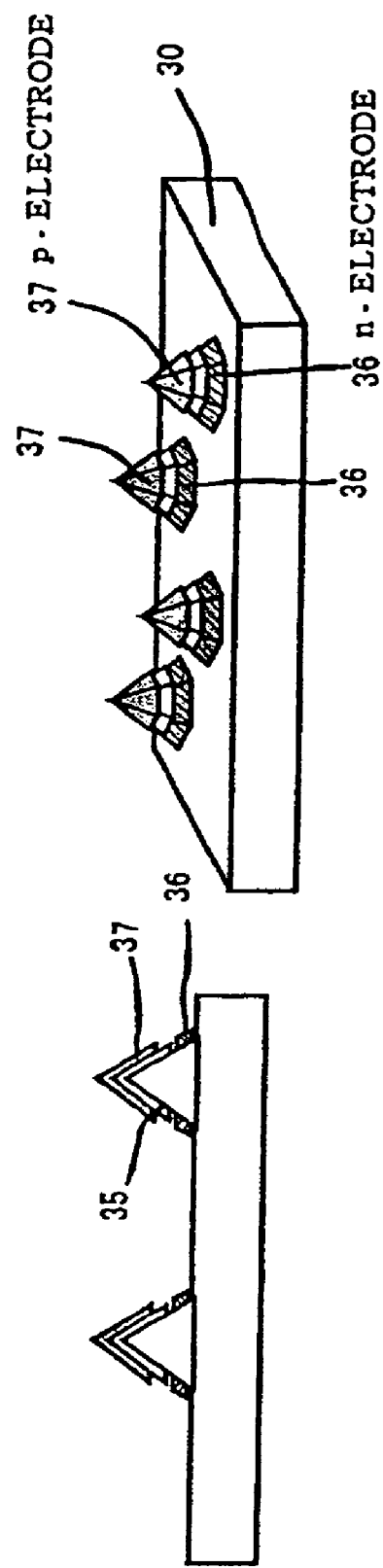

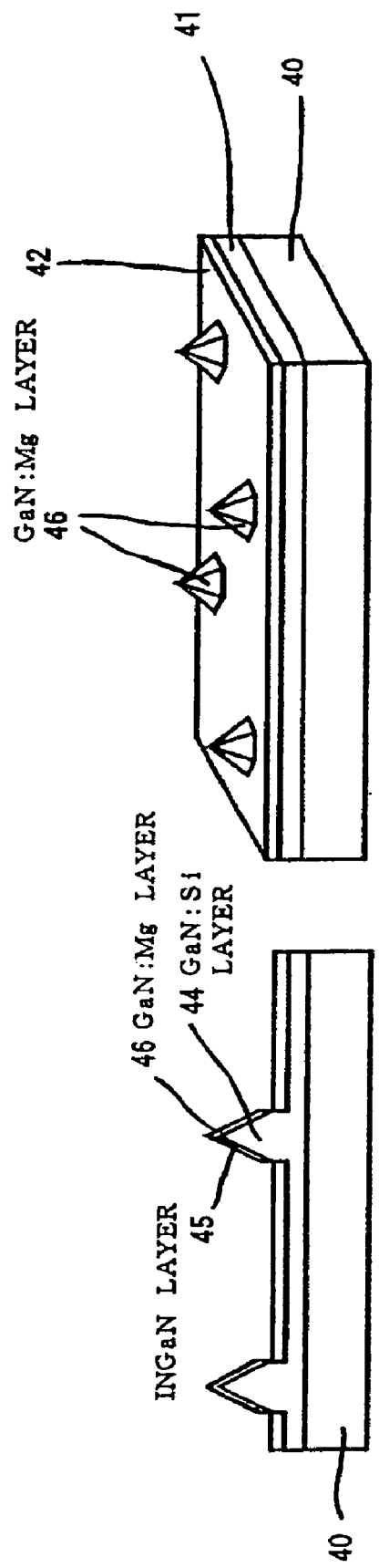

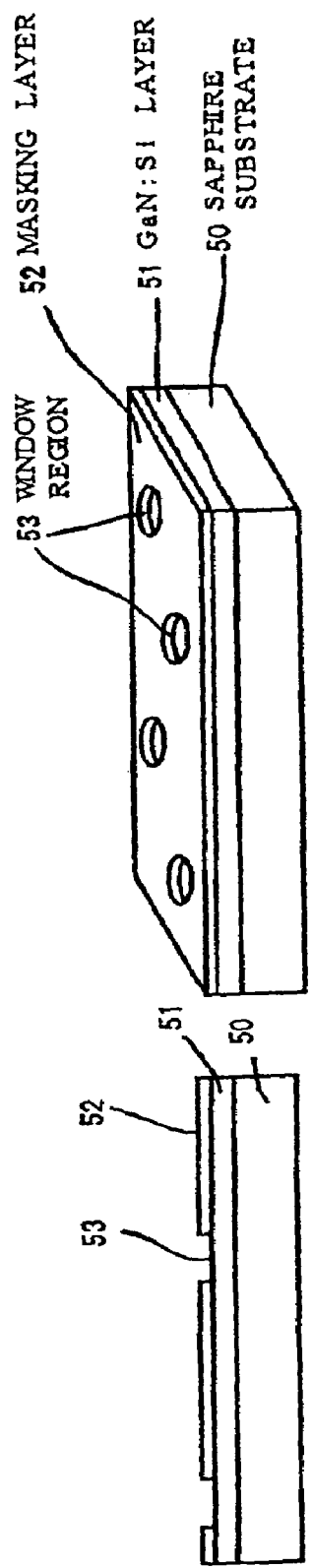

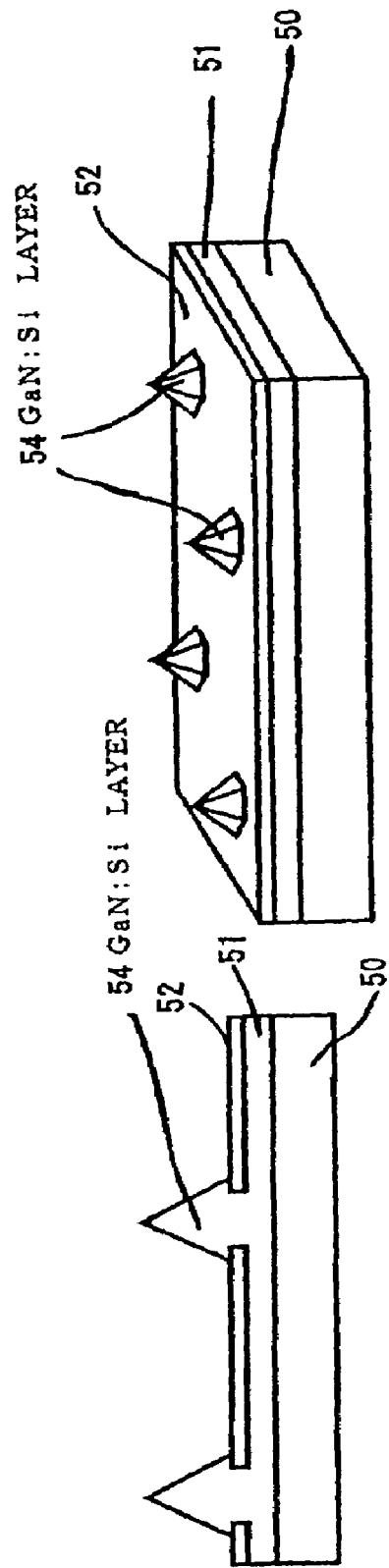

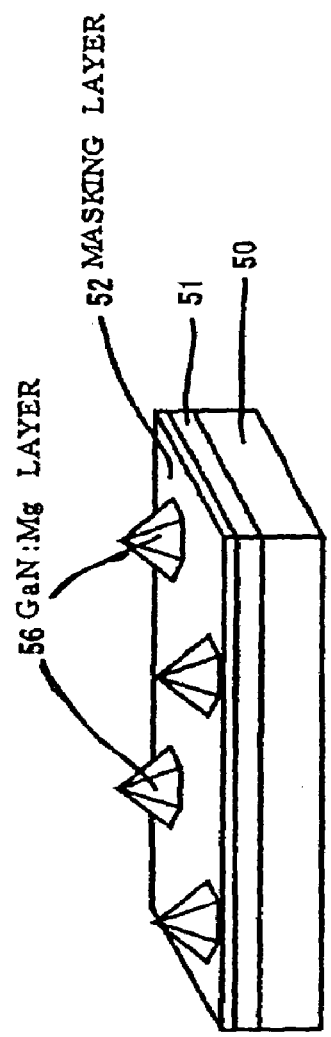
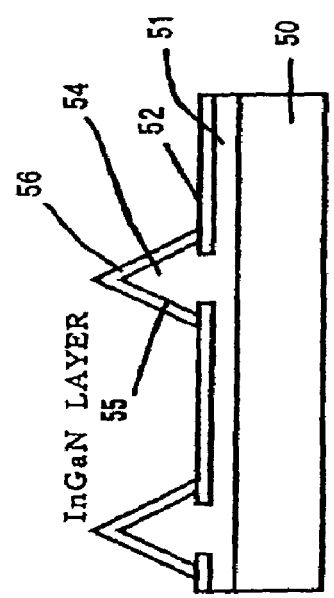

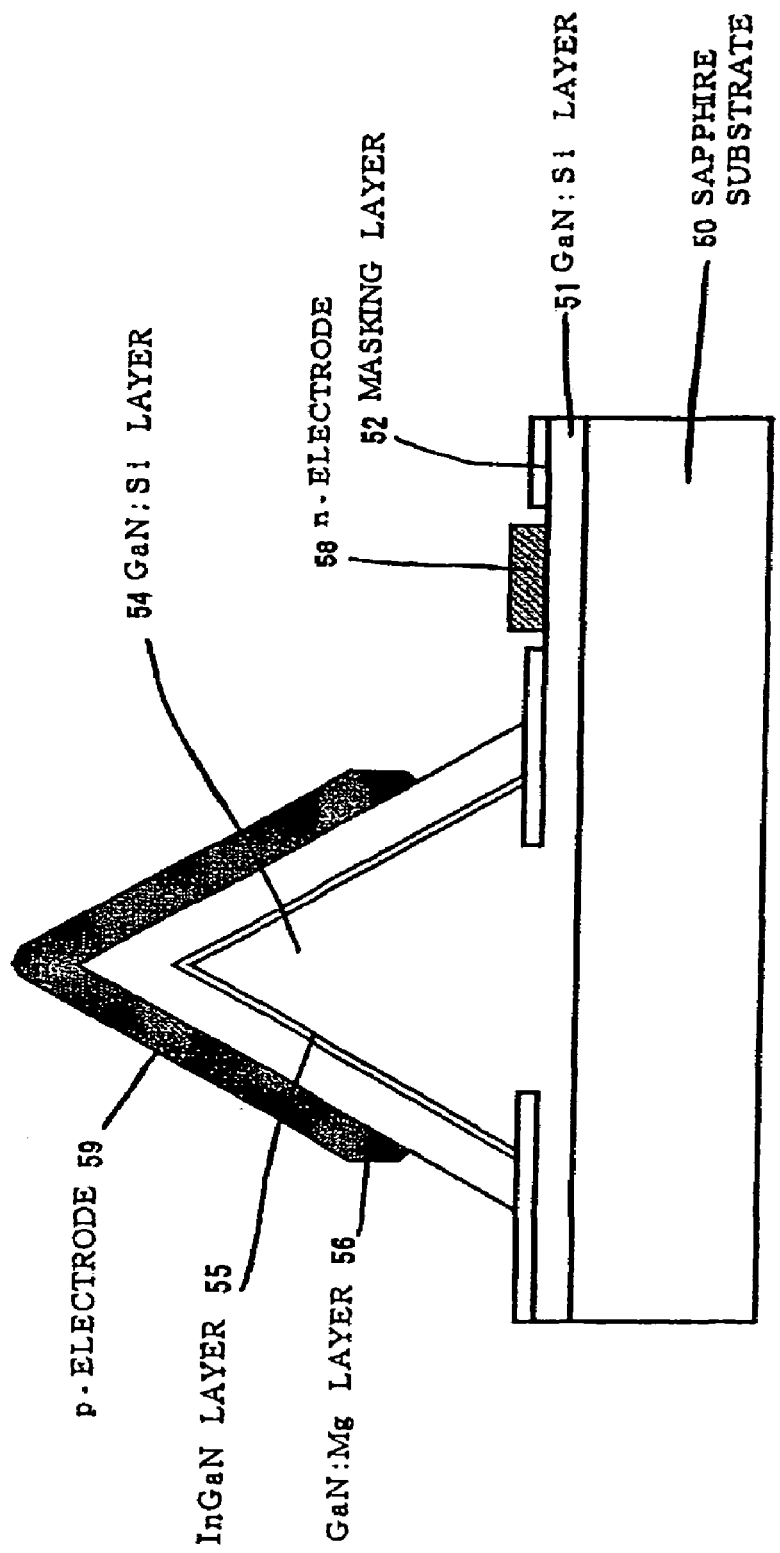

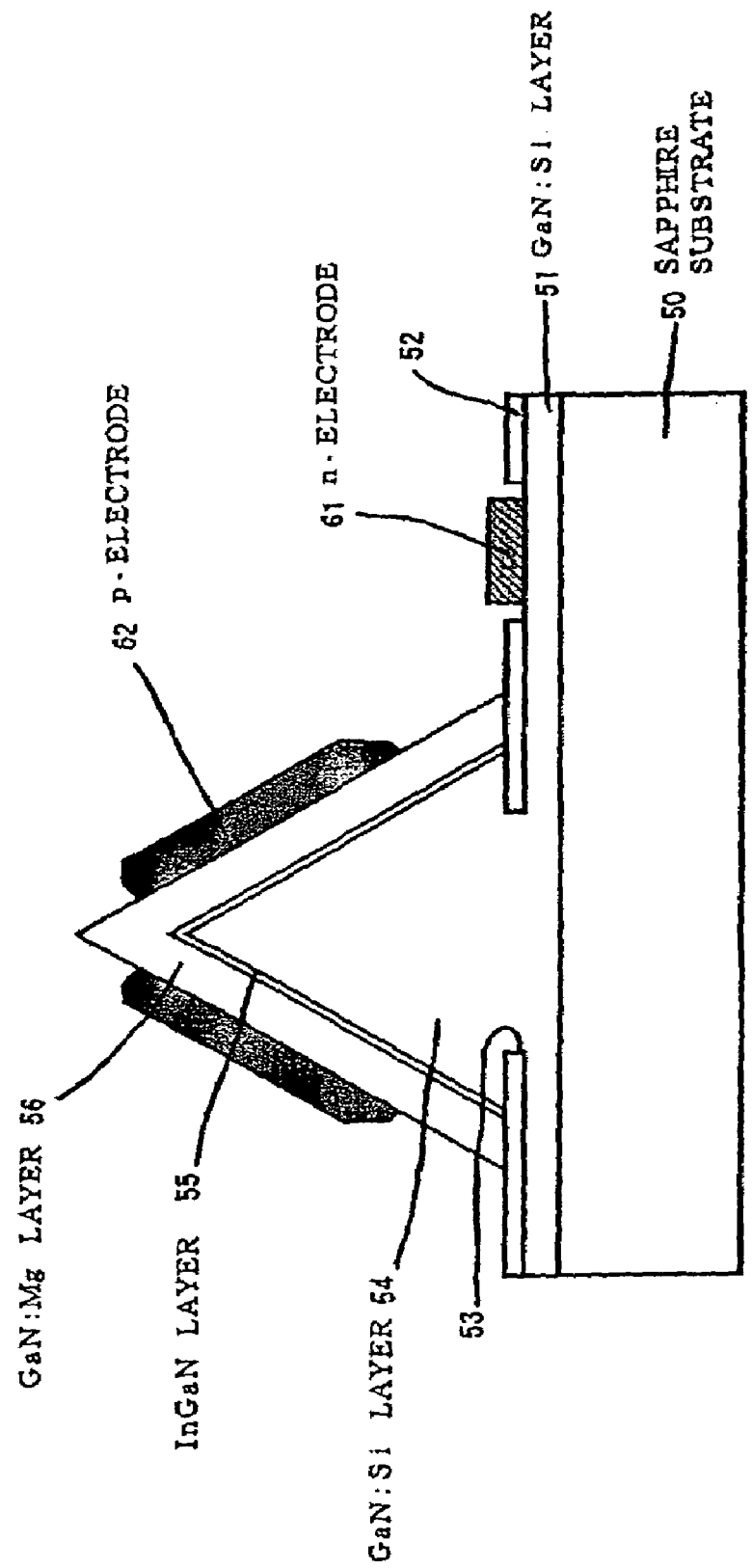

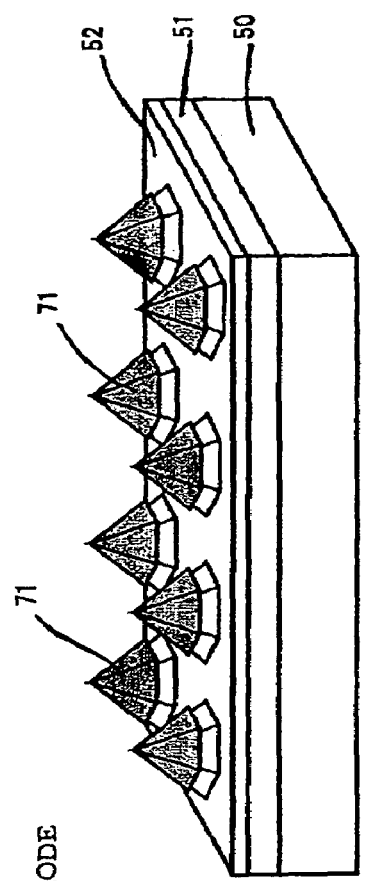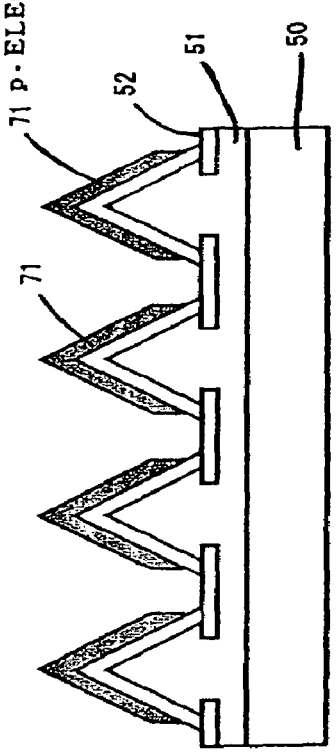
FIG.33A
FIG.33B

LASER

- 229 p-ELECTRODE
- 240 REFLECTING PLANE
- 226 ACTIVE LAYER
- 227 SECOND CONDUCTIVE LAYER
- 223 MASKING LAYER
- 222
- 228 LIGHT EMERGING WINDOW
- LIGHT

- (0001) C PLANE
- (-1100)
- 226 ACTIVE LAYER
- (1-101) S PLANE

DEPENDENCE OF LIGHT EMERGENCE EFFICIENCY ON ANGLE

DEPENDENCE OF LIGHT EMERGENCE EFFICIENCY ON HEIGHT

LIGHTING SYSTEM

CROSS REFERENCE TO RELATED APPLICATIONS

The present application is a continuation of U.S. patent application Ser. No. 10/062,687, filed on Jan. 30, 2002 now U.S. Pat. No. 6,924,500, the disclosure of which is herein incorporated by reference, which is a continuation of International Application No. PCT/JP01/06212 with an international filing date of Jul. 18, 2001, and which claims priority to Japanese Patent Application No. P2000-218034 filed on Jul. 18, 2000; Japanese Patent Application No. P2000-217663 filed on Jul. 18, 2000; Japanese Patent Application No. P2000-217508 filed on Jul. 18, 2000; Japanese Patent Application No. P2000-217799 filed on Jul. 18, 2000; Japanese Patent Application No. P2000-218101 filed on Jul. 18, 2000; and Japanese Patent Application No. P2001-200183 filed on Jun. 29, 2001, the above-referenced disclosures of which are herein incorporated by reference.

BACKGROUND OF THE INVENTION

The present invention generally relates to semiconductor devices. More specifically, the present invention relates to semiconductor light-emitting devices and processes for producing same.

Among known semiconductor light-emitting devices is one which consists of a low-temperature buffer layer, an n-side contact layer of Si-doped GaN, an n-side cladding layer of Si-doped GaN, an active layer of Si-doped InGaN, a p-side cladding layer of Mg-doped AlGaN, and a p-side contact layer of Mg-doped GaN, which are sequentially formed on top of the other over the entire surface of a sapphire substrate. Commercial products of such structure, available in large quantities, are blue and green LEDs (Light-Emitting Diodes) which emit light with wavelengths ranging from 450 nm to 530 nm.

Growing gallium nitride crystal on a sapphire substrate is a common practice. The sapphire substrate used for this purpose is usually one which has the C-plane (i.e., the (0001) plane in accordance with Miller indices of a hexagonal crystal system) as the principal plane. Consequently, the gallium nitride layer formed on the principal plane also has the C-plane, and the active layer, which is formed parallel to the principal plane of the substrate, and the cladding layers holding the active layer between them are also parallel to the C-plane. The semiconductor light-emitting device having crystal layers sequentially formed on the basis of the principal plane of the substrate has a smooth surface desirable for the formation of electrodes, due to the smoothness of the principal plane of the substrate.

A disadvantage of growing gallium nitride on a sapphire substrate is that dislocations may densely exist in the crystals due to lattice mismatch between them. Attempts have been made to eliminate defects in the grown crystals by forming a low-temperature buffer layer on the substrate. Japanese Patent Laid-open No. Hei 10-312971 discloses the combination with epitaxial lateral overgrowth (ELO) for reduction in crystal defects.

Also, Japanese Patent Laid-open No. Hei 10-321910 discloses a semiconductor light-emitting device, wherein the light-generating region extends vertically to the principal plane of the substrate in a hexagonal prismatic structures which is formed on the substrate such that its (10-10) or (1-100) M-plane is vertical (i.e., substantially perpendicular) to the principal plane of the substrate. The active layer, vertical to the principal plane of the substrate, is known to be effective in suppressing defects and dislocations due to lattice mismatch with the substrate and reducing strain due to difference in the coefficient of thermal expansion.

Moreover, Japanese Patent Laid-open No. Hei 8-255929 discloses a process for producing a light-emitting device. The process consists of forming, on a substrate, a layer of gallium nitride compound semiconductor of one conductivity type, covering part of the layer with a mask, forming, on the uncovered part, a layer of gallium nitride compound semiconductor (including a layer of another conductivity type) by selective growth, and forming a p-electrode and an n-electrode.

The technique of forming a hexagonal prismatic structure vertical to the principal plane of the substrate as disclosed in Japanese Patent Laid-open No. Hei 10-321910 requires that the film obtained by HVPE (hydride vapor phase epitaxy) should be followed by dry etching to give the (10-10) or (1-100) M-plane. Unfortunately, dry etching inevitably damages the crystal face. In other words, dry etching deteriorates the characteristic properties of crystals despite its effect of suppressing threading dislocations from the substrate. Further, an additional production step or process stage is required to perform dry etching.

It is known that selective growth on the C+-plane of the sapphire substrate gives a crystal layer with sharp peaks surrounded by the (1-101) plane or the S-plane (See Japanese Patent No. 2830814, paragraph 0009 of specification). The layer thus obtained is not flat enough for the electrode to be formed thereon. Therefore, it has never been used for electronic devices and light-emitting devices, and is merely used as an underlying layer of crystal structure for further selective growth.

Any device having a surface parallel to the principal plane of the substrate needs a flat surface for good crystal properties. As the result, it is usually constructed such that the electrodes spread horizontally. A disadvantage of this structure is that the horizontally spread electrodes make for extremely difficult and time-consuming work because one must separate miniature chips without cutting the horizontally spread electrodes. Moreover, the sapphire substrate and nitride (such as GaN) are so hard that they are difficult to cut and require a cutting allowance of about 20 µm (i.e., micrometers), thereby making it even more difficult to cut the miniature chips.

Additionally, a problem with a light-emitting device in which the principal plane of the substrate is a C+-plane and the active layer of gallium nitride is formed parallel to the principal plane of the substrate is that there is only one bond from gallium atoms to nitrogen atoms in the C+-plane and hence, nitrogen atoms easily dissociate from the crystal face of the C+-plane, thereby making it difficult for the effective V/III ratio to be large, which in turn prevents improvement in performance of crystals constituting the light-emitting device.

The technology disclosed in Japanese Patent Laid-open No. Hei 8-255929 has an advantage of using selective growth which obviates the necessity of etching, such as reactive ion etching. However, it presents difficulties in forming the n-electrode accurately because large production steps occur in its vicinity after the mask layer has been removed. A disadvantage of forming the active layer parallel to the principal plane of the substrate, as in the light-emitting device disclosed in Japanese Patent Laid-open No. Hei 8-255929, is that the end of the active layer is exposed to air, thereby resulting in oxidation and deterioration of the active layer.

It is known that an LED device can be used as a light source for large display (such as projection display). To this end, it is important for LED devices to have higher brightness, better reliability, and lower production costs. The brightness of LED devices is governed by two factors: the internal quantum efficiency, which depends on the crystal properties of the active layer; and the light emergence efficiency, which is a ratio of light which has escaped from the device to light which has been generated in the device.

In general, a light-emitting diode has a light-generating region, the typical structure of which is shown in FIG. 1. The major parts of the light-generating region include an active layer 400 of, typically, InGaN, a first conductive layer 401 and a second conductive layer 402 (which hold the active layer 400 between them), and a reflecting film 403 (which also functions as an electrode) on the second conductive layer 402 opposite to the active layer 400, with the interface between the reflecting film 403 and the second conductive layer 402 functioning as a reflecting plane 404. Part of the light generated by the active layer 400 emerges directly from the light emerging window 405 in the first conductive layer 401, and part of the light advancing toward the second conductive layer 402 is reflected by the reflecting plane 404 and the reflected light advances toward the light emerging window 405 in the first conductive layer 401.

A disadvantage of the above-mentioned light-emitting diode of ordinary structure is that light generated by the active layer 400, however efficient it might be, cannot be extracted from the device due to total reflection that takes place at an interface between the device and the outside, between the device and the transparent substrate, and/or between the transparent substrate and the outside. In other words, light incident to the interface at an angle smaller than the critical angle is subject to total reflection. The critical angle depends on the refractive indices of the two materials forming the interface. In the light-emitting diode of surface emitting type which has the reflecting plane 404 and the light emerging window 405 parallel to each other as shown in FIG. 1, the light which has undergone total reflection at an angle smaller than the critical angle undergoes total reflection continuously between the reflecting plane 404 and the light emerging window 405. Hence, such light cannot be extracted as an effective output.

Attempts have been made to improve light emergence efficiency by forming a convex or a slope which changes the optical path in the device, so that the convex or slope functions as the reflecting plane which permits light to emerge efficiently. This technique, however, is not readily applicable to the GaN semiconductor which is used for blue or green LEDs. At present, it is believed that forming a sophisticated shape in an extremely small region is not known.

A sectional view of a light-emitting device of surface emitting type is shown in section in FIG. 2. It is formed on a substrate for growth 500 of sapphire. On the substrate 500 are sequentially formed a first conductive layer 501 of gallium nitride semiconductor, an active layer 502 of gallium nitride semiconductor, and a second conductive layer 503 of gallium nitride semiconductor, all parallel to the principal plane of the substrate. The active layer 92 and the second conductive layer 503 are partly removed such that an opening 506, whose bottom penetrates into the first conductive layer 501, is formed. In the opening 506, a first electrode 504 is formed such that it connects to the first conductive layer 501. A second electrode 505 is formed on the second conductive layer 503, thereby connecting to the second conductive layer 503.

A simple way to meet requirements of the light source for large displays is to increase the device size according to the desired brightness. However, the optical design limits the size of the light-generating region, which presents difficulties in producing a device having high brightness as well as a large light-generating region. Moreover, the active region in the device is also limited by the arrangement of the light emerging window and the electrodes for efficient current injection. At present, therefore, the requirement for high brightness is met by injecting more than the specified current into the actual device. However, increased current injection impairs device reliability.

On the other hand, decreasing the device size of light-emitting diode is expected to reduce production cost through improvement in yields. There is a strong demand for size reduction in the area where LEDs in an array having individual pixels for display. However, size reduction leads to an increased load per unit area, which contradicts the above-mentioned requirements for high brightness and high reliability.

Moreover, if the device size is to be reduced below tens of micrometers or less, the region for the active layer is greatly limited by the electrodes 504 and 505 (shown in FIG. 2) and the device separating grooves. The region where the conductive layers 503 and 501 come into contact with the electrodes 505 and 504 should be as large as possible to keep resistance low. However, enlarging the electrodes reduces the area through which light emerges from the active region, which leads to reduced brightness.

A need, therefore, exists to provide a micro-size light-emitting device with efficient light emergence, high brightness, minimum load on the active layer and controlling threading dislocations from the substrate that can be produced under optimal process conditions.

SUMMARY OF THE INVENTION

The present invention relates to semiconductor light-emitting devices and methods of producing same. The light-emitting devices of the present invention include a crystal structure formed by selective growth and oriented about a crystal plane with respect to a substrate such that the light-emitting properties can be enhanced.

Applicants have discovered that the light-emitting devices of the present invention can be produced, for example, under optimal process conditions, such as, without requiring additional production steps or process stages, by controlling threading dislocations from the substrate and maintaining desirable crystal properties, thereby also protecting the active layer from deterioration. In this regard, the light-emitting devices of the present invention are desirably reliable with minimum load on the active layer (e.g., light-generating region) and can provide an enhanced level of brightness due to, for example, the improved light emergence efficiency.

To this end, in an embodiment of the present invention, a semiconductor light-emitting device is provided. The semiconductor light-emitting device includes a substrate including a substrate surface positioned along a substrate surface plane, a crystal layer having a crystal surface oriented along a crystal surface plane diagonally intersecting the substrate surface plane, and a first conductive layer, an active layer, and a second conductive layer each formed along at least a portion of the crystal surface.

In an embodiment, the crystal layer is a wurtzite crystal structure.

In an embodiment, the crystal layer is composed of a nitride semiconductor material.

In an embodiment, the crystal layer is formed by selective growth on the substrate with a material layer capable of growth interposed therebetween.

In an embodiment, the material layer capable of growth is selectively removed during selective growth to form the crystal layer.

In an embodiment, the semiconductor light-emitting device further includes a masking layer having an opening through which the crystal layer is selectively grown.

In an embodiment, the crystal layer is formed by selective growth such that the crystal layer extends laterally from the opening in the masking layer.

In an embodiment, the substrate plane is a C-plane.

In an embodiment, the crystal surface plane includes at least one of a S-plane and a (11-22) plane.

In an embodiment, the crystal surface plane includes a plane having a plane orientation inclined at an angle ranging from about 5 to about 6 degrees with respect to at least one of a S-plane and a (11-22) plane.

In an embodiment, current is injected into the active layer.

In an embodiment, active layer includes InGaN.

In an embodiment, the crystal layer is a substantially symmetrical hexagonal structure.

In an embodiment, a portion of the crystal surface is oriented along a C-plane and positioned centrally along the crystal structure with respect to a second portion of the crystal surface that is oriented along the crystal surface plane which diagonally intersects the substrate surface plane.

In another embodiment according to the present invention, an image display unit is provided. The image display unit includes a number of semiconductor light-emitting devices arranged so as to emit light in response to a signal, each of the semiconductor light-emitting devices having a substrate including a substrate surface positioned along a substrate surface plane, a crystal layer including a crystal surface oriented along a crystal surface plane diagonally intersecting the substrate surface plane, and a first conductive layer, an active layer, and a second conductive layer each formed along at least a portion of the crystal surface.

In yet another embodiment according to the present invention, a lighting system is provided. The lighting system includes a number of semiconductor light-emitting devices, each of the semiconductor light-emitting devices having a substrate including a substrate surface positioned along a substrate surface plane, a crystal layer including a crystal surface oriented along a crystal surface plane diagonally intersecting the substrate surface plane, and a first conductive layer, an active layer, and a second conductive layer each formed along at least a portion of the crystal surface.

In an embodiment, each of the semiconductor light-emitting devices in the lighting system are arranged so as to emit light in response to an identical signal.

In a further embodiment according to the present invention, a process for producing a semiconductor light-emitting device is provided. The process includes the steps of providing a substrate including a substrate surface oriented along a substrate surface plane, forming a crystal seed layer on the substrate surface, forming a masking layer on the crystal seed layer, wherein the masking layer includes an opening, forming a crystal layer by selective growth of the crystal seed layer through the opening of the masking layer, wherein the crystal layer includes a crystal layer surface oriented along a crystal layer plane that diagonally intersects the substrate surface, and forming each of a first conductive layer, an active layer, and a second conductive layer along at least a portion of the crystal layer surface.

In an embodiment, the substrate surface plane comprises a C-plane.

In an embodiment, the process for producing a semiconductor light-emitting device further includes the step of forming a number of semiconductor light-emitting devices spaced apart along the substrate.

In an embodiment, the process for producing a semiconductor light-emitting device further includes the step of forming an electrode on at least a side of each semiconductor light-emitting device.

According to an embodiment of the present invention, a semiconductor light-emitting device is provided. The semiconductor light-emitting device includes a substrate including a substrate surface positioned along a substrate surface plane, a crystal layer having a crystal layer surface oriented along a crystal surface plane defined as a S-plane which diagonally intersects the substrate surface plane, and a layer of a first conductivity type, an active layer, and a layer of a second conductivity type each formed along the S-plane.

In an embodiment, the crystal layer is a wurtzite crystal structure.

In an embodiment, the crystal layer is composed of a nitride semiconductor material.

In an embodiment, the crystal layer is formed by selective growth on the substrate with a material layer capable of growth interposed therebetween.

In an embodiment, the material layer capable of growth is selectively removed during selective growth to form the crystal layer.

In an embodiment, the semiconductor light-emitting further includes a masking layer having an opening through which the crystal layer is selectively grown.

In an embodiment, the crystal layer is formed by selective growth such that the crystal layer extends laterally from the opening in the masking layer.

In an embodiment, the substrate surface plane comprises a C+ plane.

In an embodiment, current is injected into the active layer.

According to yet another embodiment of the present invention, a semiconductor light-emitting device is provided. The semiconductor light-emitting device includes a substrate including a substrate surface positioned along a substrate surface plane, a crystal layer in the shape of approximately hexagonal pyramid and having a face oriented along an S-plane that diagonally intersects the substrate surface plane, and a layer of a first conductivity type, an active layer, and a layer of a second conductivity type each formed along at least a portion of the approximately hexagonal pyramid.

In an embodiment, current is injected into the active layer such that a current density is lower near or at an apex of the approximately hexagonal pyramid than in the face of the approximately hexagonal pyramid.

According to a further embodiment of the present invention, a semiconductor light-emitting device is provided. The semiconductor light-emitting device includes a substrate including a substrate surface positioned along a substrate surface plane, a crystal layer in the shape of an approximately hexagonal prismoid, having a face oriented about an S-plane, and a top region oriented about a C-plane, and a layer of a first conductivity type, an active layer, and a layer of a second conductivity type each formed along at least a portion of the approximately hexagonal prismoid.

According to yet another embodiment of the present invention, an image display unit in provided. The image display unit includes a number of semiconductor light-emitting devices arranged so as to emit light in response to a signal, each of the semiconductor light-emitting devices having a substrate including a substrate surface positioned along a substrate surface plane, a crystal layer having a crystal surface oriented along a crystal surface plane defined as a S-plane which diagonally intersects the substrate surface plane, and a first conductive layer, an active layer, and a second conductive layer each formed along at least a portion of the crystal surface.

In an embodiment according to the present invention, a lighting system is provided. The lighting system includes a number of semiconductor light-emitting devices, each of the semiconductor light-emitting devices having a substrate including a substrate surface positioned along a substrate surface plane, a crystal layer having a crystal surface oriented along a crystal surface plane defined as a S-plane which diagonally intersects the substrate surface plane, and a first conductive layer, an active layer, and a second conductive layer each formed along at least a portion of the crystal surface.

In an embodiment, each of the semiconductor light-emitting devices in the lighting system are arranged so as to emit light in response to an identical signal.

In yet another embodiment according to the present invention, a process for producing a semiconductor light-emitting device is provided. The process includes the steps providing a substrate including a substrate surface oriented along a substrate surface plane, forming a masking layer on the substrate, wherein the masking layer includes an opening, forming a crystal layer by selective growth through the opening of the masking layer, wherein the crystal layer includes a crystal layer surface oriented along a crystal layer plane defined as a S-plane which diagonally intersects the substrate surface plane, and forming each of a first conductive layer, an active layer, and a second conductive layer along at least a portion of the crystal layer surface.

In an embodiment, the substrate surface plane is a C+ plane.

In an embodiment, the process for producing a semiconductor light-emitting device further includes the steps of forming a number of the semiconductor light-emitting devices on the substrate, and subsequently separating the semiconductor light-emitting devices.

In an embodiment, each separated semiconductor light-emitting device has at least one electrode formed on a side.

In a further embodiment according to the present invention, a semiconductor light-emitting device is provided. The semiconductor light-emitting device includes a substrate having a substrate surface positioned along a substrate surface plane, a crystal grown layer formed by selective growth having a crystal surface oriented along a crystal surface plane diagonally intersecting the substrate surface plane, an active layer which is formed along at least a portion of the crystal grown layer that emits light upon injection of an amount of current, and a reflecting region which is formed substantially parallel to the crystal surface plane and reflects at least a portion of the light emerging from the active layer.

In an embodiment, the active layer is formed from a compound semiconductor having a wurtzite crystal structure.

In an embodiment, the active layer is approximately parallel to the crystal surface plane.

In an embodiment, the active layer is approximately parallel to a S-plane.

In an embodiment, the active layer is approximately parallel to a plane having a plane orientation inclined at an angle ranging from about 5 to about 6 degrees with respect to at least one a S-plane and a (11-22) plane.

In an embodiment, the reflecting region includes at least two reflecting planes that intersect at an angle less than 180°.

In an embodiment, the active layer is formed from a nitride compound semiconductor.

In an embodiment, the active layer is formed from a gallium nitride compound semiconductor.

In an embodiment, the active layer contains In.

In an embodiment, the active layer is separated for each device.

In an embodiment, the semiconductor light-emitting device further includes an underlying layer formed on the substrate, wherein the selective growth of the crystal grown layer is derived from the underlying layer.

According to an embodiment of the present invention a process for producing a semiconductor light-emitting device is provided. The process includes the steps of providing a substrate including a substrate surface oriented along a substrate surface plane, selectively growing a crystal layer having a crystal surface oriented along a crystal surface plane diagonally intersecting the substrate surface plane, forming an active layer approximately parallel to the crystal surface plane, and forming a reflecting region substantially parallel to the crystal surface plane.

According to another embodiment of the present invention, a semiconductor light-emitting device is provided. The semiconductor light-emitting device includes a substrate having a substrate surface oriented along a substrate surface plane, a first grown layer having a first grown layer conductivity type formed on the substrate, a masking layer formed on the first grown layer, a second grown layer of a second grown layer conductivity type formed by selective growth through an opening in the masking layer having a crystal surface oriented along a crystal surface plane, a first cladding layer including a first cladding layer conductivity type formed along at least a portion of the crystal surface plane, an active layer, and a second cladding layer including a second cladding layer conductivity type, wherein at least one of the first cladding layer, the active layer, and the second cladding layer cover the masking layer surrounding the opening.

In an embodiment, the first grown layer conductivity type, the second grown layer conductivity type, and the first cladding layer conductivity type are all of a first conductivity type and the second cladding layer conductivity type is of a second conductivity type.

In an embodiment, the crystal surface plane of the second grown layer diagonally intersects the substrate surface plane.

In an embodiment, the first and second grown layers are composed of a wurtzite crystal structure.

In an embodiment, the second grown layer is composed of a nitride semiconductor.

In an embodiment, the substrate surface plane is a C-plane.

According to yet another embodiment of the present invention, a semiconductor light-emitting device is provided. The semiconductor light-emitting device includes a substrate, a first grown layer including a first grown layer conductivity type formed on the substrate, a masking layer formed on the first grown layer, a second grown layer including a second grown layer conductivity type formed by selective growth through an opening in the masking layer and having a crystal surface oriented along a crystal surface plane, a first cladding layer including a first cladding layer conductivity type formed along at least a portion of the crystal surface plane, an active layer, and a second cladding layer including a second cladding layer conductivity type, wherein the first cladding layer, the active layer, and the second cladding layer are formed as to substantially cover the second grown layer.

In an embodiment, the first grown layer conductivity type, the second grown layer conductivity type, and the first cladding layer conductivity type are all composed of a first conductivity type while the second cladding layer conductivity type is composed of a second conductivity type.

According to still another embodiment of the present invention, a semiconductor light-emitting device is provided. The semiconductor light-emitting device includes a substrate, a first grown layer of a first grown layer conductivity type formed on the substrate, a masking layer formed on the first grown layer, a second grown layer of a second grown layer conductivity type formed by selective growth through an opening in the masking layer and including a crystal surface oriented along a crystal surface plane, a first cladding layer of a first cladding layer conductivity type formed along at least a portion of the crystal surface plane, an active layer, and a second cladding layer of a second cladding layer conductivity type, wherein the first cladding layer, the active layer, and the second cladding layer are formed substantially parallel to the crystal surface plane such that an end region of at least one of the first cladding layer, the active layer, and the second cladding layer contacts the masking layer.

In an embodiment, the first grown layer conductivity type, the second grown layer conductivity type, and the first cladding layer conductivity type are all of a first conductivity type while the second cladding layer conductivity type is of a second conductivity type.

In an embodiment according to the present invention, an image display unit is provided. The image display unit includes a number of semiconductor light-emitting devices arranged so as to emit light in response to a signal, each of the semiconductor light-emitting devices having a substrate, a first grown layer of a first conductivity type formed on the substrate, a masking layer formed on the first grown layer, a second grown layer of the first conductivity type formed by selective growth through an opening in the masking layer and including a crystal surface oriented along a crystal surface plane, a first cladding layer of the first conductivity type formed along at least a portion of the crystal surface plane, an active layer, and a second cladding layer of a second conductivity type, wherein the first cladding layer, the active layer, and the second cladding layer are formed substantially parallel to the crystal surface plane such that an end region of at least one of the first cladding layer, the active layer, and the second cladding layer extends to the masking layer in proximity to the opening.

In another embodiment according to the present invention, a lighting system is provided. The lighting system includes a number of semiconductor light-emitting devices, each of the semiconductor light-emitting devices having a substrate, a first grown layer including a first conductivity type formed on the substrate, a masking layer formed on the first grown layer, a second grown layer including the first conductivity type formed by selective growth through an opening in the masking layer and including a crystal surface oriented along a crystal surface plane, a first cladding layer including the first conductivity type formed along at least a portion of the crystal surface plane, an active layer, and a second cladding layer of a second conductivity type, wherein the first cladding layer, the active layer, and the second cladding layer are formed substantially parallel to the crystal surface plane such that an end region of at least one of the first cladding layer, the active layer, and the second cladding layer extends to the masking layer in proximity to the opening.

In an embodiment, the lighting system is configured such that each of the semiconductor light-emitting devices are arranged so as to emit light in response to an identical signal.

According to yet another embodiment of the present invention, a process for producing a semiconductor light-emitting device is provided. The process includes the steps of providing a substrate including a substrate surface oriented along a substrate surface plane, forming a first grown layer on the substrate, forming a masking layer having an opening on the first grown layer, selectively growing a second grown layer through the opening in the masking layer, wherein the second grown layer includes a crystal surface oriented along a crystal surface plane, and forming a cladding layer of a first conductivity type, an active layer, and a cladding layer of a second conductivity type each substantially parallel to the crystal surface plane extending to the masking layer in proximity to the opening.

In an embodiment, the crystal surface plane of the second grown layer diagonally intersects the substrate surface plane.

According to a further embodiment of the present invention, a semiconductor light-emitting device is provided. The semiconductor light-emitting device includes a substrate having a substrate surface oriented along a substrate surface plane, and an active layer formed along at least a portion of a selectively grown crystal layer via a window region along the substrate surface plane such as to be disposed between a first conductive layer and a second conductive layer and oriented along an active layer plane that is not parallel to the substrate surface plane, and wherein an area of the active layer is larger than at least one of an area of the window region and a projected area of the crystal layer derived from projecting the crystal layer to the substrate surface plane in a normal direction.

In an embodiment, the active layer is composed of a compound semiconductor having a wurtzite crystal structure.

In an embodiment, the active layer is substantially parallel to a S-plane.

In an embodiment, the active layer is formed such that it extends laterally from the window region.

In an embodiment, the semiconductor light-emitting device further includes a first electrode connected to the first conductive layer, and a second electrode connected to the second conductive layer, wherein the first electrode and second electrode are capable of injecting current into the active layer.

In an embodiment, the active layer is a nitride compound semiconductor.

In an embodiment, the active layer is a gallium nitride compound semiconductor.

In an embodiment, the active layer contains In.

In an embodiment, the semiconductor light-emitting device further includes a number of semiconductor light-emitting devices selectively grown such that the active layer of each semiconductor light-emitting device is separated from the active layer of adjacent semiconductor light-emitting devices.

In an embodiment, the selective growth is derived from an underlying layer formed on the substrate.

According to an embodiment of the present invention, a semiconductor light-emitting device is provided. The semiconductor light-emitting device includes a substrate having a substrate surface oriented along a substrate surface plane, and an active layer formed by selective growth such as to be disposed between a first conductive layer and a second conductive layer and oriented along an active layer plane that is not parallel to the substrate surface plane, and wherein a portion of the active layer is directed away from the active layer plane towards the substrate.

According to yet an embodiment of the present invention, a semiconductor light-emitting device is provided. The semiconductor light-emitting device includes a substrate including a substrate surface oriented along a substrate surface plane, and an active layer formed along at least a portion of a selectively grown crystal layer such as to be disposed between a first conductive layer and a second conductive layer and oriented along an active layer plane that is not parallel to the substrate surface plane, and wherein an area of the active layer greater than or equal to a sum of a projected area of the crystal layer derived from projecting the crystal layer to the substrate in a normal direction and an area in which at least one of the conductive layers contacts a respective electrode formed on the substrate.

According to a further embodiment of the present invention, a process for producing a semiconductor light-emitting device is provided. The process includes the steps of forming an underlying layer on a substrate, forming a masking layer having a window region on the underlying layer, selectively growing a crystal grown layer through the window region, and forming a first conductive layer, an active layer, and a second conductive layer on a surface of the crystal grown layer, wherein the active layer includes a crystal surface with a surface area larger than a projected area derived from projecting the crystal surface toward the substrate in a normal direction.

According to another embodiment of the present invention, a process for producing a semiconductor light-emitting device is provided. The process includes the steps of providing a first substrate including a first substrate surface oriented along a first substrate surface plane, forming a crystal seed layer on the first substrate surface, forming a masking layer on the crystal seed layer, wherein the masking layer includes an opening, forming a crystal layer by selective growth of the crystal seed layer through the opening of the masking layer, wherein the crystal layer includes a crystal layer surface oriented along a crystal layer plane that diagonally intersects the first substrate surface plane, forming each of a first conductive layer, an active layer, and a second conductive layer along at least a portion of the crystal layer surface, embedding each of the first conductive layer, the active layer and the second conductive layer and the second conductive layer in a resin material layer formed on a second substrate, removing the second substrate by laser abrasion, separating the crystal seed layer and masking layer from a substrate region of the substrate, and forming an electrode on at least a portion of the substrate region.

In an embodiment, the crystal seed layer and the masking layer are separated by peeling off.

Additional features and advantages of the present invention are described in, and will be apparent from, the following Detailed Description of the Invention and the Figures.

BRIEF DESCRIPTION OF THE FIGURES

FIGS. 3A and 3B are diagrams showing the step of forming a mask in the production of the semiconductor light-emitting device in Example 1 of an embodiment of the present invention, wherein FIG. 3A is a sectional view and FIG. 3B is a perspective view.

FIGS. 4A and 4B are diagrams showing the step of forming a silicon-doped GaN layer in the production of the semiconductor light-emitting device in Example 1 of an embodiment of the present invention, wherein FIG. 4A is a sectional view and FIG. 4B is a perspective view.

FIGS. 5A and 5B are diagrams showing the step of forming a window for crystal growth in the production of the semiconductor light-emitting device in Example 1 of an embodiment of the present invention, wherein FIG. 5A is a sectional view and FIG. 5B is a perspective view.

FIGS. 6A and 6B are diagrams showing the step of forming an active layer etc. in the production of the semiconductor light-emitting device in Example 1 of an embodiment of the present invention, wherein FIG. 6A is a sectional view and FIG. 6B is a perspective view.

FIGS. 7A and 7B are diagrams showing the step of forming an electrode in the production of the semiconductor light-emitting device in Example 1 of an embodiment of the present invention, wherein FIG. 7A is a sectional view and FIG. 7B is a perspective view.

FIGS. 8A and 8B are diagrams showing the step of separating devices in the production of the semiconductor light-emitting device in Example 1 of an embodiment of the present invention, wherein FIG. 8A is a sectional view and FIG. 8B is a perspective view.

FIG. 9 is a sectional view showing the structure of the semiconductor light-emitting device in Example 1 of an embodiment of the present invention.

FIGS. 10A and 10B are diagrams showing the step of forming a mask in the production of the semiconductor light-emitting device in Example 2 of an embodiment of the present invention, wherein FIG. 10A is a sectional view and FIG. 10B is a perspective view.

FIGS. 11A and 11B are diagrams showing the step of selective removal in the production of the semiconductor light-emitting device in Example 2 of an embodiment of the present invention, wherein FIG. 11A is a sectional view and FIG. 1B is a perspective view.

FIGS. 12A and 12B are diagrams showing the step of forming a crystal layer in the production of the semiconductor light-emitting device in Example 2 of an embodiment of the present invention, wherein FIG. 12A is a sectional view and FIG. 12B is a perspective view.

FIGS. 13A and 13B are diagrams showing the step of forming an active layer in the production of the semiconductor light-emitting device in Example 2 of an embodiment of the present invention, wherein FIG. 13A is a sectional view and FIG. 13B is a perspective view.

FIGS. 14A and 14B are diagrams showing the step of forming an electrode in the production of the semiconductor light-emitting device in Example 2 of an embodiment of the present invention, wherein FIG. 14A is a sectional view and FIG. 14B is a perspective view.

FIGS. 15A and 15B are diagrams showing the step of separating devices in the production of the semiconductor light-emitting device in Example 2 of an embodiment of the present invention, wherein FIG. 15A is a sectional view and FIG. 15B is a perspective view.

FIGS. 17A and 17B are diagrams showing the step of separating devices in a modified way in the production of the semiconductor light-emitting device in Example 2 of an embodiment of the present invention, wherein FIG. 17A is a sectional view and FIG. 17B is a perspective view.

FIGS. 18A and 18B are diagrams showing the step of forming a mask in the production of the semiconductor light-emitting device in Example 3 of an embodimetn of the present invention, wherein FIG. 18A is a sectional view and FIG. 18B is a perspective view.

FIGS. 19A and 19B are diagrams showing the step of forming a crystal layer in the production of the semiconductor light-emitting device in Example 3 of an embodiment of the present invention, wherein FIG. 19A is a sectional view and FIG. 19B is a perspective view.

FIGS. 20A and 20B are diagrams showing the step of forming an active layer in the production of the semiconductor light-emitting device in Example 3 of an embodiment of the present invention, wherein FIG. 20A is a sectional view and FIG. 20B is a perspective view.

FIGS. 21A and 21B are diagrams showing the step of forming an electrode in the production of the semiconductor light-emitting device in Example 3 of an embodiment of the present invention, wherein FIG. 21A is a sectional view and FIG. 21B is a perspective view.

FIGS. 22A and 22B are diagrams showing the step of separating devices in the production of the semiconductor light-emitting device in Example 3 of an embodiment of the present invention, wherein FIG. 22A is a sectional view and FIG. 22B is a perspective view.

FIGS. 24A and 24B are diagrams showing the step of forming a mask in the production of the semiconductor light-emitting device in Example 4 of an embodiment of the present invention, wherein FIG. 24A is a sectional view and FIG. 24B is a perspective view.

FIGS. 25A and 25B are diagrams showing the step of forming a crystal layer in the production of the semiconductor light-emitting device in Example 4 of an embodiment of the present invention, wherein FIG. 25A is a sectional view and FIG. 25B is a perspective view.

FIGS. 26A and 26B are diagrams showing the step of forming an active layer in the production of the semiconductor light-emitting device in Example 4 of an embodiment of the present invention, wherein FIG. 26A is a sectional view and FIG. 26B is a perspective view.

FIGS. 27A and 27B are diagrams showing the step of forming an electrode in the production of the semiconductor light-emitting device in Example 4 of an embodiment of the present invention, wherein FIG. 27A is a sectional view and FIG. 27B is a perspective view.

FIGS. 28A and 28B are diagrams showing the step of separating devices in the production of the semiconductor light-emitting device in Example 4 of an embodiment of the present invention, wherein FIG. 28A is a sectional view and FIG. 28B is a perspective view.

FIG. 29 is a sectional view showing the semiconductor light-emitting device in Example 4 of an embodiment of the present invention.

FIGS. 30A and 30B are diagrams showing the step of forming an electrode in the production of the semiconductor light-emitting device in Example 5 of an embodiment of the present invention, wherein FIG. 30A is a sectional view and FIG. 30B is a perspective view.

FIGS. 31A and 31B are diagrams showing the step of separating devices in the production of the semiconductor light-emitting device in Example 5 of an embodiment of the present invention, wherein FIG. 31A is a sectional view and FIG. 31B is a perspective view.

FIG. 32 is a sectional view showing the semiconductor light-emitting device in Example 5 of an embodiment of the present invention.

FIGS. 33A and 33B are diagrams showing the step of forming a p-electrode in the production of the semiconductor light-emitting device in Example 6 of an embodiment of the present invention, wherein FIG. 33A is a sectional view and FIG. 33B is a perspective view.

FIGS. 34A and 34B are diagrams showing the step of separating devices in the production of the semiconductor light-emitting device in Example 6 of an embodiment of the present invention, wherein FIG. 34A is a sectional view and FIG. 34B is a perspective view.

FIGS. 35A and 35B are diagrams showing the step of forming an n-electrode in the production of the semiconductor light-emitting device in Example 6 of an embodiment of the present invention, wherein FIG. 35A is a sectional view and FIG. 35B is a perspective view.

FIGS. 36A, 36B and 36C are diagrams showing the step of forming an n-electrode in a modified way according to an embodiment of the present invention, wherein FIG. 36A is a schematic sectional view showing the laser abrasion step, FIG. 36B is a schematic sectional view showing the RIE step, and FIG. 36C is a schematic sectional view showing the step of forming an n-electrode.

FIGS. 39A and 39B are diagrams showing the step of forming a transparent electrode in the production of the modified semiconductor light-emitting device in Example 6 of an embodiment of the present invention, wherein FIG. 39A is a sectional view and FIG. 39B is a perspective view.

FIGS. 45A and 45B are diagrams showing the step of forming a mask in the production of the semiconductor light-emitting device in Example 8 of an embodiment of the present invention, wherein FIG. 45A is a sectional view and FIG. 45B is a perspective view.

FIGS. 46A and 46B are diagrams showing the step of forming a crystal layer in the production of the semiconductor light-emitting device in Example 8 of an embodiment of the present invention, wherein FIG. 46A is a sectional view and FIG. 46B is a perspective view.

FIGS. 47A and 47B are diagrams showing the step of forming an active layer in the production of the semiconductor light-emitting device in Example 8 of an embodiment of the present invention, wherein FIG. 47A is a sectional view and FIG. 47B is a perspective view.

FIGS. 48A and 48B are diagrams showing the step of forming an electrode in the production of the semiconductor light-emitting device in Example 8 of an embodiment of the present invention, wherein FIG. 48A is a sectional view and FIG. 48B is a perspective view.

FIGS. 49A and 49B are diagrams showing the step of separating devices in the production of the semiconductor light-emitting device in Example 8 of an embodiment of the present invention, wherein FIG. 49A is a sectional view and FIG. 49B is a perspective view.

FIGS. 51A and 51B are diagrams showing the step of forming an electrode in the production of the modified semiconductor light-emitting device in Example 8 of an embodiment of the present invention, wherein FIG. 51A is a sectional view and FIG. 51B is a perspective view.

FIGS. 53A and 53B are diagrams showing the step of forming an electrode in the production of the semiconductor light-emitting device in Example 9 of an embodiment of the present invention, wherein FIG. 53A is a sectional view and FIG. 53B is a perspective view.

DETAILED DESCRIPTION OF THE INVENTION

Figure 1:
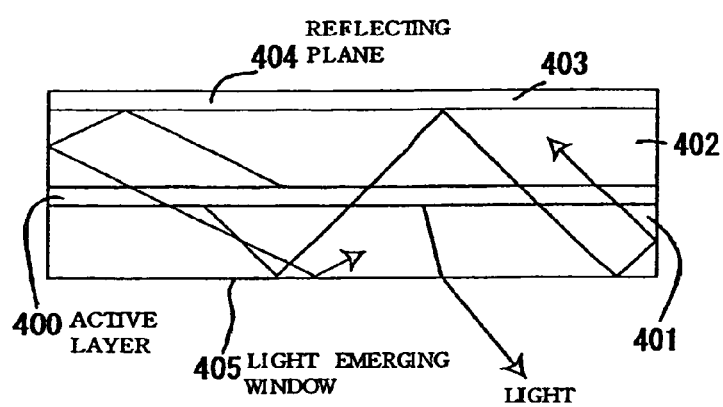
FIG. 1 is a sectional view showing a structure of a semiconductor light-emitting device.
Figure 2:
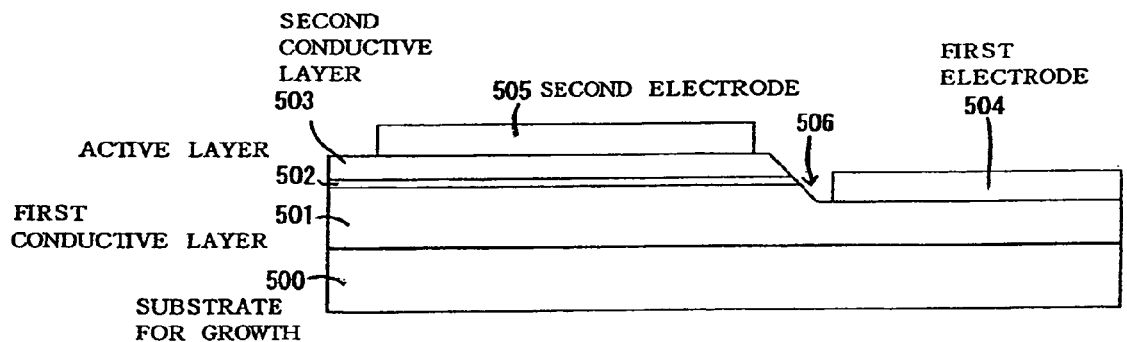
FIG. 2 is a sectional view showing another structure of a semiconductor light-emitting device.
Figure 3A:
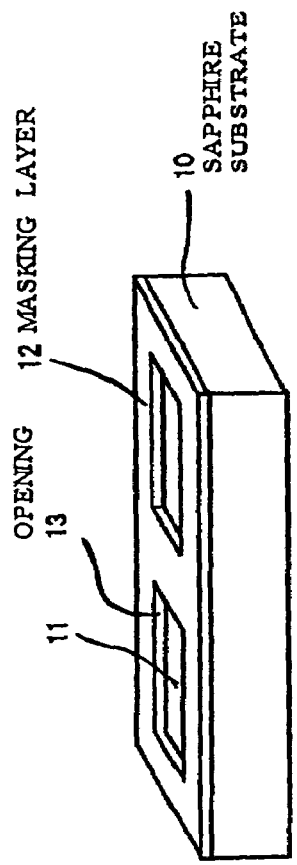
Figure 3B:
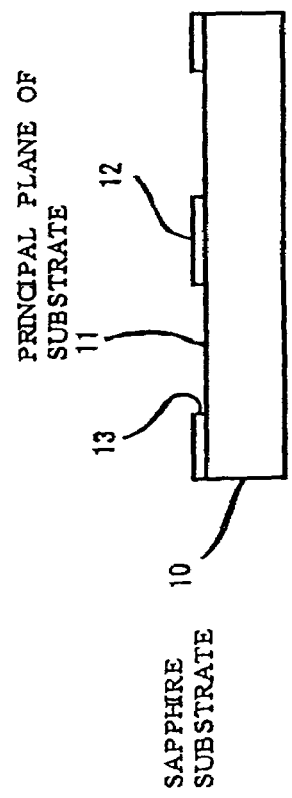

A semiconductor light-emitting device according to an embodiment of the present invention includes a substrate and a crystal layer formed thereon, the crystal layer having a slant crystal plane slanting to (i.e., diagonally intersecting) the principal plane of the substrate, and further includes a layer of a first conductivity type, an active layer, and a layer of a second conductivity type which are formed parallel to the slant crystal plane on the crystal layer.

The substrate used in an embodiment of the present invention is not specifically restricted so long as it forms a crystal layer having a slant crystal plane slanting to the principal plane of the substrate. Various substrates are available including, for example, sapphire (Al1203, having A-plane, R-plane, or C-plane), SiC (including 6H, 4H, and 3C), GaN, Si, ZnS, ZnO, AlN, LiMgO, GaAs, MgA12O4, and InAlGaN. Of the above-described substrates, hexagonal or cubic crystal based substrates are preferred, with the hexagonal substrates being most preferred. A sapphire substrate whose principal plane is the C-plane can be used. In general, the C-plane is a plane on which a gallium nitride (GaN) based compound for a semiconductor is usually grown, and the C-plane as the principal plane of the substrate may have a plane orientation which is inclined at an angle of 5 or 6 degrees.

In an embodiment, the substrate itself is not a constituent of the light-emitting device and is used merely to hold device parts and is removed before the device is completed.

In an embodiment, the crystal layer formed on the substrate has a slant crystal plane slanting to the principal plane of the substrate. This crystal layer is not specifically restricted so long as it permits the light-generating region (mentioned later) to be formed thereon, which consists of a layer of a first conductivity type, an active layer, and a layer of a second conductivity type, and is parallel to the slant crystal plane slanting to the principal plane of the substrate. A material of a wurtzite crystal structure is desirable for the crystal layer. However, it should be appreciated that a variety of suitable crystal structures can be utilized.

The crystal layer can be formed of a variety of different and suitable materials. In an embodiment, the crystal layer may be formed from a group III based compound semiconductor, a BeMgZnCdS based compound semiconductor, a BeMgZnCdO based compound semiconductor, a gallium nitride (GaN) based compound semiconductor, an aluminum nitride (AlN) based compound semiconductor, an indium nitride (AlN) based compound semiconductor, an indium gallium nitride (InGaN) based compound semiconductor, an aluminum gallium nitride (AlGaN) based compound semiconductor, the like and combinations thereof. In an embodiment, Nitride semiconductors such as a gallium nitride based compound semiconductor are preferred.

It should be noted that in the present invention, InGaN, AlGaN, GaN, and the like do not necessarily imply nitride semiconductors of ternary or binary mixed crystals alone. InGaN, for example, may contain a trace amount of Al and other impurities which do not affect the function of InGaN. Such compound semiconductors are within the scope of the present invention.

The crystal layer can be grown by chemical vapor deposition of various kinds, such as metal organic chemical vapor deposition (MOCVD) including, for example, metal organic vapor phase epitaxy (MOVPE), molecular beam epitaxy (MBE), hydride vapor phase epitaxy (HVPE), and the like. In an embodiment, MOCVD is preferred because it rapidly yields a crystal layer with desirable crystal properties. The MOCVD method commonly employs alkyl metal compounds, such as TMG (trimethylgallium) or TEG (triethylgallium) as a Ga source, TMA (trimethylaluminum) or TEA (triethylaluminum) as an Al source, and TMI (trimethylindium) or TEI (triethylindium) as an In source. It also employs ammonia gas or hydrazine gas as a nitrogen source, and other gases as an impurity source, for example, silane gas for Si, germane gas for Ge, Cp2Mg (cyclopentadienylmagnesium) for Mg, and DEZ (diethylzinc) for Zn. In general, MOCVD is carried out by feeding the gases to the surface of the substrate which is heated at about 600° C. or above, so that the gases decompose to give an InAlGaN based compound semiconductor by epitaxial growth.

It is desirable, in an embodiment, that the crystal layer be formed after an underlying layer for growth has been formed on the substrate. In an embodiment, the underlying layer for growth may be a gallium nitride layer, an aluminum nitride layer, or the like. It may also be a combination of a low-temperature buffer layer and a high-temperature buffer layer, or a combination of a buffer layer and a crystal seed layer (functioning as a crystal seed). As in the crystal layer, the underlying layer for growth can also be formed by chemical vapor deposition such as metal organic chemical vapor deposition (MOCVD), molecular beam epitaxy (MBE), hydride vapor phase epitaxy (HVPE), and the like. Growing the crystal layer from the low-temperature buffer layer causes a problem that polycrystals are likely to precipitate on the mask. This problem is overcome by forming a crystal seed layer and then growing thereon a plane differing from the substrate. Thus, it is possible to grow crystals having desirable crystal properties. In the case of selective growth for crystal growing, it is necessary to grow crystals from the buffer layer if there exists no crystal seed layer. Selective growth from the buffer layer causes crystals to grow from the part where the crystal growth is not required. Consequently, the crystal seed layer permits crystals to grow selectively in the region where crystal growth is necessary. The buffer layer is intended to relieve lattice mismatch between the substrate and the nitride semiconductor. Therefore, there may be an instance where the buffer layer is not formed if the substrate has a lattice constant close to that of the nitride semiconductor. For example, there may be an instance where an AlN buffer layer is formed on SiC without lowering temperature or an AlN or GaN buffer layer is formed on a Si substrate without lowering temperature. Thus, it is also possible to form GaN of good quality. The structure without any buffer layer is acceptable if the substrate is GaN or a suitable material.

According to an embodiment of the present invention, selective growth can be used to form the slant crystal plane slanting to the principal plane of the substrate. The slant crystal plane slanting to the principal plane of the substrate depends on the principal plane of the substrate used. It is selected from such crystal planes as the (1-100) plane [M-plane], the (1-101) plane [S-plane], the (11-20) plane [A-plane], the (1-102) plane [R-plane], the (11-23) plane [N-plane], the (11-22) plane, the like and combinations thereof when the principal plane of the substrate is the (0001) plane [C-plane] of a wurtzite structure.

It is noted that the plane terminology (e.g., S-plane, C-plane or the like) as used herein denotes crystal planes in accordance with Miller indices of a hexagonal crystal system. Where appropriate, throughout the specification, these planes are intended to include more than one plane in the hexagonal crystal system. For example, the S-plane is listed above as corresponding to the (1-101) plane, but it should be understood that, where appropriate, the S-plane is intended to include one or more of the planes relating to the family of planes making up a crystal structure having the S-plane. For example, if the crystal structure being described is a hexagonal pyramid having the S-plane, planes corresponding to each side face of the hexagonal pyramid would be included in the family of planes denoted by the S-plane. For example, in addition to the (1-101) plane, a hexagonal pyramid has side faces corresponding to the (10-11), (01-11), (−1101) and (0-111) planes.

In an embodiment, the S-plane and the (11-22) plane are preferred. Naturally, equivalent crystal planes may also be used, for example, planes having a plane orientation inclined at an angle of about 5 to about 6 degrees to the S-plane or the (11-22) plane. In particular, the S-plane is a stable plane which is obtained when selective growth is carried out on the C+-plane. The S-plane can be obtained comparatively easily, and it is expressed as a (1-101) plane in accordance with Miller indices of a hexagonal crystal system. Just as the C-plane includes the C+-plane and the C−-plane, the S-plane includes the S+-plane and the S−-plane. In this specification, the S+-plane is grown on the C+-plane GaN and it is referred to as the S-plane unless otherwise stated. Additionally, of the S-planes, the S+-plane is stable.

The index of the C+-plane is (0001). In the case where the crystal layer is formed from a gallium nitride based compound semiconductor (as mentioned above), the number of bonds from Ga to N is 2 or 3 on the S-plane. This number is second to that on the C-plane. Since the C−-plane cannot be obtained on the C+-plane in practice, the number of bonds on the S-plane is the largest. For example, when a nitride is grown on a sapphire substrate having the C-plane as the principal plane, the nitride of wurtzite structure has a surface of C+-plane. However, it is possible to form the S-plane if selective growth is employed. On the plane parallel to the C-plane, the bond of N (which easily releases itself) combines with one bond of Ga, whereas on the slant S-plane, it combines with at least one bond. This causes the effective V/III ratio to increase, thereby improving the crystal properties of the laminate structure. In addition, growth in the direction different from the orientation of the substrate bends dislocations extending from the substrate, thereby favorably decreasing defects.

In a semiconductor light-emitting device according to an embodiment of the present invention, the crystal layer has a slant crystal plane slanting to the principal plane of the substrate. The crystal layer may be formed such that the S-plane (or any other plane substantially equivalent thereto) constitutes the side faces of an approximately hexagonal pyramid, or the S-plane (or any other plane substantially equivalent thereto) constitutes the side faces of an approximately hexagonal prismoid and the C-plane (or any other plane substantially equivalent thereto) constitutes the top plane of the approximately hexagonal prismoid. The approximately hexagonal pyramid and approximately hexagonal prismoid do not necessarily need to be exactly hexagonal. They may include those which have one or more missing faces. In a preferred embodiment, the slant crystal plane is hexagonal and is arranged approximately symmetrical. The term "approximately symmetrical," as used herein, embraces completely symmetrical and slightly asymmetrical. The edge between the crystal planes of the crystal layer does not necessarily need to be straight. Also, the approximately hexagonal pyramid or approximately hexagonal prismoid may be in an elongated shape.

In actuality, selective growth is accomplished in an embodiment by using a selectively removed part of the underlying layer for growth or by using a selectively made opening in the masking layer on the underlying layer for growth or in the masking layer which is formed before the underlying layer for growth has been formed. For example, when the underlying layer for growth consists of a buffer layer and a crystal seed layer, the crystal seed layer on the buffer layer is divided into scattered small regions, each about 10 μm in diameter. Crystals are grown from these small regions such that the crystal layer having the S-plane is formed. For example, the finely divided crystal seed layers may be arranged apart from one another, thereby allowing finished light-emitting devices to be separated. Individual small regions may take on any shape such as a stripe, a lattice, a circle, a square, a hexagon, a triangle, a rectangle, a rhombus, the like and combinations thereof. Selective growth may also be accomplished by forming a masking layer on the underlying layer for growth and selectively forming openings(i.e., window regions) in the masking layer. In an embodiment, the masking layer may be a silicon oxide layer, a silicon nitride layer, or the like. The approximately hexagonal pyramids or prismoids in an elongated shape (as mentioned above) may be formed if the window region in the masking layer or the crystal seed layer is formed in an elongated shape.

In an embodiment, if the window region in the masking layer for selective growth is a circle of about 10 µm in diameter (or a hexagon whose one side coincides with the (1-100) direction or (11-20) direction), it is possible to easily form a selectively grown region which is about twice as large as the window region. Also, the S-plane in a direction different from the substrate produces the effect of bending or isolating dislocations. This contributes to reduction in the density of dislocations.

Observation by cathode luminescence on the grown hexagonal prismoid indicates that the S-plane has desirable crystal properties and is superior to the C+-plane in light emission efficiency. Growing the InGaN active layer at about 700° C. to about 800° C. makes ammonia decompose slowly and hence, requires more nitrogen species. Observations with an AFM revealed that the surface has regular steps suitable for InGaN uptake. It was also found that the Mg-doped layer, whose grown surface observed by AFM is usually in poor state, improves owing to the S-plane and that the doping condition is considerably different. Observation by microscopic photoluminescence mapping (which has a resolving power of about 0.5 µm to about 1 µm) revealed that the S-plane formed by selective growth is uniform. The S-plane formed on the C+-plane by the ordinary process has irregularities at a pitch of about 1 µm. Also, observation with an SEM revealed that the side face is smoother than the C+-plane.

If selective growth is carried out, using a mask, such that crystals grow only over the opening of the mask, crystals do not grow in the lateral direction. Thus, it is possible to employ microchannel epitaxy to make crystals to grow in the lateral direction, extending beyond the window region. It is known that growing in the lateral direction by microchannel epitaxy readily avoids threading dislocations and hence, reduces dislocations. Thus, growing in the lateral direction gives an enlarged light-generating region and contributes to uniform current flow and reduced current density.

A semiconductor light-emitting device according to an embodiment of the present invention includes a substrate and a crystal layer formed thereon, the crystal layer having a slant crystal plane slanting to the principal plane of the substrate, and further includes a layer of a first conductivity type, an active layer, and a layer of a second conductivity type which are formed parallel to the slant crystal plane on the crystal layer. The layer of a first conductivity type is a cladding layer of p-type or n-type, and the layer of a second conductivity type is a cladding layer of an opposite type. For example, if the crystal layer constituting the S-plane is formed from a silicon-doped gallium nitride based compound semiconductor layer, an n-type cladding layer is formed from a silicon-doped gallium nitride compound semiconductor. On this cladding layer, an active layer of InGaN is formed. On this active layer, a p-type cladding layer of magnesium-doped gallium nitride based compound semiconductor is formed. Thus, the desired double heterojunction structure is obtained. Another possible structure is such that the active layer of InGaN is held between two AlGaN layers. The active layer may be of a single bulk layer structure. Alternatively, it may be of single quantum well (SQW) structure, double quantum well (DQW) structure, or multiple quantum well (MQW) structure. The quantum well structure may use a barrier layer for separation of quantum wells, if necessary. The light-emitting device having an active layer of InGaN is easy to produce and has desirable light emission characteristics. Moreover, the InGaN layer readily crystallizes and has desirable crystal properties on the S-plane from which nitrogen atoms hardly release themselves, thereby increasing the light emission efficiency.

Additionally, a nitride compound semiconductor tends to become n-type due to nitrogen holes which occur in crystal even though it is not doped. However, it can be deliberately made n-type, having a desired carrier density, if it is doped with an ordinary donor impurity (such as Si, Ge, and Se) during crystal growth. Also, a nitride semiconductor can be made p-type by doping with an acceptor impurity (such as Mg, Zn, C, Be, Ca, and Ba). In order to obtain a p-layer with a high carrier density, it is desirable to subject it to annealing at about 400° C. or more in an inert gas atmosphere (such as nitrogen and argon) after doping with an acceptor impurity. Activation by irradiation with electron beams, microwaves, or light is also available.

In an embodiment, the layer of a first conductivity type, the active layer, and the layer of a second conductivity type are parallel to the slant crystal plane slanting to the principal plane of the substrate. They are easily formed by crystal growth following the formation of the slant crystal plane. When the crystal layer forms approximately hexagonal pyramids or prismoids and the slant crystal plane is the S-plane, the light-generating region (consisting of the layer of a first conductivity type, the active layer, and the layer of a second conductivity) may be formed entirely or partly on the S-plane.

With an approximately hexagonal prismoid, the layer of a first conductivity type, the active layer, and the layer of a second conductivity type may also be formed on its top face, parallel to the principal plane of the substrate. One advantage of light emission by the slant S-plane is that light emerges from the semiconductor without multiple reflection owing to the slant planes. In contrast, with parallel planes, light attenuates due to multiple reflection.) The layer of a first conductivity type (or the cladding layer) may have the same conductivity type if it is made from the same material as used for the crystal layer constituting the S-plane. It is also possible to form by controlling the density continuously after the crystal layer constituting the S-plane has been formed. In an embodiment, the structure may be such that part of the crystal layer constituting the S-plane functions as the layer of a first conductivity type. Also, light emergence is improved when the plane is not perpendicular to the substrate.

A semiconductor light-emitting device according to an embodiment of the present invention offers improved light emission efficiency by virtue of desirable crystal properties possessed by the slant crystal plane. The light emission efficiency can be increased if current is injected only into the S-plane having desirable crystal properties owing to its advantageous uptake for In. The active layer, substantially parallel to the S-plane, may have an area larger than that obtained by projecting the active layer to the principal plane of the substrate or the underlying layer for growth. The active layer with a large area increases the device's emitting surface, thereby leading to a reduction in current density.

Moreover, the active layer, with a large area, decreases brightness saturation and hence, increases light emission efficiency.

In an embodiment, with the crystal layer in the form of hexagonal pyramid, the S-plane is poor in step state particularly in the vicinity of the apex and the light emission efficiency is low at the apex. The reason for this is that the hexagonal pyramid is constructed such that each of its sides consists of four sections extending from its center toward the apex, left edge, right edge, and base, and the section extending toward the apex is very wavy and anomalous growth readily occurs in the vicinity of the apex. In contrast, in the two sections extending toward both edges, steps are nearly straight and dense and in a very desirable grown state. In the section extending toward the base, steps are slightly wavy but crystal growth is not so anomalous as in the section extending toward the apex. Thus, in the semiconductor light-emitting device according to an embodiment of the present invention, it is possible to control current injection into the active layer such that current density is lower in the vicinity of the apex than in the surrounding areas. The structure to realize the low current density in the vicinity of the apex is such that the electrode is formed at the side of the slope but is not formed at the apex or is such that the current block region is formed before the electrode is formed at the apex.

In an embodiment, electrodes are formed on the crystal layer and the layer of a second conductivity type, respectively. For reduced contact resistance, the electrode may be formed on a previously formed contact layer. These electrodes may be formed by vapor deposition. Accurate vapor deposition is necessary to avoid short-circuiting, which occurs as the result of the p-electrode and n-electrode coming into contact with the crystal layer and the crystal seed layer formed under the mask.

A semiconductor light-emitting device according to an embodiment of the present invention includes a substrate and a crystal layer formed thereon, the crystal layer having the slant S-plane (or a plane substantially equivalent thereto) slanting to the principal plane of the substrate and further includes a layer of a first conductivity type, an active layer, and a layer of a second conductivity type parallel to the S-plane or a plane substantially equivalent thereto which are formed on the crystal layer. The substrate used herein is not specifically restricted so long as it forms a crystal layer having the S-plane or a plane equivalent thereto. It may be the same type of substrate used for the semiconductor light-emitting device mentioned in the previous embodiment.

In an embodiment, the crystal layer formed on the substrate has the S-plane (or a plane substantially equivalent thereto) slanting to the principal plane of the substrate. This crystal layer may be formed from any material which gives the light-generating region consisting of the layer of a first conductivity type, the active layer, and the layer of a second conductivity type parallel to the S-plane or a plane substantially equivalent thereto. The same type of material mentioned in previous embodiments may be used. The method for growing the crystal layer and the underlying layer for growth for the crystal layer may also be the same as those mentioned in the previously described embodiments. Also, the plane substantially equivalent to the S-plane has a plane orientation inclined toward the S-plane at an angle of about 5 to about 6 degrees.

According to an embodiment of the present invention, it is possible to use selective growth to form the S-plane or a plane substantially equivalent thereto. The S-plane is a stable plane which is obtained by selective growth on the C+-plane and can be obtained comparatively easily with an index of (1-101) in the hexagonal crystal system. Just as the C-plane includes the $C^+$-plane and the $C^-$-plane, so the S-plane includes the $S^+$-plane and the $S^-$-plane. In an embodiment, the $S^+$-plane is grown on the $C^+$-plane GaN and it is referred to as the S-plane unless otherwise stated.

According to an embodiment of the present invention, a semiconductor light-emitting device is constructed such that the crystal layer has at least the S-plane or a plane substantially equivalent thereto. The crystal layer may be such that the S-plane (or any other plane substantially equivalent thereto) constitutes the side faces of an approximately hexagonal pyramid, or the S-plane (or any other plane substantially equivalent thereto) constitutes the side faces of an approximately hexagonal prismoid and the C-plane (or any other plane substantially equivalent thereto) constitutes the top of the approximately hexagonal prismoid. The approximately hexagonal pyramid or approximately hexagonal prismoid does not necessarily need to be exactly hexagonal. It may include those which have one or more missing faces or have edges which are not straight. The approximately hexagonal pyramid or approximately hexagonal prismoid may be in an elongated shape. The method for selective growth is the same as that used in the previously described embodiments.

A semiconductor light-emitting device according to an embodiment of the present invention has the layer of a first conductivity type, the active layer, and the layer of a second conductivity type parallel to the S-plane or a plane substantially equivalent thereto, which are formed on the crystal layer. The layer of a first conductivity type, the active layer, and the layer of a second conductivity type are similar to those explained in the previous embodiments.

In an embodiment, the layer of a first conductivity type, the active layer, and the layer of a second conductivity type are parallel to the S-plane or a plane substantially equivalent thereto. They are easily formed by continuous crystal growth in the place where the S-plane has been formed. When the crystal layer forms approximately hexagonal pyramids or prismoids and the slant plane is the S-plane, the light-generating region (consisting of the layer of a first conductivity type, the active layer, and the layer of a second conductivity) may be formed entirely or partly on the S-plane. With an approximately hexagonal prismoid, the layer of a first conductivity type, the active layer, and the layer of a second conductivity may also be formed on its top face parallel to the principal plane of the substrate. One advantage of light emission utilizing the slant S-plane is that light emerges from the semiconductor without multiple reflection owing to the slant planes. With parallel planes, light attenuates due to multiple reflection. The layer of a first conductivity type (or the cladding layer) may have the same conductivity type if it is made from the same material as used for the crystal layer constituting the S-plane. It is also possible to form by controlling the density continuously after the crystal layer constituting the S-plane has been formed. In an embodiment, the structure may be such that part of the crystal layer constituting the S-plane functions as the layer of a first conductivity type.

A semiconductor light-emitting device according to an embodiment of the present invention offers improved light emission efficiency by virtue of desirable crystal properties possessed by the slant S-plane. The light emission efficiency can be increased if current is injected only into the S-plane having desirable crystal properties owing to its beneficial uptake for In. The active layer substantially parallel to the S-plane may have an area larger than that obtained by projecting the active layer to the principal plane of the substrate or the underlying layer for growth. The active layer, with a large area, increases the device's emitting surface, thereby leading to a reduction in current density. Moreover, the active layer, with a large area, decreases brightness saturation and hence, increases light emission efficiency.

In an embodiment, with the crystal layer in the form of hexagonal pyramid, the S-plane is poor in step state particularly in the vicinity of the apex and the light emission efficiency is low at the apex. The reason for this is that the hexagonal pyramid is constructed such that each of its sides consists of four sections extending from its center toward the apex, left edge, right edge, and base, and the section extending toward the apex is very wavy and anomalous growth readily occurs in the vicinity of the apex. In contrast, in the two sections extending toward both edges, steps are nearly straight and dense and in a very desirable grown state. In the section extending toward the base, steps are slightly wavy but crystal growth is not so anomalous as in the section extending toward the apex. Thus, in the semiconductor light-emitting device according to an embodiment of the present invention, it is possible to control current injection into the active layer such that current density is lower in the vicinity of the apex than in the surrounding areas. The structure to realize the low current density in the vicinity of the apex is such that the electrode is formed at the side of the slope but is not formed at the apex or is such that the current block region is formed before the electrode is formed at the apex.

In an embodiment, electrodes are formed on the crystal layer and the layer of a second conductivity, respectively. For reduced contact resistance, the electrode may be formed on a previously formed contact layer. These electrodes may be formed by vapor deposition. Accurate vapor deposition is necessary to avoid short-circuiting, which occurs as the result of the p-electrode and n-electrode coming into contact with the crystal layer and the crystal seed layer formed under the mask.

A semiconductor light-emitting device according to an embodiment of the present invention includes a crystal grown layer having a slant crystal plane which is formed by selective growth and slants to the principal plane of the substrate, an active layer which is formed on the crystal grown layer and emits light upon injection of current in a prescribed amount, and a reflecting plane or a reflecting region which is formed approximately parallel to the slant crystal plane and reflects part of light emerging from the active layer. The same concepts used in previous embodiments will be applicable to the substrate and crystal layer, the selective growth method of forming the crystal layer, and the basic constitution of the layer of a first conductivity type, the active layer, and the layer of a second conductivity type.

The reflecting plane or reflecting region in the semiconductor light-emitting device according to an embodiment of the present invention is not specifically restricted in its structure so long as it reflects substantially all light generated by the active layer or it is capable of effective reflection despite slight light transmission. This reflecting plane exists (at least partly) approximately parallel to the slant crystal plane. "Approximately parallel to the slant crystal plane" implies that the reflecting plane is either substantially parallel or slightly inclined. The reflecting plane may be a single plane or may consist of two or more planes parallel to the slant crystal plane capable of reflecting light generated by the active layer. The reflecting planes may be constructed such that they overlap in the normal direction of the slant crystal plane.

In a semiconductor light-emitting device according to an embodiment of the present invention, the crystal plane itself may function as the reflecting plane. The crystal plane functioning as the reflecting plane reduces scattering and permits light to emerge efficiently. Moreover, when the crystal plane functions as the reflecting plane, it may be constructed such that a metal film, as an electrode, can be formed after each semiconductor layer (such as the active layer) has been formed. Thus, the electrode constitutes a reflecting film. When the electrode formed on the active layer is used as the reflecting film, if the active layer is formed such that it is laminated on the slant crystal layer, the electrode can also be formed by itself in conformity with the shape of the crystal grown layer, and fabrication such as etching is unnecessary for the formation of the reflecting film.

In an embodiment, the reflecting plane, parallel to the above-mentioned slant crystal plane, for example, may be constructed of at least two reflecting planes facing each other at an angle smaller than 180°. These two or more reflecting planes facing each other at an angle smaller than 180° may be two or more planes facing directly opposite to each other or planes facing each other at other angles with a reflecting plane or a crystal plane interposed between them. For example, in the case of a device in which the crystal grown layer of hexagonal pyramid structure having the S-plane as the side face is formed, they face each other at an angle of about 60° at the apex of the hexagonal pyramid.

In an embodiment, electrodes are formed on the crystal grown layer or the first conductive layer and on the layer of a second conductivity type, respectively. For reduced contact resistance, the electrode may be formed on a previously formed contact layer. These electrodes may be formed by vapor deposition. Accurate vapor deposition is necessary to avoid short-circuiting, which occurs as the result of the p-electrode and n-electrode coming into contact with the crystal layer and the crystal seed layer formed under the mask. If the fundamental structure in the present invention is to be applied to a light-emitting diode, the electrodes may be formed on the first and second conductive layers, respectively. Either structure permits light to emerge from the front or reverse side, as desired. In other words, either structure permits light to emerge from the reverse side if a transparent substrate is used or either structure permits light to emerge from the front side if a transparent electrode is used.

One feature of a semiconductor light-emitting device according to an embodiment of the present invention is that the emerging light is partly reflected by the reflecting plane which is parallel to the slant crystal plane formed by selective growth. Reflection improves the light emergence efficiency, thereby causing the semiconductor light-emitting device to improve in brightness. Since the slant crystal plane as the base of the reflecting plane can be easily formed by selective growth, the reflecting plane can be obtained by self-forming without additional steps, such as etching.

Another feature of a semiconductor light-emitting device according to an embodiment of the present invention is that the active layer has a large area if it is formed by selective growth on a plane slant to the substrate for growth. When the device size is limited, the current injection density per unit area can be reduced for the same brightness when the active layer in the device has a larger effective area. Therefore, the device with a larger effective area has improved reliability for the same brightness and increased brightness for the same load on the active layer. In particular, if the difference between the total area of the active area and the area which the selectively grown region occupies in the substrate for growth is larger than the area necessary for contact with at least one electrode, then that portion of the active layer which is limited by the contact region is compensated. Consequently, owing to the active layer formed on the slant crystal plane, a semiconductor light-emitting device according to an embodiment of the present invention is less likely to experience a situation of current concentration even though its size is greatly reduced.

A semiconductor light-emitting device according to an embodiment of the present invention includes a substrate, a first grown layer of a first conductivity type formed on the substrate, a masking layer formed on the first grown layer, and a second grown layer of a first conductivity type which is formed by selective growth through an opening formed in the masking layer, and which further comprises a cladding layer of a first conductivity type parallel to the crystal plane of the second grown layer, an active layer, and a cladding layer of a second conductivity type, part or all of which cover the masking layer surrounding the opening. The substrate used in this embodiment is not specifically restricted so long as it can form the crystal layer which has a slant crystal plane slating to the principal plane of the substrate. It may be the same type used for the previous embodiments.

In an embodiment, the substrate is formed the grown layer which consists of a first grown layer (which is arranged under the masking layer) and a second grown layer which is formed and grown from the opening in the masking layer. These first and second grown layers are of a first conductivity type, but they are not specifically restricted so long as they permit the light-generating region (which consists of a layer of a first conductivity type, an active layer, and a layer of a second conductivity type) to be formed on the plane parallel to the crystal plane of the second grown layer. The first and second grown layers may be formed from a compound semiconductor, preferably that of a wurtzite structure.

In an embodiment, the grown layer may be formed from a group III based compound semiconductor, a BeMgZnCdS based compound semiconductor, a BeMgZnCdO based compound semiconductor, or the like. It may be formed also from a gallium nitride (GaN) based compound semiconductor, an aluminum nitride (AlN) based compound semiconductor, an indium nitride (InN) based compound semiconductor, an indium gallium nitride (InGaN) based compound semiconductor, an aluminum gallium nitride (AlGaN) based compound semiconductor, the like or combinations thereof. Nitride semiconductors such as a gallium nitride based compound semiconductor are preferred.

It should be noted that in the present invention, InGaN, AlGaN, GaN, and the like do not necessarily imply nitride semiconductors of ternary or binary mixed crystals alone. InGaN, for example, may contain a trace amount of Al and other impurities which do not affect the function of InGaN. Such compound semiconductors are within the scope of the present invention. In this specification, "nitride" means a compound composed of any of B, Al, Ga, In, and Ta as group III elements and mainly N as group V elements. However, "nitride" in this specification also includes those which have their bandgap reduced by incorporation with a trace amount of As and P.

In an embodiment, the grown layer can be formed by chemical vapor deposition of various kinds, such as metal organic chemical vapor deposition (MOCVD) including, for example, metal organic vapor phase epitaxy (MOVPE), molecular beam epitaxy (MBE), hydride vapor phase epitaxy (HVPE), and the like. In an embodiment, MOCVD is preferred because it rapidly yields a grown layer with advantageous crystal properties. The MOCVD method commonly employs alkyl metal compounds, such as TMG (trimethylgallium) or TEG (triethylgallium) as a Ga source, TMA (trimethylaluminum) or TEA (triethylaluminum) as an Al source, and TMI (trimethylindium) or TEI (triethylindium) as an In source. It also employs ammonia gas or hydrazine gas as a nitrogen source and other gases as an impurity source, for example, silane gas for Si, germane gas for Ge, Cp2Mg (cyclopentadienylmagnesium) for Mg, and DEZ (diethylzinc) for Zn. Usually, MOCVD is carried out by feeding the gases to the surface of the substrate which is heated at about 600° C. or above, so that the gases decompose to give an InAlGaN based compound semiconductor by epitaxial growth.

The first grown layer, in an embodiment, may be a gallium nitride layer or an aluminum nitride layer. It may also be a combination of a low-temperature buffer layer and a high-temperature buffer layer, or a combination of a buffer layer and a crystal seed layer (finctioning as a crystal seed). Forming the grown layer from the low-temperature buffer layer poses a problem that polycrystals are liable to precipitate on the mask. This problem is solved by forming a crystal seed layer and then growing thereon a plane differing from the substrate. Thus, it is possible to grow crystals having advantageous crystal properties. With selective growth for crystal growing, it is necessary to grow crystals from the buffer layer if there exists no crystal seed layer. Selective growth from the buffer layer causes crystals to grow from the part where the crystal growth is not required. Consequently, the crystal seed layer permits crystals to grow selectively in the region where crystal growth is necessary.

In an embodiment, the buffer layer is intended to relieve lattice mismatch between the substrate and the nitride semiconductor. Therefore, there may be an instance where the buffer layer is not formed if the substrate has a lattice constant close to that of the nitride semiconductor. For example, there may be an instance where an AlN buffer layer is formed on SiC without lowering temperature or an AlN or GaN buffer layer is formed on a Si substrate without lowering temperature. Thus, it is also possible to form GaN of a desirable quality. The structure without any buffer layer is acceptable if the substrate is GaN or a suitable material.

According to an embodiment of the present invention, the second grown layer is formed by selective growth and consequently it is possible to obtain the slant plane, slanting to the principal plane of the substrate. In general, depending on the selection of the principal plane of the substrate, it is possible to form a slant plane selected from the (1-100) plane [M-plane], the (1-101) plane [S-plane], the (11-20) plane [A-plane], the (1-102) plane [R-plane], the (11-23) plane [N-plane], the (11-22) plane, the like and combinations thereof when the principal plane of the substrate is the (0001) plane [C-plane] of a wurtzite structure.

In an embodiment, the S-plane and the (11-22) plane are preferred. Naturally, equivalent crystal planes may also be used including those which have a plane orientation inclined at an angle of about 5 to about 6 degrees with respect to the S-plane and the (11-22) plane. In particular, the S-plane is a stable plane which is obtained when selective growth is carried out on the C+-plane. The S-plane can be obtained comparatively easily, and its index is (1-101) in the hexagonal crystal system. Just as the C-plane includes the C+-plane and the C--plane, the S-plane includes the S+-plane and the S--plane. In this specification, the S+-plane is grown on the C+-plane GaN and it is referred to as the S-plane unless otherwise stated. Additionally, of the S-planes, the S+-plane is stable.

When the crystal layer is formed from a gallium nitride based compound semiconductor, as mentioned above, the number of bonds from Ga to N is 2 or 3 on the S-plane or S+-plane. This number is second to that on the C-plane. Since the C--plane cannot be obtained on the C+-plane, in practice, the number of bonds on the S-plane is the largest. For example, in the case where a nitride is grown on a sapphire substrate having the C-plane as the principal plane, the nitride of a wurtzite structure has a surface of C+-plane. However, it is possible to form the S-plane if selective growth is employed. On the plane parallel to the C-plane, the bond of N (which easily releases itself) combines with one bond of Ga, whereas on the inclined S-plane, it combines with at least one bond. This causes the effective V/III ratio to increase, thereby improving the crystal properties of the laminate structure. In addition, growth in the direction different from the orientation of the substrate bends dislocations extending from the substrate, thereby favorably decreasing defects.

According to an embodiment of the present invention, a semiconductor light-emitting device may be constructed such that the second grown layer by selective growth slants to the principal plane of the substrate. The second grown layer may be such that the S-plane (or any other plane substantially equivalent thereto) constitutes the side faces of an approximately hexagonal pyramid, or the S-plane (or any other plane substantially equivalent thereto) constitutes the side faces of an approximately hexagonal prismoid and the C-plane (or any other plane substantially equivalent thereto) constitutes the top plane of the approximately hexagonal prismoid. The approximately hexagonal pyramid or prismoid does not necessarily need to be exactly hexagonal. It may include those which have one or more missing faces. The edge between the crystal planes of the crystal layer does not necessarily need to be straight. Also, the approximately hexagonal pyramid or prismoid may be in an elongated shape.

In actuality, selective growth is accomplished in an embodiment by using a selectively made opening in the masking layer formed on the first grown layer. The opening in the masking layer may take on any shape such as a circle, a square, a hexagon, a triangle, a rectangle, a rhombus, a strip, a lattice, the like and combinations thereof. The masking layer in an embodiment is formed from a dielectric material such as silicon oxide, silicon nitride and the like. The masking layer may have a thickness ranging from about 0.1 µm to about 5 µm (preferably from about 0.1 µm to about 1.0 µm) so as to relieve steps in the vicinity of the active layer and electrode. The approximately hexagonal pyramid or prismoid in an elongated shape may be formed if the opening (window region) in the masking layer is in an elongated shape.

In an embodiment, if the window region in the masking layer for selective growth is a circle of about 10 µm in diameter (or a hexagon whose one side coincides with the (1-100) direction or (11-20) direction), it is possible to easily form a selectively grown region which is about twice as large as the window region. Also, the S-plane, in a direction different from the substrate, produces the effect of bending or isolating dislocations, thereby contributing to reduction in the density of dislocations.

Observation by cathode luminescence on the grown hexagonal prismoids indicates that the S-plane formed as the second grown layer has desirable crystal quality and is superior to the C+-plane in light emission efficiency. Growing the InGaN active layer at about 700° C. to about 800° C. makes ammonia decompose slowly and hence, requires more nitrogen species. Observation with an AFM revealed that the surface has regular steps suitable for InGaN uptake. It was also found that the Mg-doped layer has a good surface state owing to the S-plane and that the doping condition is considerably different. In general, the Mg-doped layer has a grown surface in a poor state when observed by an AFM. Observation by microscopic photoluminescence mapping (which has a resolving power of about 0.5 µm to about 1 µm) revealed that the S-plane, formed by selective growth, is uniform. The S-plane formed on the C+-plane by the ordinary process has irregularities at a pitch of about 1 µm. Also, observation with an SEM revealed that the slope of the S-plane is smoother than that of the C+-plane.

If selective growth is carried out by using a mask such that crystals grow only over the opening of the mask, crystals do not grow in the lateral direction. Thus, it is possible to employ microchannel epitaxy to make crystals to grow in the lateral direction, extending beyond the window region. It is known that growing in the lateral direction by microchannel epitaxy readily avoids threading dislocations and hence reduces dislocations. Thus, growing in the lateral direction gives an enlarged light-generating region and contributes to uniform current flow and reduced current density.

A semiconductor light-emitting device according to an embodiment of the present invention has a cladding layer of a first conductivity type, an active layer, and a cladding layer of a second conductivity type which are formed parallel to the crystal plane of second grown layer. The layer of a first conductivity type, the active layer, and the layer of a second conductivity type are similar to those explained in previous embodiments.

In a semiconductor light-emitting device according to an embodiment of the present invention, the cladding layer of a first conductivity type, the active layer, and the cladding layer of a second conductivity type extend entirely or partly to the masking layer surrounding the opening. One advantage of the structure in which the masking layer partly remains unremoved is that the support under the laterally grown part does not disappear. One advantage of the structure in which the masking layer entirely remains unremoved is that a structural offset(s) or gap(s) due to selective growth can be relieved and the masking layer functions as a supporting layer for the first grown layer, thereby keeping the n- and p-electrodes apart and preventing short-circuiting, even when the substrate is peeled off by laser irradiation.

Another semiconductor light-emitting device according to an embodiment of the present invention is constructed such that the second grown layer is entirely covered by the cladding layer of a first conductivity type, the active layer, and the cladding layer of a second conductivity type. This structure can be formed easily because the second grown layer assumes the slant crystal plane due to selective growth. In other words, when the active layer, parallel to the principal plane of the substrate, is formed, the end is exposed to air. However, it is possible to cover the end by utilizing the slant crystal plane. Since the second grown layer is entirely covered, the active layer is protected from oxidation and other degradation. Moreover, it produces the effect of increasing the light emission area.

Further, another semiconductor light-emitting device according to an embodiment of the present invention is constructed such that each end of the cladding layer of a first conductivity type, the active layer, and the cladding layer of a second conductivity type is in direct contact with the masking layer. This structure can be formed easily because the second grown layer assumes the slant crystal plane due to selective growth. Since each end is in direct contact with the masking layer and covers the active layer, the active layer is previously protected from oxidation and other degradation. Moreover, it produces the effect of increasing the light emission area.

A semiconductor light-emitting device according to an embodiment of the present invention offers improved light emission efficiency because the crystal plane has advantageous crystal properties. The light emission efficiency can be increased if current is injected only into the S-plane having beneficial crystal properties owing to its desirable uptake for In. The active layer substantially parallel to the S-plane may have an area larger than that obtained by projecting the active layer to the principal plane of the substrate or the first grown layer. The active layer, with a large area, increases the device's light emission surface, thereby leading to a reduction in current density. Moreover, the active layer, with a large area, decreases brightness saturation and hence, increases light emission efficiency.

In an embodiment, electrodes are formed on the second grown layer and the cladding layer of a second conductivity type, respectively. For reduced contact resistance, the electrode may be formed on a previously formed contact layer. These electrodes may be formed by vapor deposition. Accurate vapor deposition is necessary to avoid short-circuiting, which occurs as the result of the p-electrode and n-electrode coming into contact with the layer and the first grown layer formed under the mask.

A semiconductor light-emitting device according to an embodiment of the present invention includes a layer of a first conductivity type and a layer of a second conductivity type and an active layer which is held between the layers and is formed by selective growth not parallel to the principal plane of the substrate for growth, with the area of the active layer being larger than that of a window region used at the time of selective growth on the substrate or larger than the projected area obtained by projecting the selectively grown crystal layer to the substrate for growth in its normal direction. Similar concepts used in previous embodiments will be applicable to the substrate and crystal layer, the method of forming the crystal layer, and the basic constitution of the layer of a first conductivity type, the active layer, and the layer of a second conductivity type.

A semiconductor light-emitting device according to an embodiment of the present invention is basically constructed such that the active layer is formed as a slant plane by selective growth. For the maximum effect, it is desirable that the basic device size be equal to the thickness of the crystal grown layer or about 50 µm or less. The smaller the device size, the better the result. However, the basic structure is applicable to any device regardless of size so long as it is arranged one dimensionally or two dimensionally in a single device. In particular, a semiconductor light-emitting device according to an embodiment of the present invention produces its effect when the first conductive layer with high resistance needs a high-density contact for electrodes or the second conductive layer needs as large a contact area as possible.

In a semiconductor light-emitting device according to an embodiment of the present invention, the active layer is held between a layer of a first conductivity type and a layer of a second conductivity type, and the active layer is not parallel to the principal plane of the substrate for growth. The layer of a first conductivity type is a cladding layer of p-type or n-type, and the layer of a second conductivity type is a cladding layer of an opposite type. For example, if the crystal layer having the C-plane is formed from a silicon-doped gallium nitride based compound semiconductor layer, the semiconductor light-emitting device may take a double heterojunction structure consisting of an n-cladding layer of silicon-doped gallium nitride compound semiconductor, an active layer of InGaN, and a p-type cladding layer of magnesium-doped gallium nitride based compound semiconductor which are formed sequentially one over another. Another possible structure is such that the active layer of InGaN is held between two AlGaN layers. The active layer may be of single bulk layer structure. Alternatively, it may be of single quantum well (SQW) structure, double quantum well (DQW) structure, or multiple quantum well (MQW) structure. The quantum well structure may use a barrier layer for separation of quantum wells, if necessary. The light-emitting device having an active layer of InGaN is easy to produce and has desirable light emission characteristics. Moreover, InGaN readily crystallizes with advantageous crystal properties on the S-plane from which nitrogen atoms hardly release themselves, thereby increasing the light emission efficiency.

Additionally, the nitride compound semiconductor tends to become n-type due to nitrogen holes which occur in its crystal even though it is not doped. However, it can be deliberately made n-type having a desired carrier density if it is doped with an ordinary donor impurity (such as Si, Ge, and Se) during crystal growth. Also, the nitride semiconductor can be made p-type by doping with an acceptor impurity (such as Mg, Zn, C, Be, Ca, and Ba).

In an embodiment, the layer of a first conductivity type, the active layer, and the layer of a second conductivity type are formed on the crystal grown layer slanting to the principal plane of the substrate for growth. The active layer, not parallel to the principal plane of the substrate for growth, is easily formed by crystal growth following the formation of the slant crystal plane. If the active layer is formed on the crystal planes extending toward both sides from the ridge line, the resulting active layer has a bent part (e.g., bending from the S-plane to C-plane or bending from the S-plane to the M-plane). When the crystal grown layer forms an approximately hexagonal pyramid or prismoid and the surface of the slant crystal grown layer is the S-plane, the light-generating region (consisting of the layer of a first conductivity type, the active layer, and the layer of a second conductivity) may be formed entirely or partly on the S-plane.

With an approximately hexagonal prismoid, it is possible to form the layer of a first conductivity type, the active layer, and the layer of a second conductivity type also on the plane parallel to the principal plane of the substrate, for example, on the C-plane. One advantage of light emission by the slant S-plane is that light emerges from the semiconductor without multiple reflection owing to the slant planes. In contrast, with parallel planes, light attenuates due to multiple reflection. The layer of a first conductivity type (or the cladding layer) may have the same conductivity type if it is made from the same material as used for the crystal layer constituting the S-plane. It is also possible to form by controlling the density continuously after the crystal layer constituting the S-plane has been formed. In an embodiment, the structure may be such that part of the crystal layer constituting the S-plane functions as the layer of a first conductivity type.

A semiconductor light-emitting device according to an embodiment of the present invention offers improved light emission efficiency because the slant crystal plane has desirable crystal properties. The light emission efficiency can be increased if current is injected only into the S-plane having desirable crystal properties owing to its advantageous uptake for In. The active layer, substantially parallel to the S-plane, may have an area larger than that obtained by projecting the active layer to the principal plane of the substrate or the underlying layer for growth. The active layer with a large area increases the device's emitting surface, thereby leading to a reduction in current density. Moreover, the active layer, with a large area, decreases brightness saturation and hence, increases light emission efficiency.

In an embodiment, electrodes are formed on the crystal grown layer or the first conductive layer and on the layer of a second conductivity type, respectively. For reduced contact resistance, the electrodes may be formed on a previously formed contact layer. These electrodes may be formed by vapor deposition. Accurate vapor deposition is necessary to avoid short-circuiting, which occurs as the result of the p-electrode and n-electrode coming into contact with the crystal layer and the crystal seed layer formed under the mask. If the fundamental structure in the present invention is applied to a light-emitting diode, the electrodes may be formed respectively on the first and second conductive layers. Either structure permits light to emerge from the front or reverse side as desired. In other words, either structure permits light to emerge from the reverse side if a transparent substrate is used or either structure permits light to emerge from the front side if a transparent electrode is used.

One feature of a semiconductor light-emitting device according to an embodiment of the present invention is that the active layer has a large area if it is formed by selective growth on a plane not parallel to the substrate for growth. When the device size is limited, the current injection density per unit area can be reduced for the same brightness when the active layer in the device has a larger effective area. Therefore, the device with a larger effective area has improved reliability for the same brightness and increased brightness for the same load on the active layer. In particular, if the difference between the total area of the active area and the area which the selectively grown region occupies on the substrate for growth is larger than the area necessary for contact with at least one electrode, then that portion of the active layer which is limited by the contact region is compensated. Consequently, a semiconductor light-emitting device according to an embodiment of the present invention is less likely to experience a situation of current concentration even though its size is greatly reduced.

In an embodiment, assuming that the crystal grown layer takes on the shape of a ridge with a triangular cross section and the slant plane of the crystal grown layer slants to the principal plane of the substrate at an angle of $\theta$. It should be understood that the effective area of the active layer is $1/\cos\theta$ times larger (at the maximum) than the projected area obtained by projecting the entire region of the active layer to the substrate for growth in its normal direction. The effective area necessarily becomes large if the crystal grown layer is formed (in the shape of polygonal pyramid or prismoid as well as the ridge with a triangular cross section) by selective growth and then the active layer is formed thereon which is not parallel to the substrate. Additionally, the projected area is equal to the area occupied on the principal plane of the substrate and is also equal to the shadow of the crystal grown layer which would be formed if light is projected toward the principal plane of the substrate in its normal direction.

In addition, the area of the active layer can be made larger than the area of the substrate for growth if the region not used for crystal growth is minimized and the active layer is separated from its adjacent ones by a growth inhibiting film (such as a masking layer) and grown to the maximum extent such that adjacent stable planes do not come into contact with each other. However, the maximum area attained by a single growth is equal to the area of the substrate used for growth. The effective area of the active layer is reduced further after the electrodes and device separating grooves have been added. Therefore, a satisfactory effect is obtained even though the total area of the active layer is not necessarily larger than the area of the substrate for growth.

In an embodiment, if the effective area of the active layer is made larger than the area of the window region used at the time of selective growth on the substrate for growth, or lager than the projected area obtained by projecting the crystal grown layer resulting from selective growth to substrate in its normal direction, then it is possible to reduce the density of current injected into the active layer, thereby improving the reliability of the device. Also, if the effective area of the active layer is made larger than the sum of the projected area of the selective grown region toward the substrate for growth in its normal direction and the contact area of at least one electrode and the conductive layer, it is possible to reduce the density of current being injected into the active layer, thereby improving the reliability of the device. In particular, if the difference between the total area of the active layer and the projected area of the selectively grown region toward the substrate for growth is larger than the area necessary for contact with at least one electrode, then that portion of the active layer which is limited by the contact region is compensated.

Assuming a light-emitting diode device, for example, having the size of a 30 µm square, is produced. The region in which the first electrode comes into contact with the underlying conductive layer (which is the first conductive layer) is approximately 20 µm×5 µm and the region for selective growth in which the active layer can be placed is approximately 20 µm square at the largest. Therefore, by making the total area of the active layer equal to or larger than 500 µm2, it is possible to obtain the device structure according to an embodiment of the present invention. If a quadrangular pyramid (with a slope angle of 45° and a base side of 20 µm) is formed in the region for selective growth and the active layer is formed thereon uniformly, the total area of the active layer is 20 µm×20 µm /cos 45°=566 µm2. Thus, the effective area of the active layer is sufficiently large compared with the contact area. Moreover, it is apparent that the effect will be better if the angle of the slope is larger. In view of the fact that the (1-101) stable for the (0001) of a wurtzite structure is about 62° and the (111) plane stable for the (001) plane of zincblende is about 54.7°, the present invention ensures satisfactory reliability by expanding the region for the active layer.

It is possible to construct an image display unit or lighting system by arranging, in an array, a plurality of semiconductor light-emitting devices according to an embodiment of the present invention. If devices corresponding to three primary colors are arranged in an array capable of scanning, the resulting display unit will have a small area because the electrode has a reduced area owing to the use of the S-plane.

EXAMPLES

The present invention will be described in more detail with reference to the following examples. Each example corresponds to an individual production process and each device resulting from the production process is a semiconductor light-emitting device having a structure defined according to an embodiment of the present invention. The production process is described first and then the device resulting from the production process is subsequently described. Various modifications and changes may be made in the semiconductor light-emitting device without departing from the spirit and scope of the invention. The following examples are not intended to restrict the scope of the invention.

Example 1

This example demonstrates a semiconductor light-emitting device which has a crystal layer formed by selective growth directly on a sapphire substrate. Additionally, the crystal layer includes a crystal surface having the S-plane as the slant crystal plane (i.e. the crystal surface plane that diagonally intersects the principal plane of the substrate). Its production process and structure will be described with reference to FIGS. 3A to 9.

The sapphire substrate 10 has the C+-plane as its principal plane 11 (i.e. the substrate surface plane). On the entire surface of the sapphire substrate 10 is formed the masking layer 12 (about 100 nm to about 500 nm thick) of SiO2 or SiN. In the masking layer 12 is formed the opening 13 (about 100 μm) by photolithography and etching with hydrofluoric acid based compound (see FIGS. 3A and 3B). In this Example, the opening 13 is in an approximately rectangular shape, but the size of the opening may be changed according to the characteristics of the light-emitting device to be produced.

Then, selective growth is carried out in two stages. First, a thin GaN layer or a low-temperature buffer layer (about 20 nm to about 30 nm thick) is grown at a low temperature of about 500° C. Secondly, the growing temperature is raised to about 1000° C. so as to form the silicon-doped GaN layer 14, as shown in FIGS. 4A and 4B. The silicon-doped GaN layer 14 grows in the opening 13 in the masking layer 12, but it gradually expands in the lateral direction while it is kept at about 1000° C. in a hydrogen atmosphere.

On the silicon-doped GaN layer 14 a masking layer 15 is formed. Subsequently, an approximately round opening 16 is formed by photolithography and etching (see FIGS. 5A and 5B). The silicon-doped GaN layer 14 is allowed to grow further through the opening 16 until the silicon-doped GaN layer 17 grows in the shape of a hexagonal pyramid. The surface of the crystal layer in the shape of the hexagonal pyramid is covered by the S-plane, that is, the (1-101) plane according to Miller indices of a hexagonal system. If the growing time is insufficient or if different growing conditions are employed, the silicon-doped GaN layer 17 may take the shape of a hexagonal prismoid in which the top plane is the C+-plane, parallel to the principal plane of the substrate. In this example, however, the silicon-doped GaN layer 17 is grown until it takes the shape of a hexagonal pyramid. After the lapse of sufficient growing time, the side faces of the hexagonal pyramid of the silicon-doped GaN layer 17 are covered with the S-plane. It is necessary that the opening 16 is sufficiently apart from adjacent openings.

It should be noted that the S-plane is intended to include one or more of the planes relating to the family of planes corresponding to the (1-101) plane. In an embodiment, the S-plane includes the planes corresponding to each side face of the hexagonal pyramid as shown in this example. For example, in addition to the (1-101) plane, the hexagonal pyramid has side faces corresponding to the (10-11), (01-11), (−1101), (−1011), and (0-111) planes.

After the silicon-doped GaN layer 17 has grown in the shape of a hexagonal pyramid, growing is continued until the hexagonal pyramid becomes about 15 μm to about 20 μm wide (with one side being about 7.5 μm to about 10 μm long). The height of the hexagonal pyramid is about 10 μm to about 16 μm, which is about 1.6 times the side of the hexagonal pyramid. This size is merely exemplary, and the width equal to or smaller than 10 μm may be acceptable. The silicon-doped GaN layer 17 is grown further. Subsequently, the InGaN layer 18 is grown at a reduced growing temperature. The thickness of the InGaN layer 18 is about 0.5 nm to about 3 nm. Then, the magnesium-doped GaN layer 19 is grown at an increased growing temperature, as shown in FIGS. 6A and 6B. There may be an instance where a quantum well layer (or a multiple quantum well layer) of (Al)GaN/InGaN is formed, or there may be another instance where a multilayer structure is formed with GaN or InGaN functioning as the guide layer. In such a case, it is desirable to grow the AlGaN layer directly on the InGaN layer.

Figure 8B:
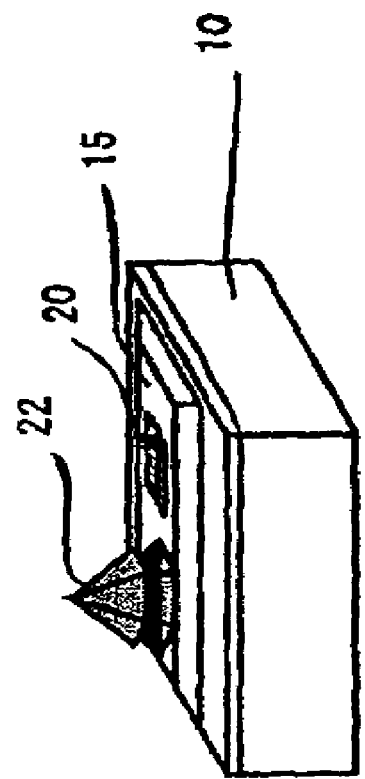
Figure 8A:
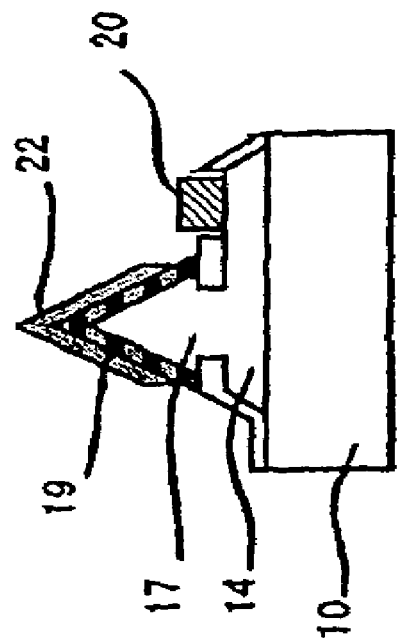

Subsequently, etching is performed on part of the epitaxially grown layer until the silicon-doped GaN layer 14 is exposed. In the removed part 21, the n-electrode 20 (Ti/Al/Pt/Au) is formed by vapor deposition. On the outermost surface of the previously grown hexagonal pyramid, the p-electrode 22 (Ni/Pt/Au or Ni(Pd)/Pt/Au) is formed by vapor deposition (see FIGS. 7A and 7B). These vapor depositions should be carried out accurately so as to prevent the p-electrode and n-electrode from coming into contact with the silicon-doped GaN layer 17 (in the form of hexagonal pyramid) and the silicon-doped GaN layer 14 (formed under the mask), thereby preventing short-circuiting. Then, individual light-emitting devices are separated by RIE (reactive ion etching) or dicing (i.e., separating the devices with an optical mechanism, a mechanical mechanism, or the like), as shown in FIGS. 8A and 8B. Thus, the light-emitting device in this example is completed.

The light-emitting device produced by the above-mentioned process has a structure as shown in FIG. 9. It is composed mainly of the sapphire substrate 10 whose principal plane is the C+-plane, the silicon-doped GaN layer 14 as a crystal seed layer, and the silicon-doped GaN layer 17 as a crystal layer. The silicon-doped GaN layer 17 has the slant S-plane, slanting to the principal plane of the substrate. The InGaN layer 18 (as an active layer) is parallel to the S-plane. On the InGaN layer 18 is formed the magnesium-doped GaN layer 19 as a cladding layer. The p-electrode 22 is formed on the magnesium-doped GaN layer 19. The n-electrode 20 is formed in the open region at the side portion of the hexagonal pyramid, and it is connected to the silicon-doped GaN layer 17 through the silicon-doped GaN layer 14.

The light-emitting device in this example has an advantage that, owing to the S-plane slanting to (i.e., diagonally intersecting) the principal plane of the substrate, the number of bonds from nitrogen atoms to gallium atoms increases, which increases the effective V/III ratio. Therefore, the resulting light-emitting device has improved performance. In addition, the fact that the principal plane of the substrate is the C+-plane and hence, the S-plane is different from the principal plane of the substrate tends to decrease defects and dislocations extending from the substrate bend. The slant crystal plane slanting to the principal plane of the substrate prevents multiple reflection, thereby permitting the generated light to emerge efficiently.

Example 2

This example demonstrates a semiconductor light-emitting device which has a crystal layer (having the S-plane slanting to the principal plane of the substrate) formed on a crystal seed layer isolated from a sapphire substrate. Its production process and structure will be described with reference to FIGS. 10A to 17B.

Figures 10A, 10B:
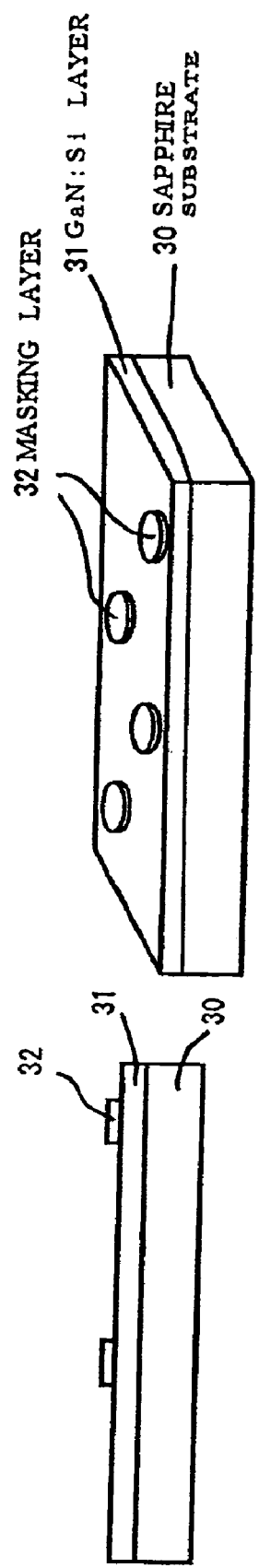
Figures 11A, 11B:
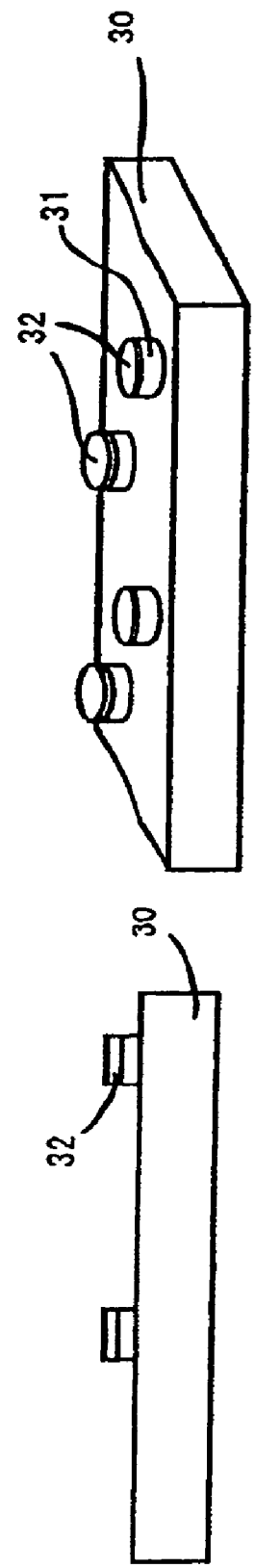

On the sapphire substrate 30, whose principal plane is the C+-plane, is formed a buffer layer of AlN or GaN at a low temperature of about 500° C. Then, with the temperature raised to about 1000° C., the silicon-doped GaN layer 31 is formed. On the entire surface of the silicon-doped GaN layer 31 is formed a masking layer (about 100 nm to about 500 nm thick) of SiO2 or SiN. The masking layer is removed by photolithography and etching with hydrofluoric acid based compound except for the round masking part 32 (about 10 μm in diameter), as shown in FIGS. 10A and 1B. Etching is performed so that the principal plane of the sapphire substrate 30 is exposed, as shown in FIGS. 11A and 11B. As a result, the cylindrical silicon-doped GaN layer 31 in conformity with the shape of the masking part 32 remains.

Then, the masking part 32 is removed and crystal growing is again carried out, that is, the silicon-doped GaN layer 33 is grown at a raised growing temperature of about 1000° C. The silicon-doped GaN layer 33 grows on the silicon-doped GaN layer 31 remaining unetched. After continued growing, the silicon-doped GaN layer 33 forms a hexagonal pyramid surrounded by the S-plane slanting to the principal plane of the substrate. This hexagonal pyramid grows in proportion to the growing time. The GaN layer 31 should be sufficiently apart from adjacent layers so that the fully grown GaN layer 33 does not interfere with adjacent layers and the completed devices are separated from each other with sufficient margins.

Figures 12A, 12B:
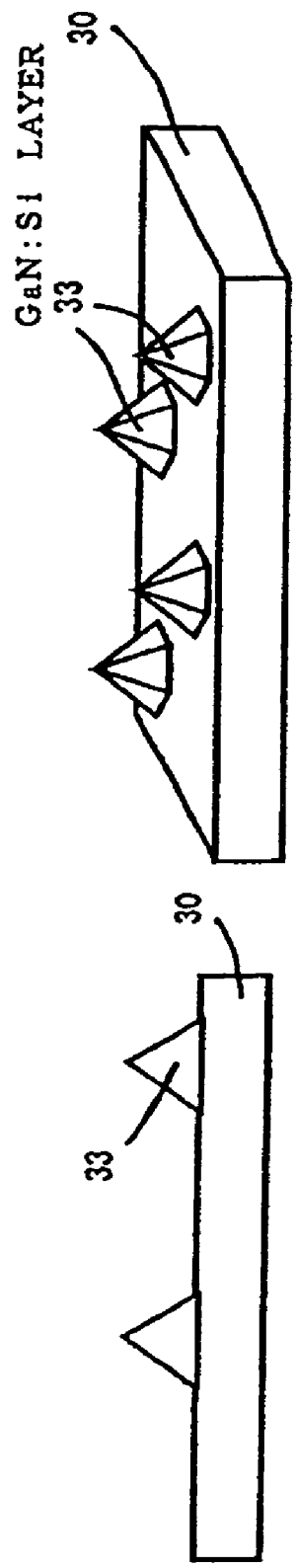

The hexagonal pyramid grows to such an extent that the width is about 15 μm to about 20 μm (with one side being about 7.5 μm to about 15 μm long) and the height is about 10 μm to about 16 μm, which is about 1.6 times the side of the hexagonal pyramid, as with Example 1. This size is merely exemplary, and the width equal to or smaller than 10 μm may be acceptable. After the hexagonal pyramid surrounded by the slant S-plane has been formed, as shown in FIGS. 12A and 12B, the silicon doped GaN layer is grown and then the InGaN layer 34 is grown at a lower growing temperature. Then, with the growing temperature raised, the magnesium-doped GaN layer 35 is grown, as shown in FIGS. 13A and 13B. The thickness of the InGaN layer 34 is about 0.5 nm to about 3 nm. There may be an instance where a quantum well layer (or a multiple quantum well layer) of (Al)GaN/InGaN is formed, or there may be another instance where a multilayer structure is formed with GaN or InGaN functioning as the guide layer. In such a case, it is desirable to grow the AlGaN layer directly on the InGaN layer.

The InGaN layer 34 (as an active layer) and the magnesium-doped GaN layer 35 (as a p-type cladding layer) are partly removed at the side close to the substrate, so that the silicon-doped GaN layer 33 is partly exposed. In the removed part, close to the substrate, the Ti/Al/Pt/Au electrode (as the n-electrode 36) is formed by vapor deposition. On the outermost surface of the hexagonal pyramid, the Ni/Pt/Au or Ni(Pd)/Pt/Au electrode (as the p-electrode 37) is formed by vapor deposition (see FIGS. 14A and 14B). These vapor depositions should be carried out accurately so as to prevent the electrodes from coming into contact with each other, thereby preventing short-circuiting, as with Example 1.

Figure 15B:
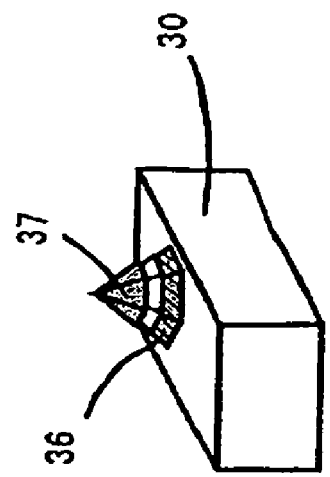
Figure 15A:
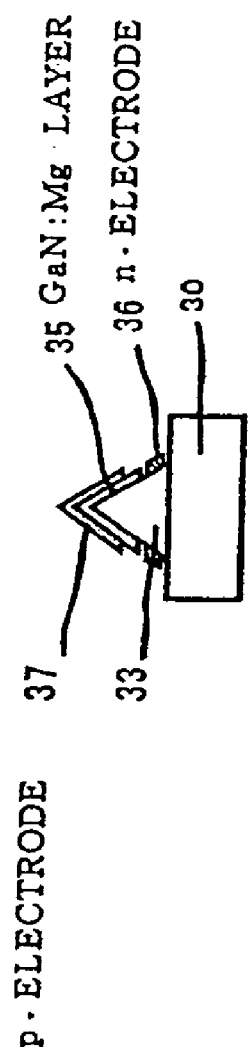

After the electrodes 36 and 37 have been formed, individual light-emitting devices are separated by RIE (reactive ion etching) or dicing, as shown in FIGS. 15A and 15B. Thus, the light-emitting device in this example is completed.

Figure 16:
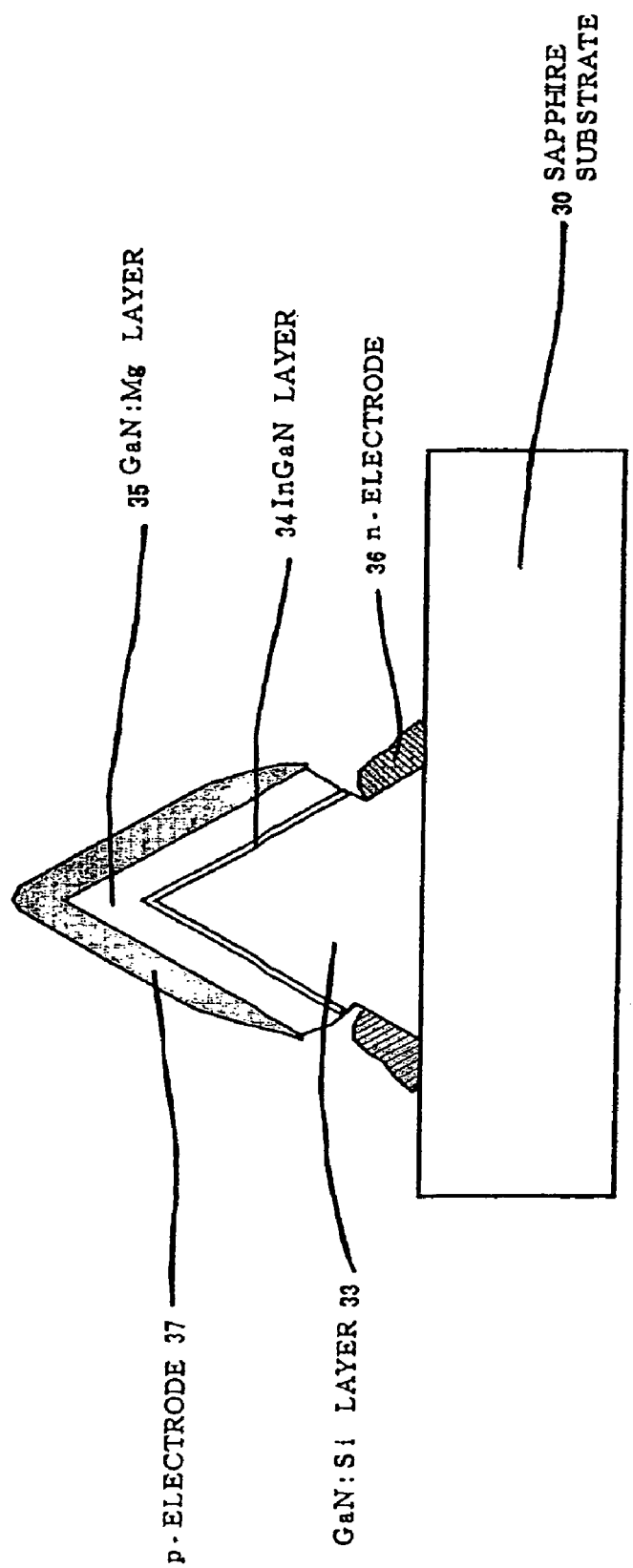
FIG. 16 is a sectional view showing the semiconductor light-emitting device in Example 2 of an embodiment of the present invention.

The light-emitting device produced by the above-mentioned process has a structure as shown in FIG. 16. It is composed mainly of the sapphire substrate 30 whose principal plane is the C+-plane and the silicon-doped GaN layer 33 as a crystal layer. The silicon-doped GaN layer 33 has the slant S-plane slanting to the principal plane of the substrate. The InGaN layer 34 (as an active layer) is parallel to the S-plane. On the InGaN layer 34 is formed the magnesium-doped GaN layer 35 as a cladding layer. The p-electrode 37 is formed on the magnesium-doped GaN layer 35. The n-electrode 36 is formed in the open region at the vicinity of the substrate on the S-plane of the hexagonal pyramid, and it is connected directly to the silicon-doped GaN layer 33.

The light-emitting device in this example (which is constructed as mentioned above) has an advantage that, like the light-emitting device in Example 1, owing to the S-plane slanting to the principal plane of the substrate, the number of bonds from nitrogen atoms to gallium atoms increases, which increases the effective V/III ratio. Therefore, the resulting light-emitting device has improved performance. In addition, the fact that the principal plane of the substrate is the C+-plane and hence, the S-plane is different from the principal plane of the substrate tends to decrease defects and dislocations extending from the substrate bend. The slant S-plane slanting to the principal plane of the substrate prevents multiple reflection, thereby permitting the generated light to emerge efficiently.

Figure 17B:
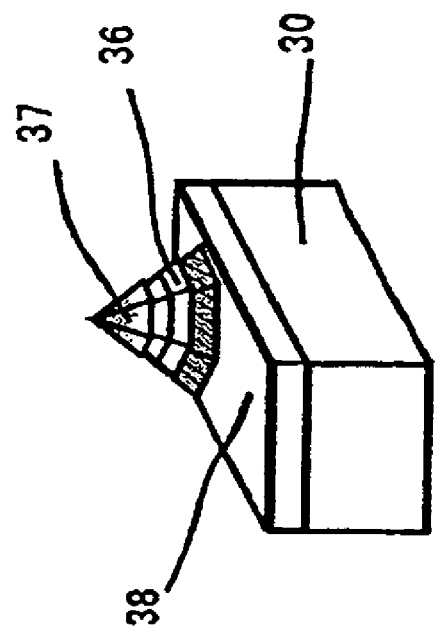
Figure 17A:
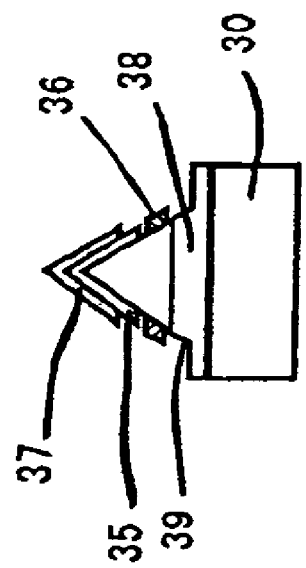

Additionally, in this example, the silicon-doped GaN layer is etched first so that the sapphire substrate 30 is exposed. However, etching may be carried out in such a way that a sufficiently high step is formed in the silicon-doped GaN layer. Growing on the thus formed silicon-doped GaN layer (as a crystal seed layer) readily gives the desired hexagonal pyramid. The device produced in this manner is shown in FIGS. 17A and 17B. The step 39 is formed in the silicon-doped GaN layer 38 formed on the sapphire substrate 30. The silicon-doped GaN layer as a crystal layer in the shape of hexagonal pyramid grows from the projection part. On the silicon-doped GaN layer are formed the InGaN layer 34 (as an active layer), the magnesiun-doped GaN layer 35 (as a p-type cladding layer), the p-electrode 37, and the n-electrode 36. Light with a desired wavelength is extracted from the InGaN layer 34.

Example 3

This example demonstrates a semiconductor light-emitting device in which the crystal layer in the shape of hexagonal pyramid (which has the S-plane slanting to the principal plane of the substrate) is formed within the window region for the selective mask. Its production process and structure will be described with reference to FIGS. 18A to 23.

Figures 18A, 18B:
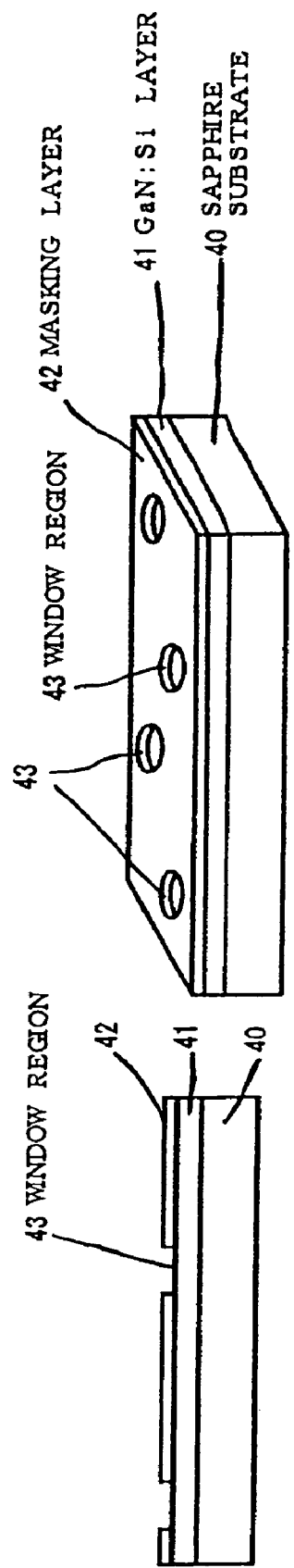
Figure 19A:
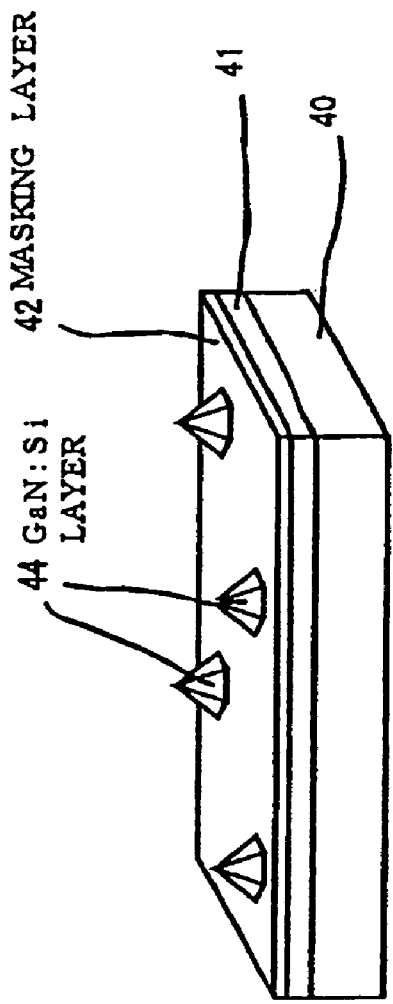
Figure 19B:
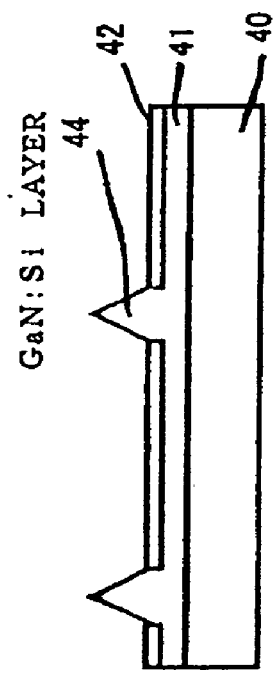
Figure 21A:
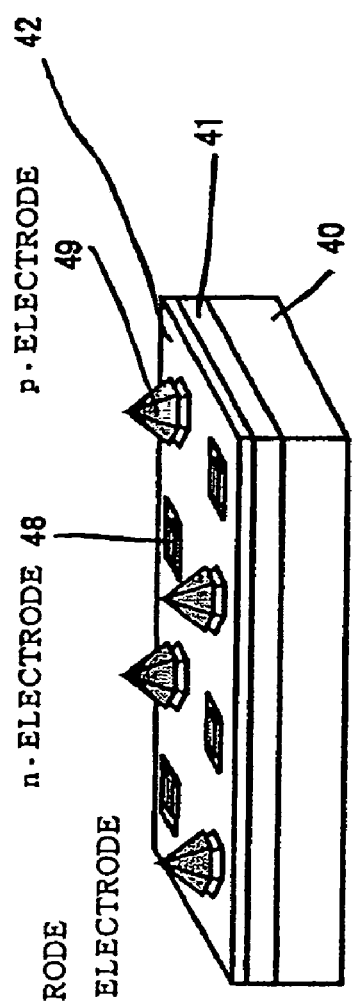
Figure 21B:
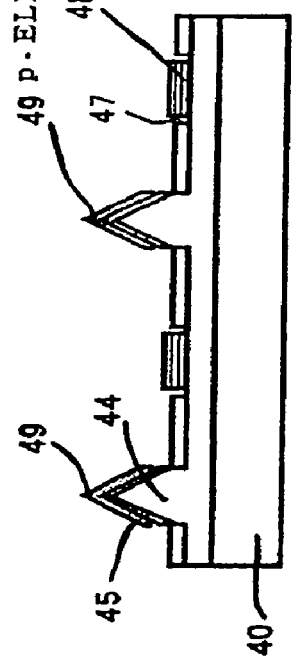

On the sapphire substrate 40, whose principal plane is the C+-plane, is formed a buffer layer of AlN or GaN at a low temperature of about 500° C. Then, with the temperature raised to about 1000° C., the silicon-doped GaN layer 41 is formed. On the entire surface of the silicon-doped GaN layer 41 is formed the masking layer 42 (about 100 μm to about 500 nm thick) of SiO2 or SiN. In the masking layer 42 is formed a round opening (about 10 μm in diameter) as the window region 43 by photolithography and etching with hydrofluoric acid based compound, as shown in FIGS. 18A and 18B. The size of the opening varies depending on the light-emitting device desired.

Then, the silicon-doped GaN layer 44 is grown again at a growing temperature of about 1000° C. In the beginning, the silicon-doped GaN layer 44 grows from the round window region 43. After growing for a while, it takes the shape of a hexagonal pyramid surrounded by S-planes or (1-101) planes. It may take the shape of a hexagonal prismoid under different growing conditions. Under adequately controlled growing conditions, the silicon-doped GaN layer 44 grows until the hexagonal pyramid (covered with S-planes) almost fills the window region in the selective mask. With the growing temperature lowered, the InGaN layer 45 (as an active layer) is grown. Then, the magnesium-doped GaN layer 46 (as a p-type cladding layer) is grown at a raised growing temperature, as shown in FIGS. 20A and 20B. The thickness of the InGaN layer 45 is about 0.5 nm to about 3 nm. As with Examples 1 and 2 (mentioned above), there may be an instance where a quantum well layer (or a multiple quantum well layer) of (Al)GaN/InGaN, functioning as the active layer, is formed, or there may be another instance where a multilayer structure is formed with GaN or InGaN functioning as the guide layer. In such a case, it is desirable to grow the AlGaN layer directly on the InGaN layer. The selective growth should preferably be carried out such that the window region 43 of the selective mask is filled with the entire crystal layer extending in the lateral direction. Thus, it is possible to produce the individual light-emitting devices in uniform sizes.

Figure 22B:
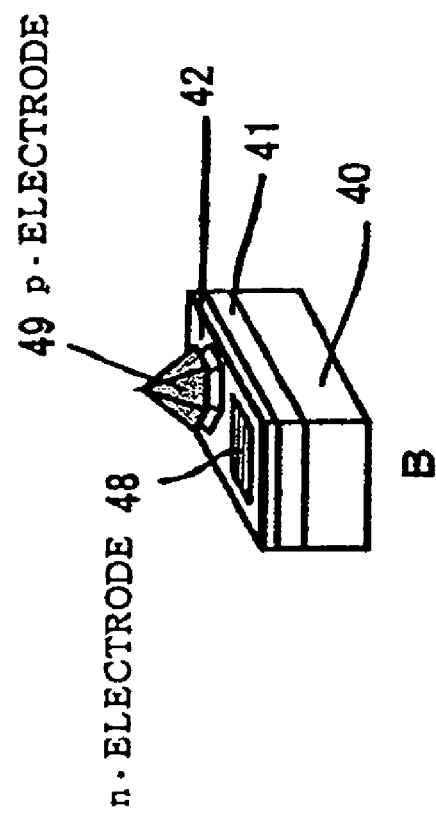
Figure 22A:
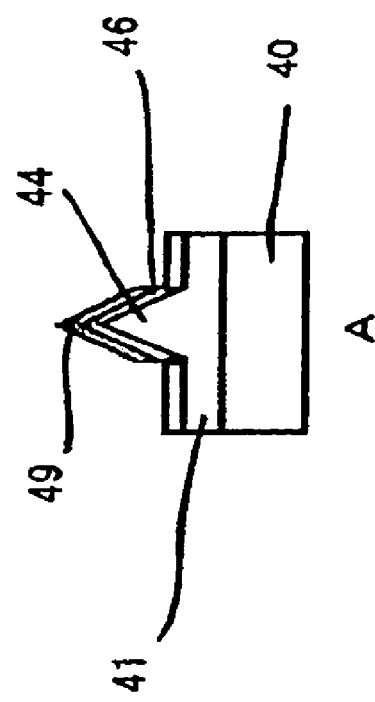

Subsequently, the masking layer is partly opened so that the GaN layer 41 is exposed. In the removed part 47, the Ti/Al/Pt/Au electrode (as the n-electrode 48) is formed by vapor deposition. On the outermost surface of the hexagonal pyramid, the Ni/Pt/Au or Ni(Pd)/Pt/Au electrode (as the p-electrode 49) is formed by vapor deposition (see FIGS. 21A and 21B). These vapor depositions should be carried out accurately. Then, individual light-emitting devices are separated by RIE (reactive ion etching) or dicing, as shown in FIGS. 22A and 22B. Thus, the light-emitting device in this example is completed.

Figure 23:
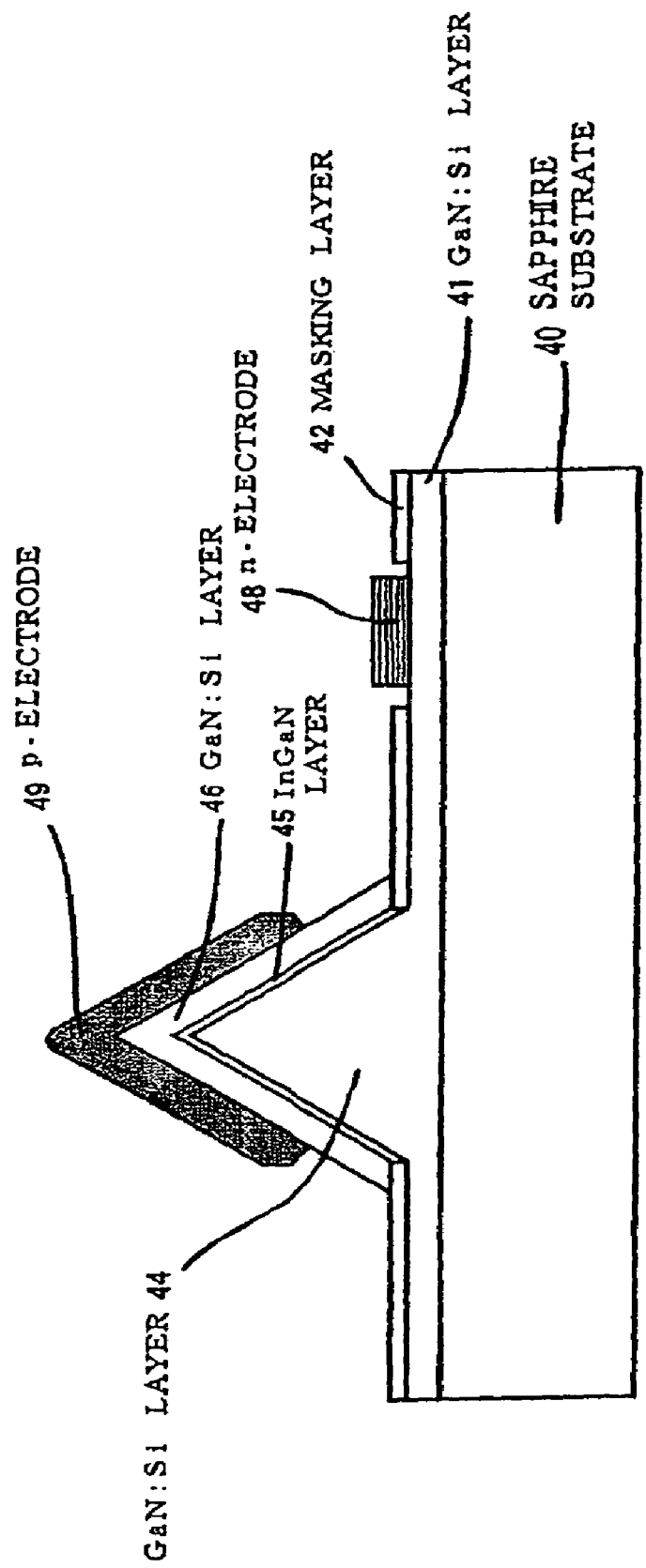
FIG. 23 is a sectional view showing the semiconductor light-emitting device in Example 3 of an embodiment of the present invention.
Figure 27A:
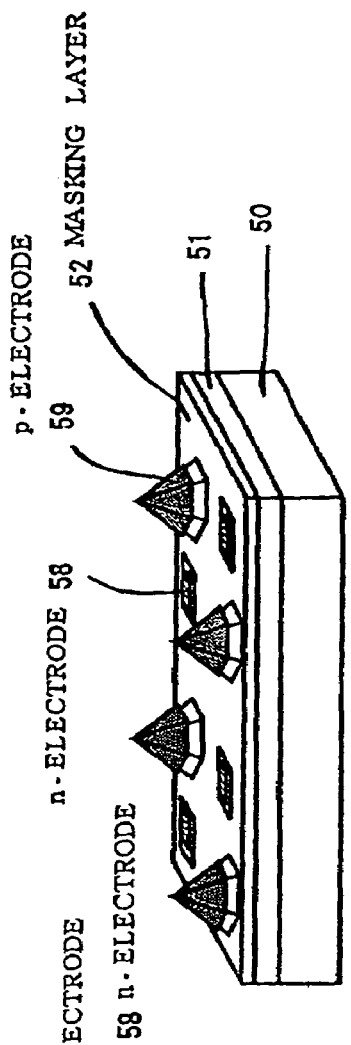
Figure 27B:
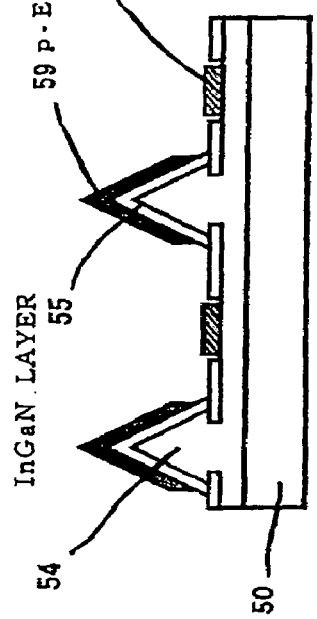

The light-emitting device produced by the above-mentioned process has a structure as shown in FIG. 23. It is composed mainly of the sapphire substrate 40 whose principal plane is the C+-plane and the silicon-doped GaN layer 44 (as a crystal layer) which has grown on the sapphire substrate 40 with the silicon-doped GaN layer 41 (as a crystal seed layer) interposed between them. The silicon-doped GaN layer 44 has a surface covered with the slant S-plane slanting to the principal plane of the substrate. The InGaN layer 45 (as an active layer) is parallel to the S-plane. On the InGaN layer 45 is formed the magnesium-doped GaN layer 46 as a cladding layer. The p-electrode 49 is formed on the magnesium-doped GaN layer 46. The n-electrode 48 is formed in the open region 47 at the vicinity of the hexagonal pyramid, and it is connected to the silicon-doped GaN layer 44 through the silicon-doped GaN layer 41.

As with Examples 1 and 2 (mentioned above), the light-emitting device in this example (which is constructed as mentioned above) has an advantage that, owing to the S-plane slanting to the principal plane of the substrate, the number of bonds from nitrogen atoms to gallium atoms increases, which increases the effective V/III ratio. Therefore, the resulting light-emitting device has improved performance. In addition, the fact that the principal plane of the substrate is the C+-plane and hence, the S-plane is different from the principal plane of the substrate tends to decrease defects and dislocations extending from the substrate bend. Moreover, in this example, the selective growth is limited in the window region 43 and hence, it is easy to uniformly control the size of the individual devices. The slant crystal plane slanting to the principal plane of the substrate prevents multiple reflection, thereby permitting the generated light to emerge efficiently.

Example 4

This example demonstrates a semiconductor light-emitting device in which the crystal layer is grown in the shape of a hexagonal pyramid larger than the window region or the selective mask. Its production process and structure will be described with reference to FIGS. 24A to 29.

On the sapphire substrate 50, whose principal plane is the C+-plane, is formed a low-temperature buffer layer in a manner similar to the examples mentioned above. Then, with the temperature raised to about 1000° C., the silicon-doped GaN layer 51 is formed as the first growing layer. On the entire surface of the silicon-doped GaN layer 51 is formed the masking layer 52 (about 100 nm to about 500 nm thick) of SiO2 or SiN. In the masking layer 52 is formed a round opening (about 10 μm in diameter) as the window region 53 by photolithography and etching with hydrofluoric acid based compound, as shown in FIGS. 24A and 24B. The direction of one side is perpendicular to (1-100). The size of the opening varies depending on the light-emitting device desired.

Then, the silicon-doped GaN layer 54 is grown again at a growing temperature of about 1000° C. In the beginning, the silicon-doped GaN layer 54 grows from the round window region 53. After growing for a while, it takes the shape of a hexagonal pyramid surrounded by S-planes or (1-101) planes. It may take the shape of a hexagonal prismoid if growing time is insufficient. After the silicon-doped GaN layer 54 has grown in the shape of a hexagonal pyramid, growing is continued for until the hexagonal pyramid becomes about 20 μm wide (with one side being about 10 μm long). The height of the hexagonal pyramid is about 1.6 times the side of the hexagonal pyramid. The resulting silicon-doped GaN layer 54 is such that the base of the hexagonal pyramid extends beyond the window region 53 by about 16 μm, as shown in FIGS. 25A and 25B. The width of about 20 μm of the hexagonal pyramid is merely exemplary, and the width of about 10 μm may be acceptable.

The silicon-doped GaN layer is grown further. With the growing temperature lowered, the InGaN layer 55 (as an active layer) is grown. Then, the magnesium-doped GaN layer 56 (as a p-type cladding layer) is grown at a raised growing temperature, as shown in FIGS. 26A and 26B. The thickness of the InGaN layer 55 is about 0.5 nm to about 3 nm. There may be an instance where the active layer is a quantum well layer (or a multiple quantum well layer) of (Al)GaN/InGaN, or there may be another instance where a multilayer structure is formed with GaN or InGaN functioning as the guide layer. In such a case, it is desirable to grow the AlGaN layer directly on the InGaN layer. In this stage the InGaN layer 15 and the magnesium-doped GaN layer 56 extend over the masking layer 52 surrounding the window region 53, thereby entirely covering the silicon-doped GaN layer 54 as the second grown layer. Thus, the InGaN layer 55 (as an active layer) and the magnesium-doped GaN layer 56 have no open ends (i.e., the ends are in direct contact with the masking layer 52). This prevents the active layer from oxidizing and deteriorating.

Figure 28B:
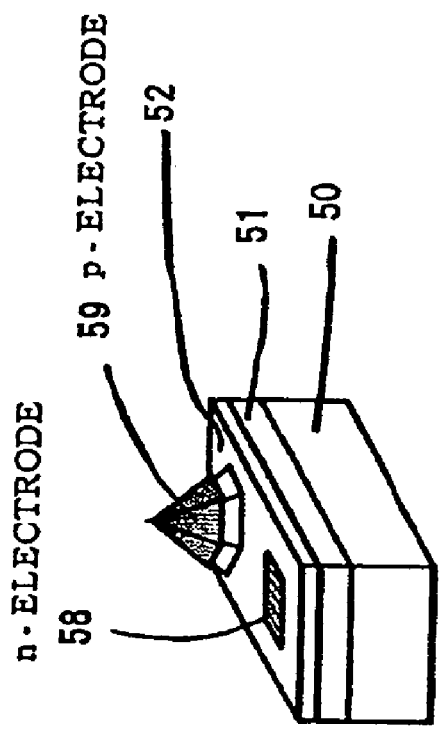
Figure 28A:
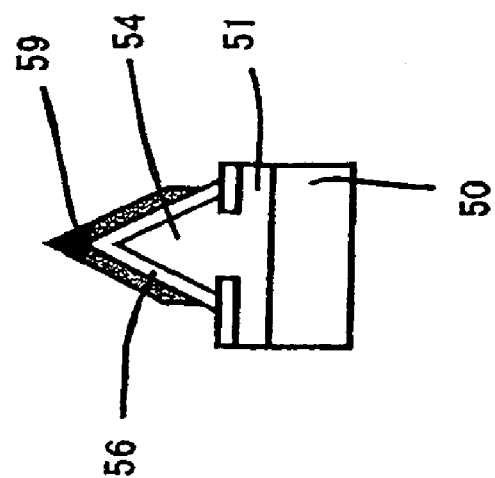
Figure 30A:
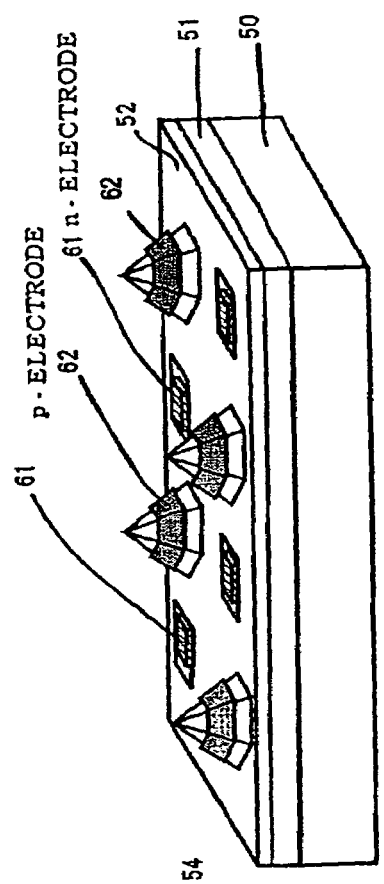
Figure 30B:
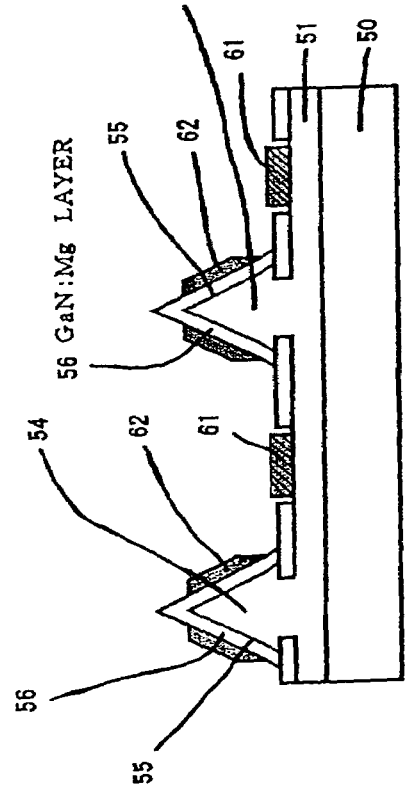

Subsequently, the masking layer is partly opened so that the GaN layer 51 is exposed. In the removed part 57, the Ti/Al/Pt/Au electrode (as the n-electrode 58) is formed by vapor deposition. On the outermost surface of the hexagonal pyramid, the Ni/Pt/Au or Ni(Pd)/Pt/Au electrode (as the p-electrode 59) is formed by vapor deposition (see FIGS. 27A and 27B). These vapor depositions should be carried out accurately. Then, individual light-emitting devices are separated by RIE (reactive ion etching) or dicing, as shown in FIGS. 28A and 28B. Thus, the light-emitting device in this example is completed.

The light-emitting device produced by the above-mentioned process has a structure as shown in FIG. 29. It is composed mainly of the sapphire substrate 50 whose principal plane is the C+-plane and the silicon-doped GaN layer 54 (as the second grown layer) which has grown on the sapphire substrate 50 with the silicon-doped GaN layer 51 (as a crystal seed layer) interposed between them. The silicon-doped GaN layer 54 has a surface covered with the slant S-plane slanting to the principal plane of the substrate. It also has a base whose area is larger than the window region 53.

This device has the InGaN layer 55 (as an active layer) which is parallel to the S-plane. On the InGaN layer 55 is formed the magnesium-doped GaN layer 56 as a cladding layer. The p-electrode 59 is formed on the magnesium-doped GaN layer 56. The n-electrode 58 is formed in the open region 57 at the vicinity of the hexagonal pyramid, and it is connected to the silicon-doped GaN layer 54 through the silicon-doped GaN layer 51.

The semiconductor light-emitting device in this example, which is constructed as mentioned above, is characterized by the silicon-doped GaN layer 54, the InGaN layer 55, and the magnesium-doped GaN layer 56 which extend entirely or partly onto the masking layer 52 surrounding the window region 53. An advantage of this structure (with the mask remaining unremoved) is that the laterally grown part is held by a support which does not disappear. Moreover, the masking layer 52 remaining unremoved relieves steps due to the selectively grown structure and also functions as a supporting layer for the first grown layer 51 even when the substrate is stripped off by laser irradiation. This helps separate the n-electrode 58 and p-electrode 59 with certainty, thereby preventing short-circuiting.

The structure of this device is characterized by the silicon-doped GaN layer 54 which is entirely covered by the InGaN layer 55 and the magnesium-doped GaN layer 56, so that the ends of the layers 55 and 56 come into direct contact with the masking layer. In other words, they cover the active layer, with their ends being in direct contact with the masking layer 52. This produces the effect of protecting the active layer from oxidation and other deterioration while increasing the light emission area.

The light-emitting device in this example has an advantage that, owing to the S-plane slanting to the principal plane of the substrate, the number of bonds from nitrogen atoms to gallium atoms increases, which increases the effective V/III ratio. Therefore, the resulting light-emitting device has improved performance. In addition, the fact that the principal plane of the substrate is the C+-plane and hence, the S-plane is different from the principal plane of the substrate tends to decrease defects and dislocations extending from the substrate bend. The slant crystal plane slanting to the principal plane of the substrate prevents multiple reflection, thereby permitting the generated light to emerge efficiently. The active layer with a large area permits current to be injected uniformly without current concentration and also permits the current density to be reduced.

Example 5

This example demonstrates a semiconductor light-emitting device in which the p-electrode is not formed on the apex of a hexagonal pyramid of the crystal layer with S-planes which has grown larger than the selective mask. Its production process and structure will be described with reference to FIGS. 30A to 32.

On the sapphire substrate 50, whose principal plane is the C+-plane, is formed a low-temperature buffer layer in a manner similar to the examples mentioned above, especially Example 4. Then, with the temperature raised to about 1000° C., the silicon-doped GaN layer 51 is formed as the first growing layer. On the entire surface of the silicon-doped GaN layer 51 is formed the masking layer 52 (about 100 nm to about 500 nm thick) of SiO2 or SiN. In the masking layer 52 is formed a round opening (about 10 μm in diameter) as the window region by photolithography and etching with hydrofluoric acid based compound. The size of the opening varies depending on the light-emitting device desired.

Then, the silicon-doped GaN layer 54 is grown again at a growing temperature of about 1000° C. In the beginning, the silicon-doped GaN layer 54 grows from the round window region 53. After growing for a while, it takes the shape of a hexagonal pyramid surrounded by S-planes or (1-101) planes. It may take the shape of a hexagonal prismoid if growing time is insufficient. After the silicon-doped GaN layer 54 has grown in the shape of a hexagonal pyramid, growing is continued until the hexagonal pyramid becomes about 20 μm wide (with one side being about 10 μm long). The height of the hexagonal pyramid is about 1.6 times the side of the hexagonal pyramid. The resulting silicon-doped GaN layer 54 is such that the base of the hexagonal pyramid extends beyond the window region 53 by about 16 μm. The width of about 20 μm of the hexagonal pyramid is merely exemplary, and the width of about 10 μm may be acceptable.

Silicon-doped GaN is grown further. With the growing temperature lowered, the InGaN layer 55 (as an active layer) is grown. Then, the magnesium-doped GaN layer 56 (as a p-type cladding layer) is grown at a raised growing temperature. The InGaN layer 55 and the magnesium-doped GaN layer 56 are identical with those in Example 4. In this stage, the InGaN layer 55 and the magnesium-doped GaN layer 56 extend over the masking layer 52 surrounding the window region 53, thereby entirely covering the silicon-doped GaN layer 54 as the second growing layer. Growing in this manner prevents the InGaN layer 55 (as an active layer) and the magnesium-doped GaN layer 56 from forming open ends, thereby preventing the active layer from deteriorating.

Figure 31B:
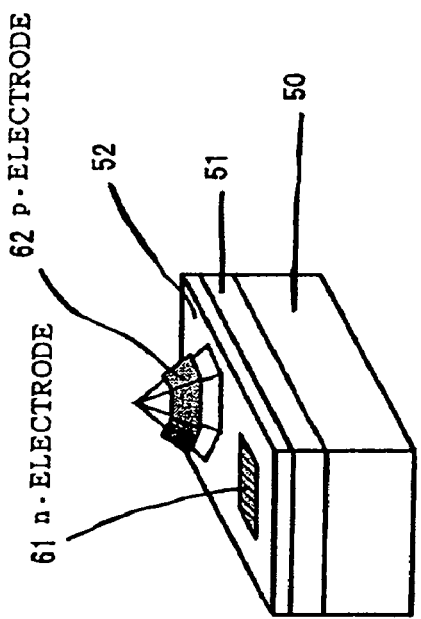
Figure 31A:
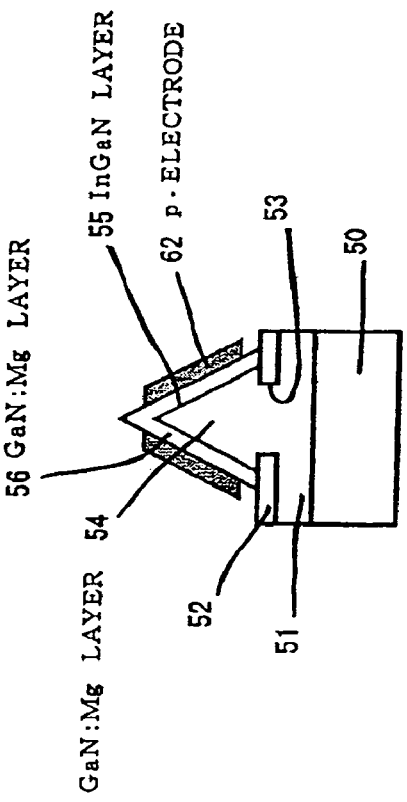
Figure 34B:
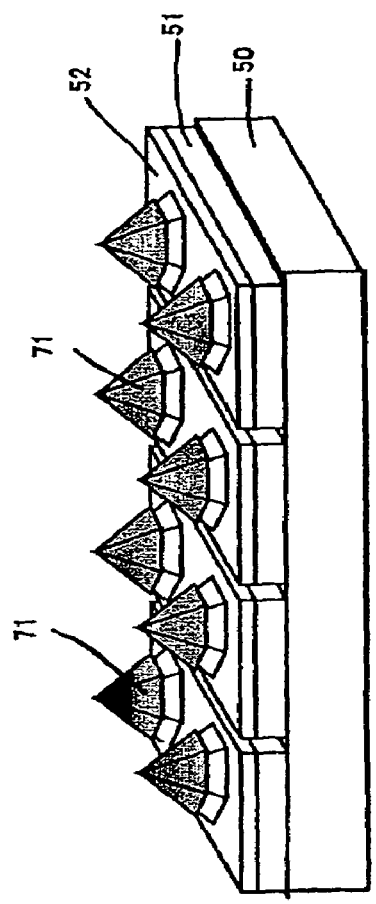
Figure 34A:
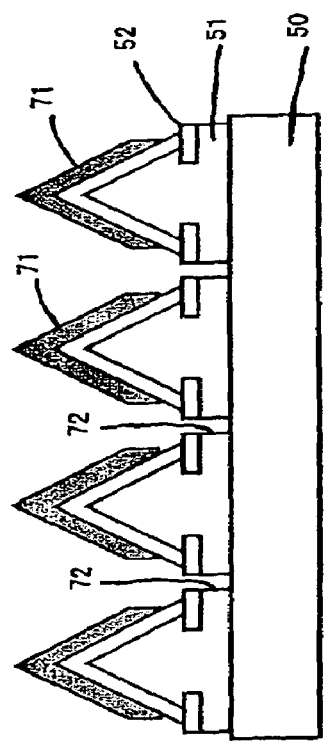

Subsequently, the masking layer is partly opened so that the GaN layer 51 on the substrate 50 is exposed. In the removed part, the Ti/Al/Pt/Au electrode (as the n-electrode 61) is formed by vapor deposition. On the outermost surface layer of the S-plane which has grown on the hexagonal pyramid, the Ni/Pt/Au or Ni(Pd)/Pt/Au electrode (as the p-electrode 62) is formed by vapor deposition (see FIGS. 30A and 30B). The part at which the p-electrode 62 is formed is one which has sufficient steps found by observation with an AFM. In general, steps found by an AFM indicate that the crystal properties are comparatively poor in the vicinity of the apex of the hexagonal pyramid. This is the reason why the p-electrode 62 is formed on the part excluding the apex and its vicinity. Vapor deposition to form the p-electrode 62 and n-electrode 61 should be carried out accurately so as to prevent them from coming into contact with the silicon-doped GaN layer 54 (as a crystal layer) and the silicon-doped GaN layer 51 (formed under the masking layer), thereby preventing short-circuiting. Then, individual light-emitting devices are separated by RIE (reactive ion etching) or dicing (FIGS. 31A and 31B). Thus, the light-emitting device in this example is completed. A sectional view of the device is shown in FIG. 32.

The light-emitting device constructed as mentioned above is characterized by the silicon-doped GaN layer 54, the InGaN layer 55, and the magnesium-doped GaN layer 56 which entirely or partly extend over the masking layer 52 surrounding the window region 53. An advantage of this structure (with the mask remaining unremoved) is that the laterally grown part is held by a support which does not disappear. Moreover, the masking layer 52 remaining unremoved relieves steps due to the selectively grown structure and also separates the n-electrode 61 and p-electrode 62 with certainty, thereby preventing short-circuiting.

The structure of this device is also characterized by the silicon-doped GaN layer 54 which is entirely covered by the InGaN layer 55 and the magnesium-doped GaN layer 56, so that the ends of the layers 55 and 56 come into direct contact with the masking layer. In other words, they cover the active layer, with their ends being in direct contact with the masking layer 52. This produces the effect of protecting the active layer from oxidation and other deterioration while increasing the light emission area.

Another advantage is that current injection into the active layer takes place such that the current density is lower in the vicinity of the apex than in the surrounding side faces, and that the part in which crystal properties are poor is excluded from the light-generating region so as to improve the overall emission efficiency.

Example 6

This example demonstrates a semiconductor light-emitting device which has the n-electrode formed on the reverse side of the substrate. Its production process and structure will be described with reference to FIGS. 33A to 39B.

On the sapphire substrate 50, whose principal plane is the C+-plane, a low-temperature buffer layer is formed in a manner similar to the examples mentioned above. Then, with the temperature raised to about 1000° C., the silicon-doped GaN layer 51 is formed as the first growing layer. On the entire surface of the silicon-doped GaN layer 51 the masking layer 52 (about 100 nm to about 500 nm thick) of SiO2 or SiN is formed. In the masking layer 52 a round opening (about 10 μm in diameter) is formed as the window region by photolithography and etching with hydrofluoric acid based compound. The direction of one side is perpendicular to (1-100). The size of the opening varies depending on the light-emitting device desired.

Then, the silicon-doped GaN layer 54 is grown again at a growing temperature of about 1000° C. In the beginning, the silicon-doped GaN layer 54 grows from the round opening. After growing for a while, it takes the shape of a hexagonal pyramid surrounded by S-planes or (1-101) planes. It may take the shape of a hexagonal prismoid if growing time is insufficient. After the silicon-doped GaN layer 54 has grown in the shape of a hexagonal pyramid, growing is continued until the base of the hexagonal pyramid extends about 16 μm beyond the window region.

The silicon-doped GaN layer is grown further. With the growing temperature lowered, the InGaN layer 55 (as an active layer) is grown. Then, the magnesium-doped GaN layer 56 (as a p-type cladding layer) is grown at a raised growing temperature. The InGaN layer 55 and the magnesium-doped GaN layer 56 are identical to those described in Example 4. In this stage, the InGaN layer 55 and the magnesium-doped GaN layer 56 extend over the masking layer 52 surrounding the window region, thereby entirely covering the silicon-doped GaN layer 54 as the second growing layer. Growing the layers in this manner prevents the InGaN layer 55 (as an active layer) and the magnesium-doped GaN layer 56 from forming open ends, thereby preventing the active layer from deteriorating.

Figure 35B:
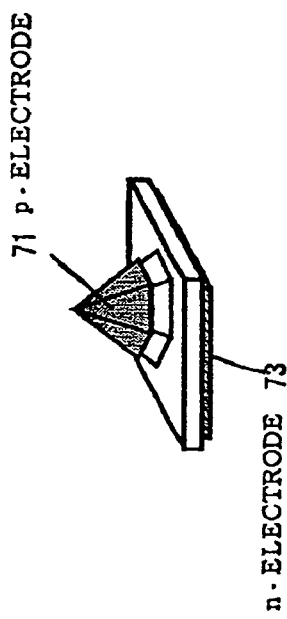
Figure 35A:
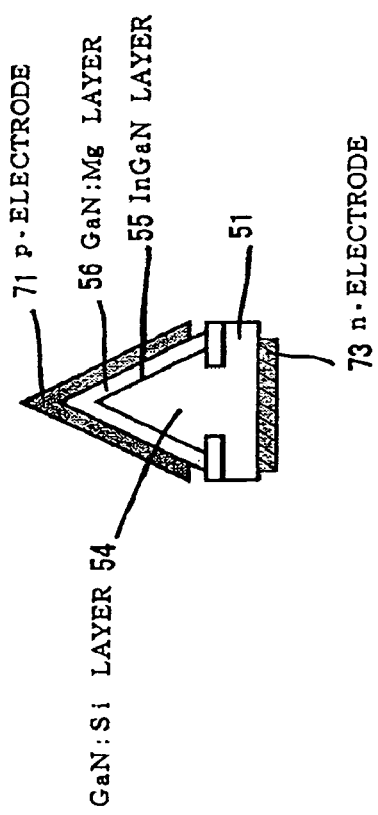

As shown in FIGS. 33A and 33B, the p-electrode 71 is formed on the outermost S-plane of the magnesium-doped GaN layer 56 before forming of an n-electrode. The separating grooves 72 reaching the principal plane of the sapphire substrate 50 are formed by RIE or dicing. Individual devices are separated from one another on the sapphire substrate 50 (see FIGS. 34A and 34B). The part constituting the device is separated from the sapphire substrate 50 by excimer laser. Residual Ga, for example, is removed by etching. On the reverse side of the device, the Ti/Al/Pt/Au electrode is formed by vapor deposition. This electrode functions as the n-electrode 73, as shown in FIGS. 35A and 35B.

Figure 36A:
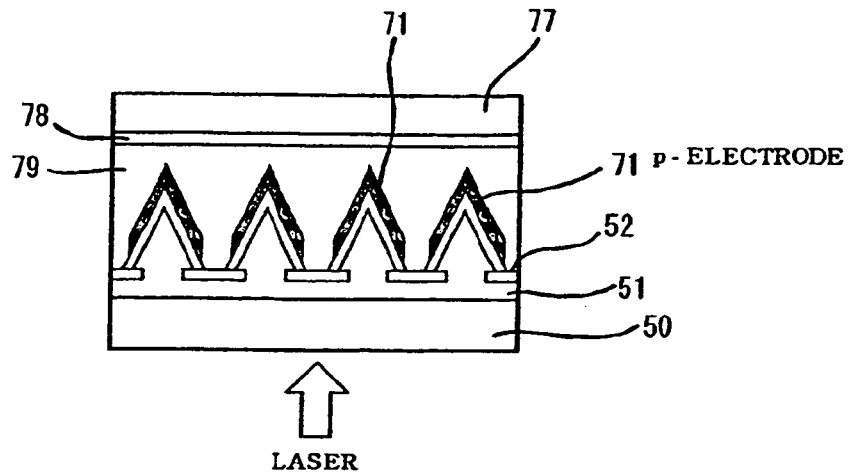
Figure 36B:
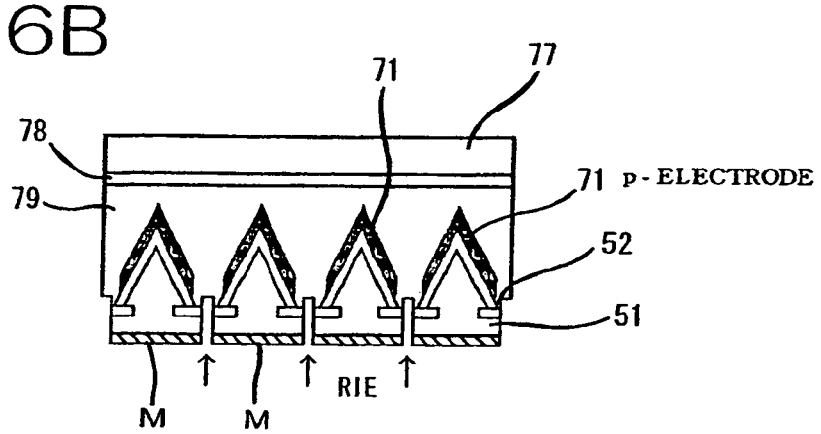
Figure 36C:
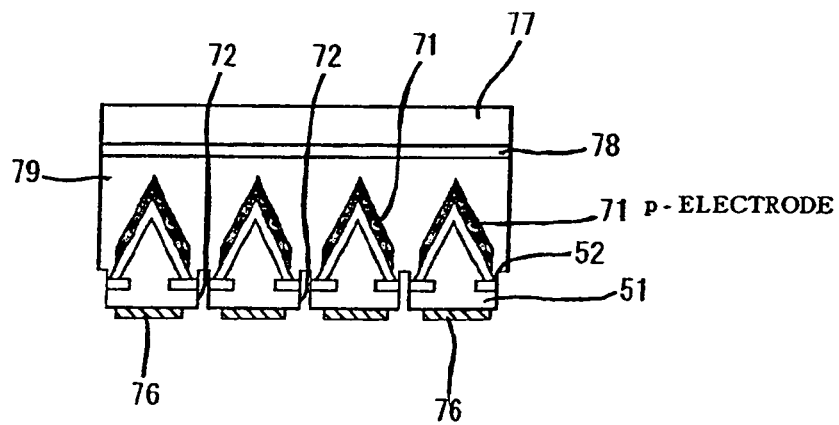

FIGS. 36A–36C show another method of forming the n-electrode on the reverse side. This method employs a second sapphire substrate 77, which is coated with an adhesive layer 78 and a resin layer 79. The devices shown in FIGS. 33A and 33B are embedded in the resin layer 79. Subsequently, the sapphire substrate 50 is removed by laser abrasion, as shown in FIG. 36A. An excimer laser (with a wavelength of about 248 nm) may be used for this purpose.

Residual Ga remaining on the surface is removed. On the surface from which the sapphire substrate 50 has been removed is formed the mask M (such as a Ni mask), as shown in FIG. 36B. Individual devices are separated from one another by RIE with a chlorine based gas or the like. The mask M is removed, and the electrode 76 of Ti/Pt/Au or Ti/Au is formed on the reverse side of the device.

Figure 37:
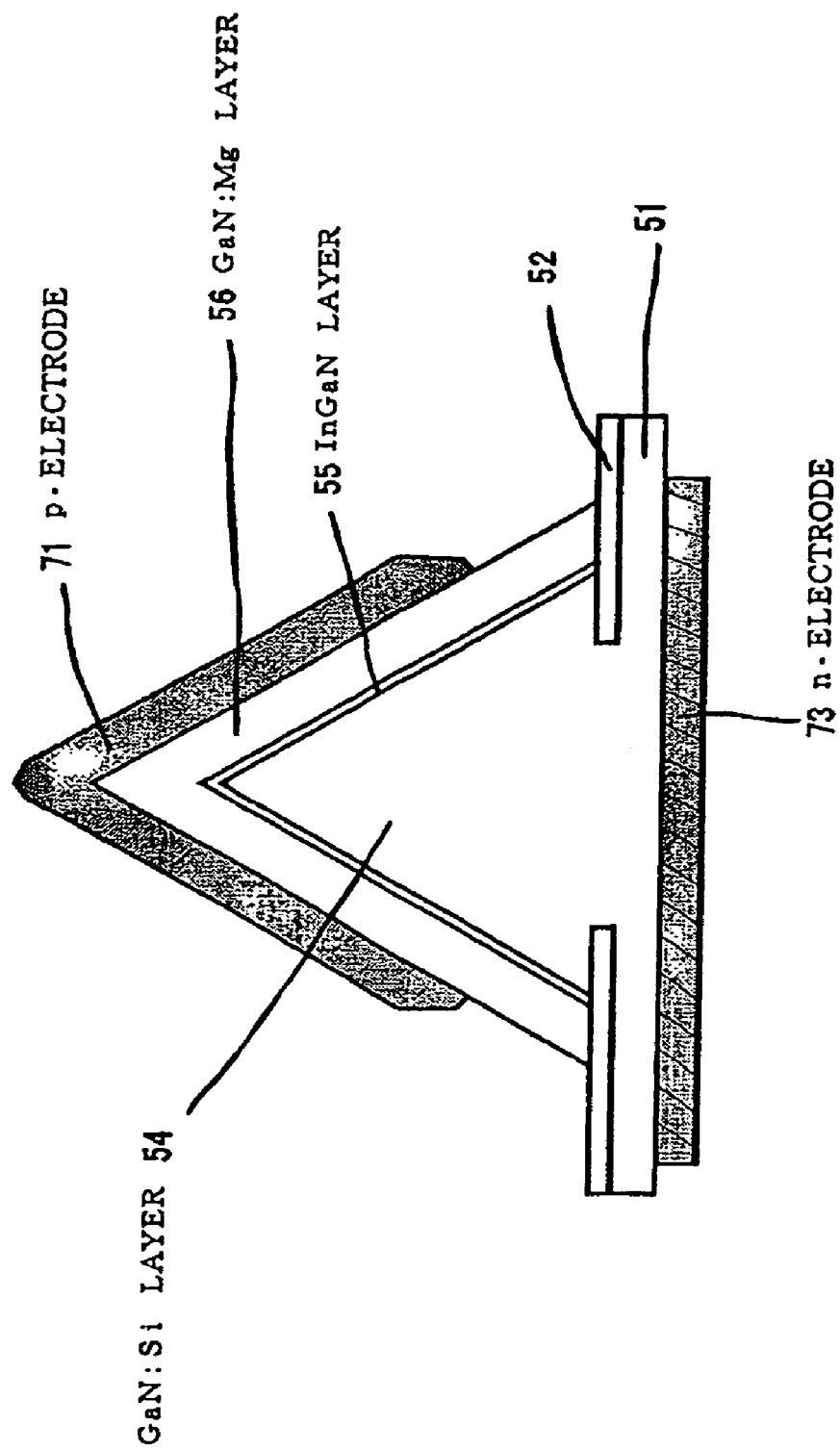
FIG. 37 is a sectional view showing the semiconductor light-emitting device in Example 6 of an embodiment of the present invention.
Figure 38:
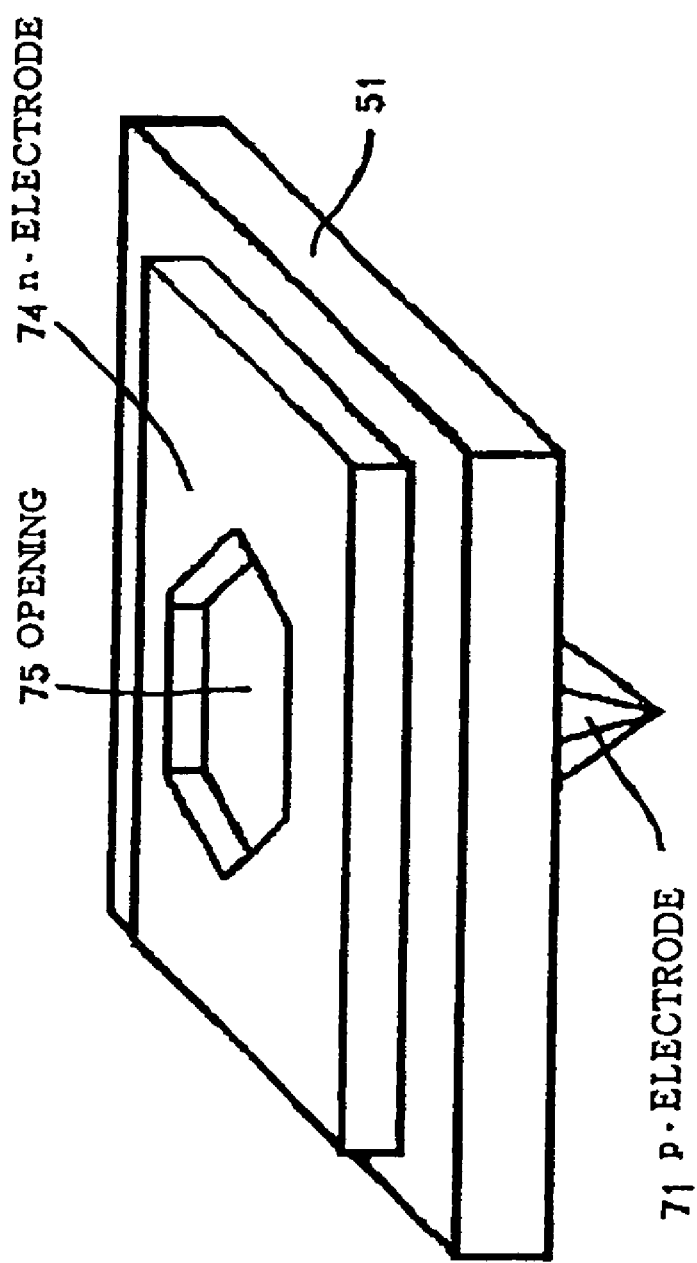
FIG. 38 is a rear perspective view showing another structure of the semiconductor light-emitting device in Example 6 of an embodiment of the present invention.

FIG. 37 is a sectional view showing the completed semiconductor light-emitting device. The n-electrode 73 should be arranged near the corners so that it does not interrupt light. FIG. 38 shows the reverse side of the completed semiconductor light-emitting device. It should be noted that the n-electrode 74 has the hexagonal opening 75 which coincides with the hexagonal base of the silicon-doped GaN layer 54 as the second growing layer, thereby permitting generated light to be extracted efficiently.

Figure 39A:
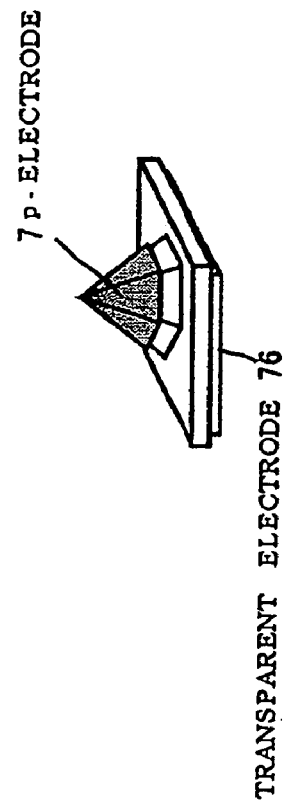
Figure 39B:
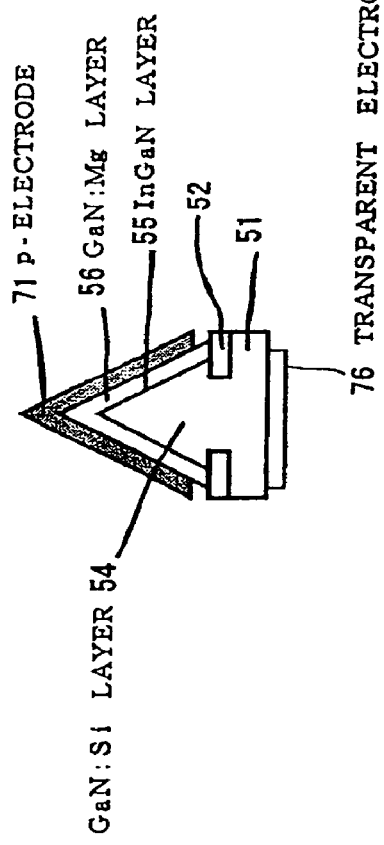

This example may be modified such that the n-electrode is a transparent electrode. FIGS. 39A and 39B show a light-emitting device in which the region corresponding to the device is removed from the substrate by using excimer laser, for example, and the transparent electrode 76 is formed on the reverse side of the device. Additionally, the device has the same structure as shown in FIG. 37. Thus, the masking layer 52 remaining on the silicon-doped GaN layer 51 has the window region from which the hexagonal pyramid grows, which is composed of the silicon-doped GaN layer 54, the InGaN layer 55, and the magnesium-doped GaN layer 56, with the p-electrode 71 formed on the outermost layer. The transparent electrode 76 is formed from ITO (indium tin oxide) by lift-off technique on the reverse side of the silicon-doped GaN layer 51 from which the substrate has been stripped off. Lift-off technique involves, for example, peeling away the unwanted metal and leaving behind metal traces where desired.

Figure 40:
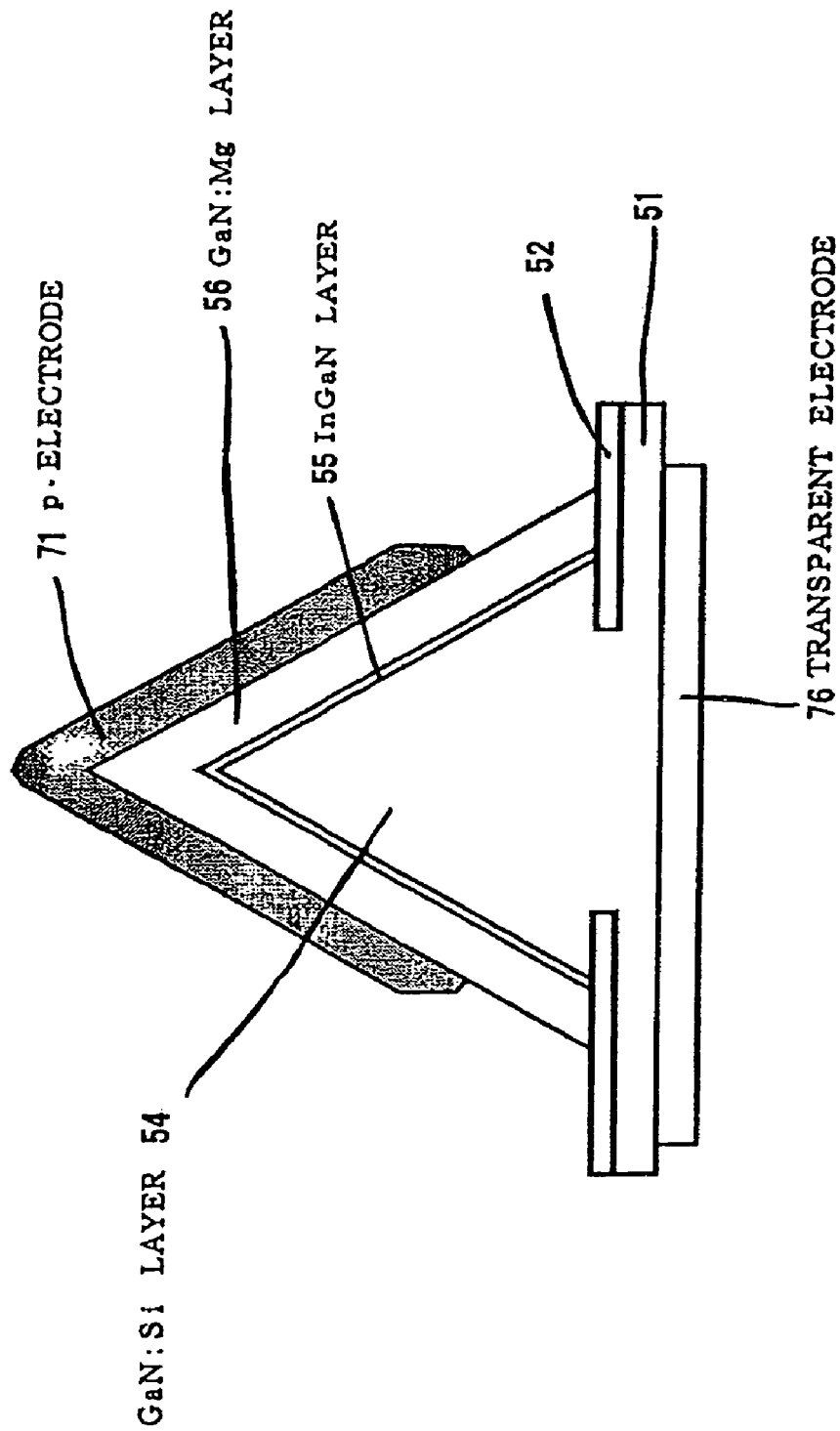
FIG. 40 is a sectional view showing the modified semiconductor light-emitting device in Example 6 of an embodiment of the present invention.

FIG. 40 is a sectional view showing the completed semiconductor light-emitting device having the transparent electrode 76. The transparent electrode 76 transmits light generated by the InGaN layer 55 (as an active layer) which is held between the silicon-doped GaN layer 54 and the magnesium-doped GaN layer 56. An advantage of this structure (with the masking layer 52 remaining) is that the laterally grown part is held by a support which does not disappear. Moreover, the masking layer 52 relieves steps due to the selectively grown structure and also keeps the p-electrode 71 and the transparent electrode 76 apart, thereby preventing short-circuiting, even when the substrate is stripped off by laser irradiation, for example. In addition, the fact that light generated by the active layer emerges through the transparent electrode 76 makes it unnecessary for the optical path to circumvent the electrode. Thus, another advantage is easy production and improved light emergence efficiency (i.e., the structure that permits light to emerge from the reverse side of the silicon-doped GaN layer 51 also permits light to emerge, which has been reflected by the slant crystal planes). Since the p-electrode 71 is arranged near the apex of the hexagonal pyramid, it is possible to form the transparent electrode 76 over a comparatively large area on the reverse side of the silicon-doped GaN layer 51, thereby reducing the contact resistance of the transparent electrode 76 and obviating the necessity of fabricating the masking layer for the n-electrode lead. Therefore, the device in this example can be produced easily.

Example 7

This example demonstrates a semiconductor light-emitting device which is produced by selective growth from an elongated window region. Its production process and structure is described with reference to FIGS. 41 to 44.

Figure 41:
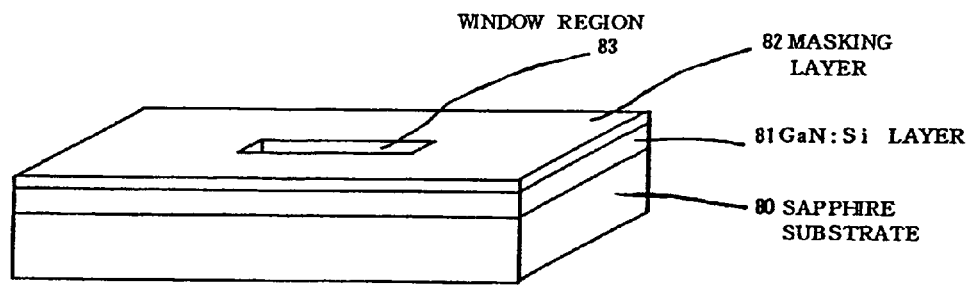
FIG. 41 is a perspective view showing the step of forming a mask in the production of the semiconductor light-emitting device in Example 7 of an embodiment of the present invention.
Figure 42:
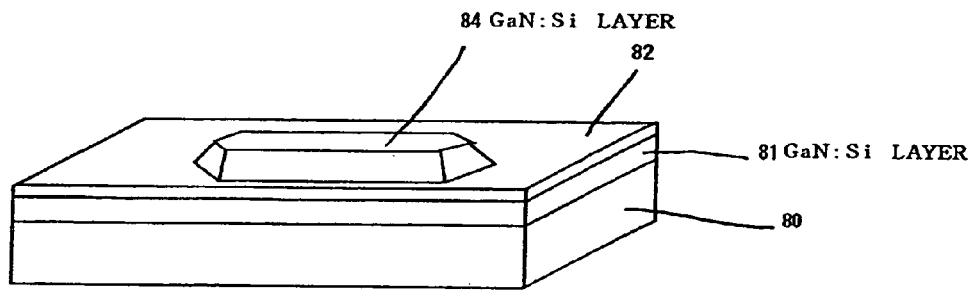
FIG. 42 is a perspective view showing the step of forming an active layer in the production of the semiconductor light-emitting device in Example 7 of an embodiment of the present invention.

First, on the sapphire substrate 80, whose principal plane is the C+-plane, a buffer layer of AlN or GaN is formed at a low temperature of about 500° C., as shown in FIG. 41. Then, with the temperature raised to about 1000° C., the silicon-doped GaN layer 81 is formed. On the entire surface of the silicon GaN layer 81 the masking layer 82 (about 100 nm to about 500 nm thick) is formed of SiO2 or SiN. In the masking layer 82, the window region 83 (i.e., a rectangular opening measuring about 10 µm×about 50 µm) is formed by photolithography and etching with hydrofluoric acid based compound. The long side of the opening aligns with the (1-100) direction. Then, with the temperature raised to about 1000° C., crystal growing is carried out once again to form the silicon-doped GaN layer 84. The silicon-doped GaN layer 84 grows in the window region 83 in the masking layer, but it takes a hexagonal shape similar to a ship's bottom after continued growing, as shown in FIG. 42. The surface of the hexagonal structure is covered with the S-plane.

When the top C-plane has become almost flat or has disappeared after the lapse of sufficient time, the silicon-doped GaN layer is grown further. With the growing temperature lowered, the InGaN layer 85 (as an active layer) is grown. Then, with the growing temperature raised again, the magnesium-doped GaN layer 86 (as a p-type cladding layer) is grown. The thickness of the InGaN layer 85 is about 0.5 nm to about 3 nm. As in Examples 1 and 2 (mentioned above), there may be an instance where a quantum well layer (or a multiple quantum well layer) of (Al)GaN/InGaN, functioning as the active layer, is formed, or there may be another instance where a multilayer structure is formed with GaN or InGaN finctioning as the guide layer. In such a case, it is desirable to grow the AlGaN layer directly on the InGaN layer.

Figure 43:
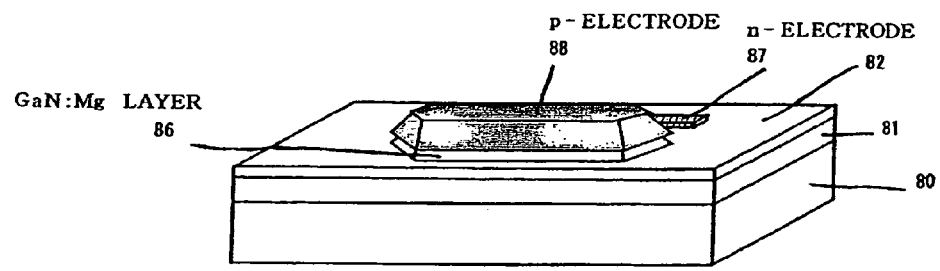
FIG. 43 is a perspective view showing the step of forming an electrode in the production of the modified semiconductor light-emitting device in Example 7 of an embodiment of the present invention.

Subsequently, the masking layer is partly opened so that the GaN layer 81 is exposed. In the removed part, the n-electrode 87 of Ti/Al/Pt/Au is formed by vapor deposition. On the outermost surface of the previously grown layers, the p-electrode 88 of Ni/Pt/Au or Ni(Pd)/Pt/Au by vapor deposition (FIG. 43). These vapor depositions should be carried out accurately. Subsequently, individual light-emitting devices are separated by RIE (reactive ion etching) or dicing. Thus, the light-emitting device in this example is completed.

Figure 44:
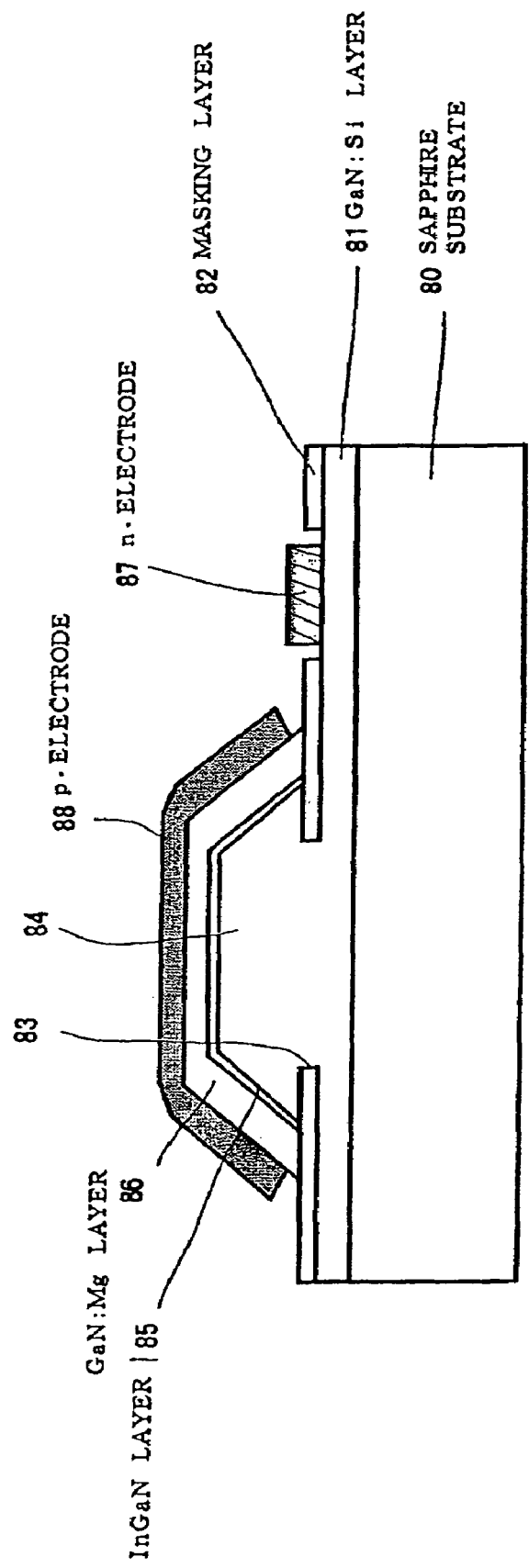
FIG. 44 is a sectional view showing the semiconductor light-emitting device in Example 7 of an embodiment of the present invention.

The light-emitting device produced by the above-mentioned process has a structure as shown in FIG. 44. It is characterized by the silicon-doped GaN layer 84 which possesses the S-plane as well as the (11-22) plane, thereby permitting the active region to be formed over a large area. The effect of this structure is uniform current flow without current concentration and reduced current density.

Example 8

This example demonstrates a semiconductor light-emitting device in which the crystal layer is a hexagonal prismoid larger than the selective mask or window region. Its production process and structure will be described with reference to FIGS. 45A to 50.

Figures 45A, 45B:
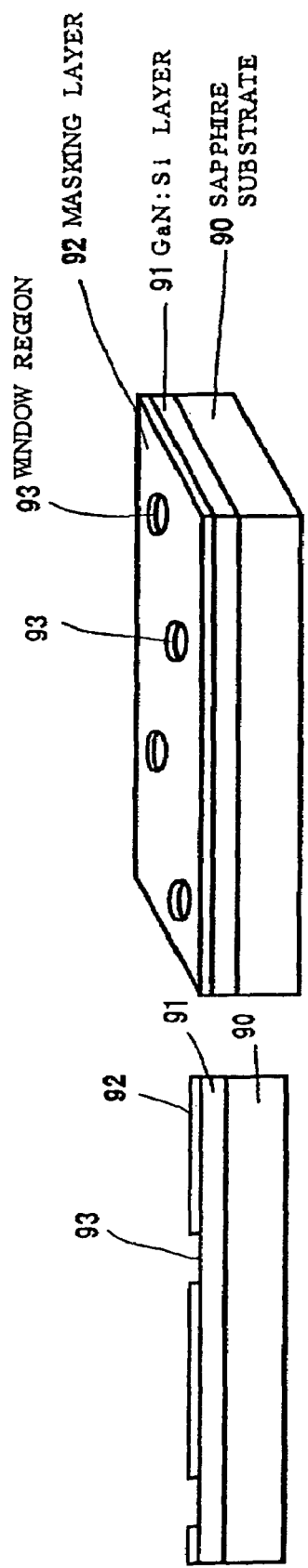
Figures 46A, 46B:
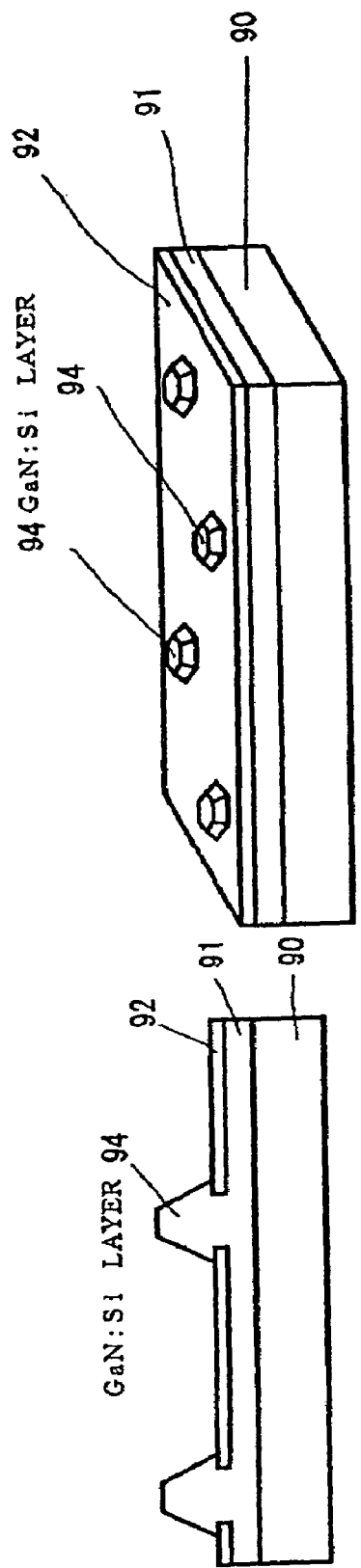

First, on the sapphire substrate 90, whose principal plane is the C+-plane, a low-temperature buffer layer is formed in a manner similar to the examples mentioned above. Then, with the temperature raised to about 1000° C., the silicon-doped GaN layer 91 is formed. On the entire surface of the silicon-doped GaN layer 91, the masking layer 92 (about 100 nm to about 500 nm thick) is formed of SiO2 or SiN. In the masking layer 92, the window region 93 (or a round opening about 10 µm in diameter) is formed by photolithography and etching with hydrofluoric acid based compound, as shown in FIGS. 45A to 45B. The size of the opening varies depending on the light-emitting device desired.

Then, with the temperature raised to about 1000° C., crystal growing is carried out once again to form the silicon-doped GaN layer 94. The silicon-doped GaN layer 94 grows in the window region 93, but it takes the shape of a hexagonal prismoid, whose side plane is the S-plane (1-101) and whose top plane is the C-plane parallel to the principal plane of the substrate, after continued growing. Crystal growing is carried out for a sufficient length of time so that the silicon-doped GaN layer 94 takes the shape of a hexagonal prismoid whose top C-plane is flat (see FIGS. 46A to 46B). This prismoid forms in a shorter time than the above-mentioned hexagonal pyramid.

Figures 47A, 47B:
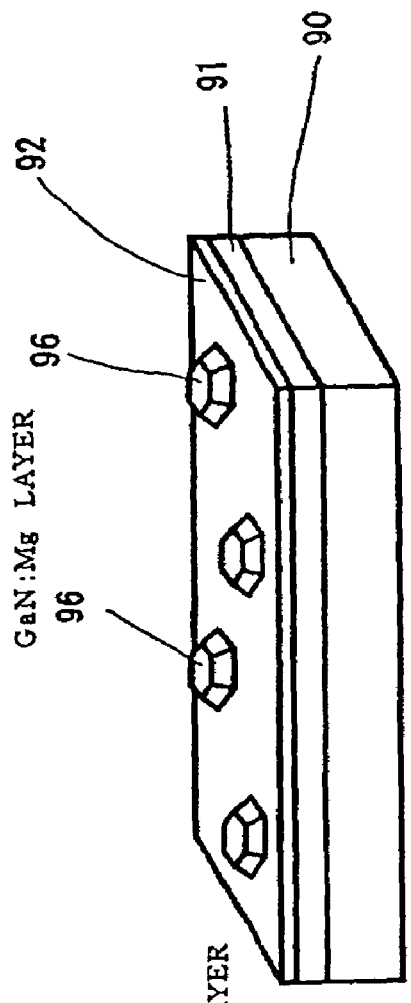
Figure 48A:
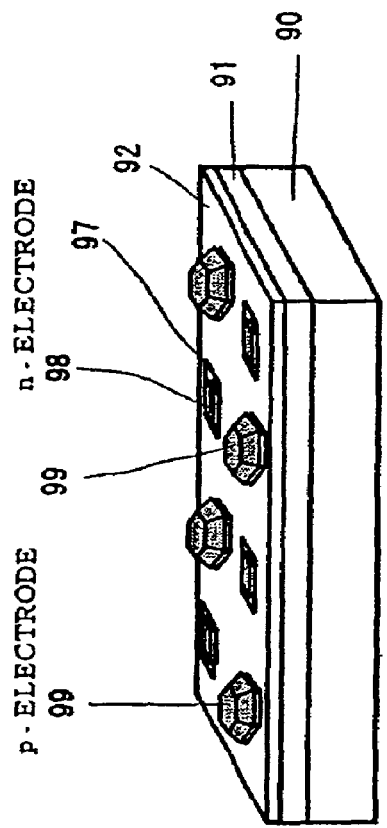
Figure 48B:
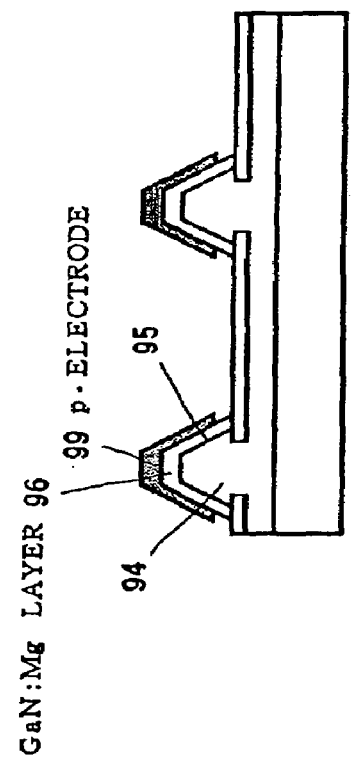

The growing of the silicon-doped GaN is continued. With the growing temperature lowered, the InGaN layer 95 (as an active layer) is grown. Then, with the growing temperature raised again, the magnesium-doped GaN layer 96 (as a p-type cladding layer) is grown, as shown in FIGS. 47A to 47B. The thickness of the InGaN layer 95 is about 0.5 nm to about 3 nm. As with the examples, mentioned above, there may be an instance where a quantum well layer or a multiple quantum well layer is formed, or where a guide layer is formed.

Figure 49B:
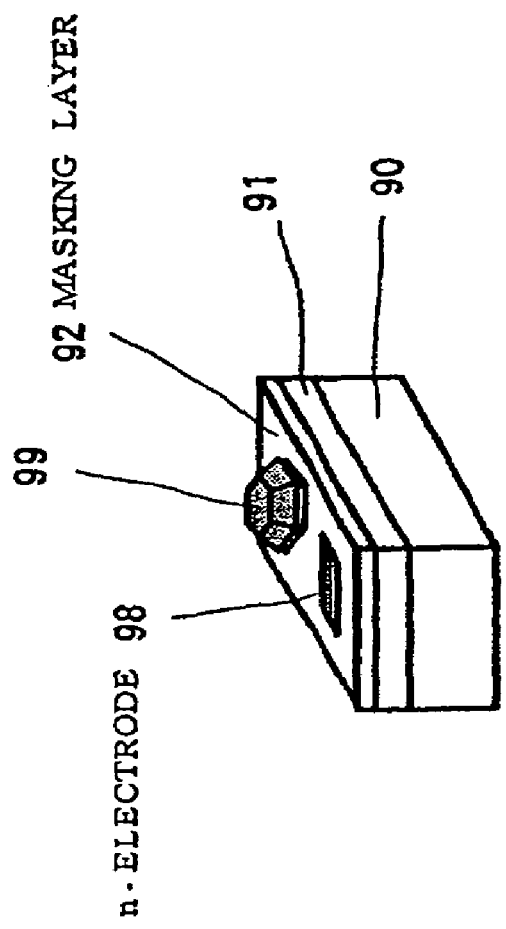
Figure 49A:
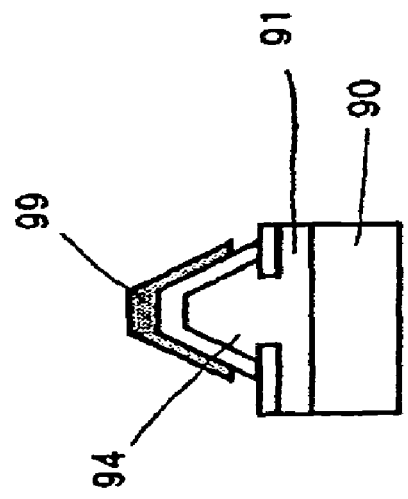

Subsequently, the masking layer is partly opened so that the GaN layer 91 is exposed. In the removed part 97, the n-electrode 98 of Ti/Al/Pt/Au is formed by vapor deposition. On the outermost surface of the previously grown pyramid, the p-electrode 99 of Ni/Pt/Au or Ni(Pd)/Pt/Au is formed by vapor deposition (see FIGS. 48A to 48B). As mentioned above, these vapor depositions should be carried out accurately. Then, individual light-emitting devices are separated by RIE (reactive ion etching) or dicing, as shown in FIGS. 49A to 49B. Thus, the light-emitting device in this example is completed.

Figure 50:
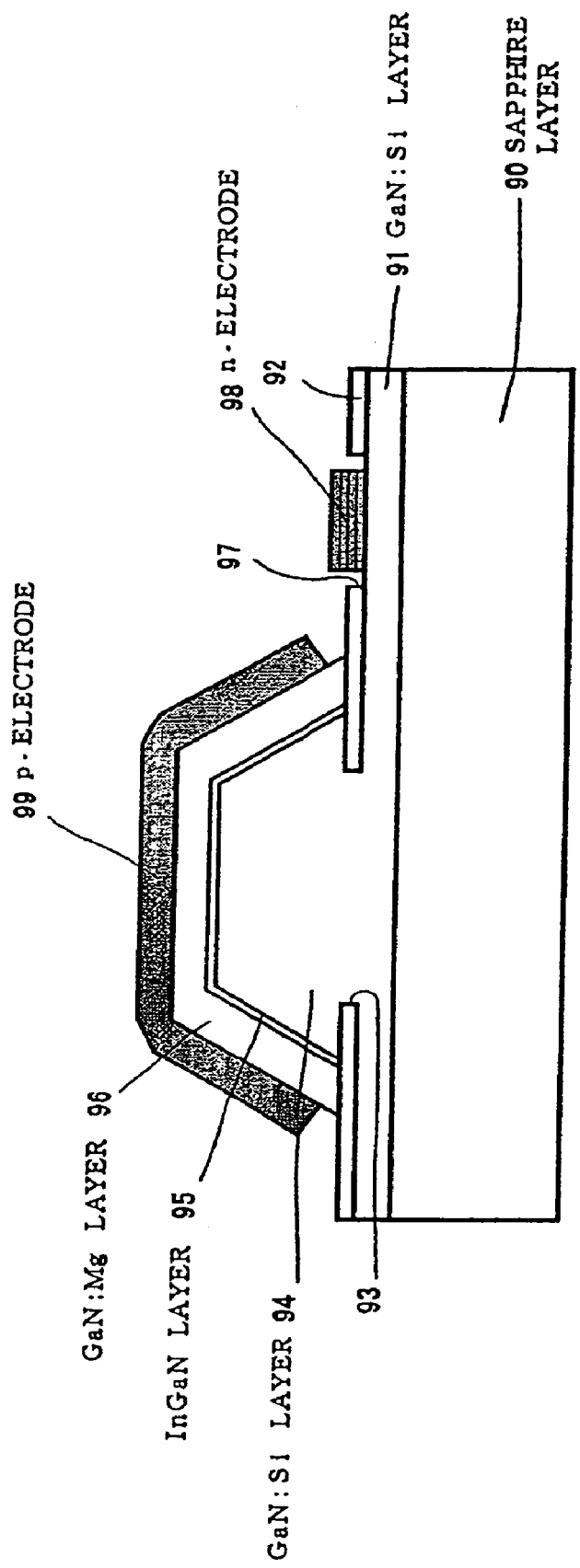
FIG. 50 is a sectional view showing the semiconductor light-emitting device in Example 8 of an embodiment of the present invention.

The light-emitting device produced by the above-mentioned process has a structure as shown in FIG. 50. It is characterized by the sapphire substrate 90 which has the C+-plane as its principal plane and the silicon-doped GaN layer 94 formed thereon which takes the shape of a hexagonal prismoid with a flat top. The hexagonal prismoid lacks the apex part in which the crystal properties are poor. Therefore, this structure prevents loss in light emission characteristics. Moreover, the fact that the hexagonal prismoid is formed in a comparatively short time is also desirable for the process.

The structure, having all or part of the silicon-doped GaN layer 94, the InGaN layer 95, and the magnesium-doped GaN layer 96 extending over the masking layer 92 around the window region 93, with the mask remaining unremoved, relieves steps due to the selective growth and separates the n-electrode 98 and p-electrode 99 with certainty, thereby preventing short-circuiting. An alternative structure is possible in which the ends of the InGaN layer 35 and the magnesium-doped GaN layer 36 are in direct contact with the masking layer 92. Consequently, all the ends come into direct contact with the masking layer 32, thereby covering the active layer, thereby protecting the active layer from oxidation and other deterioration while also increasing the light emission area.

Figure 51B:
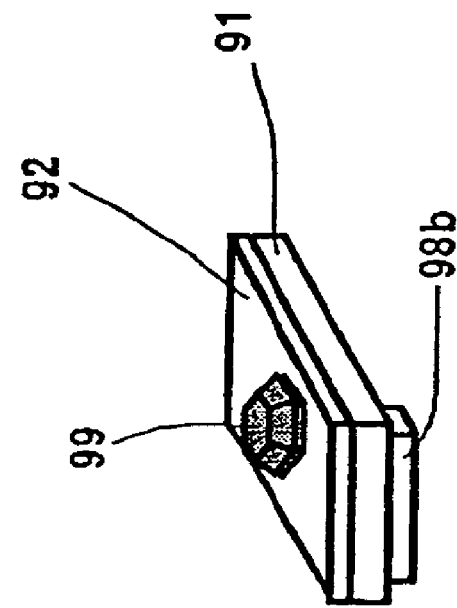
Figure 51A:
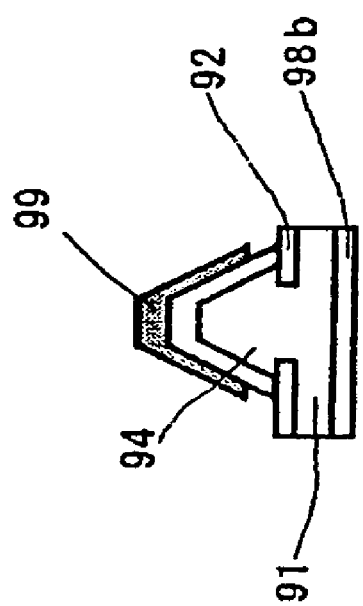
Figure 52:
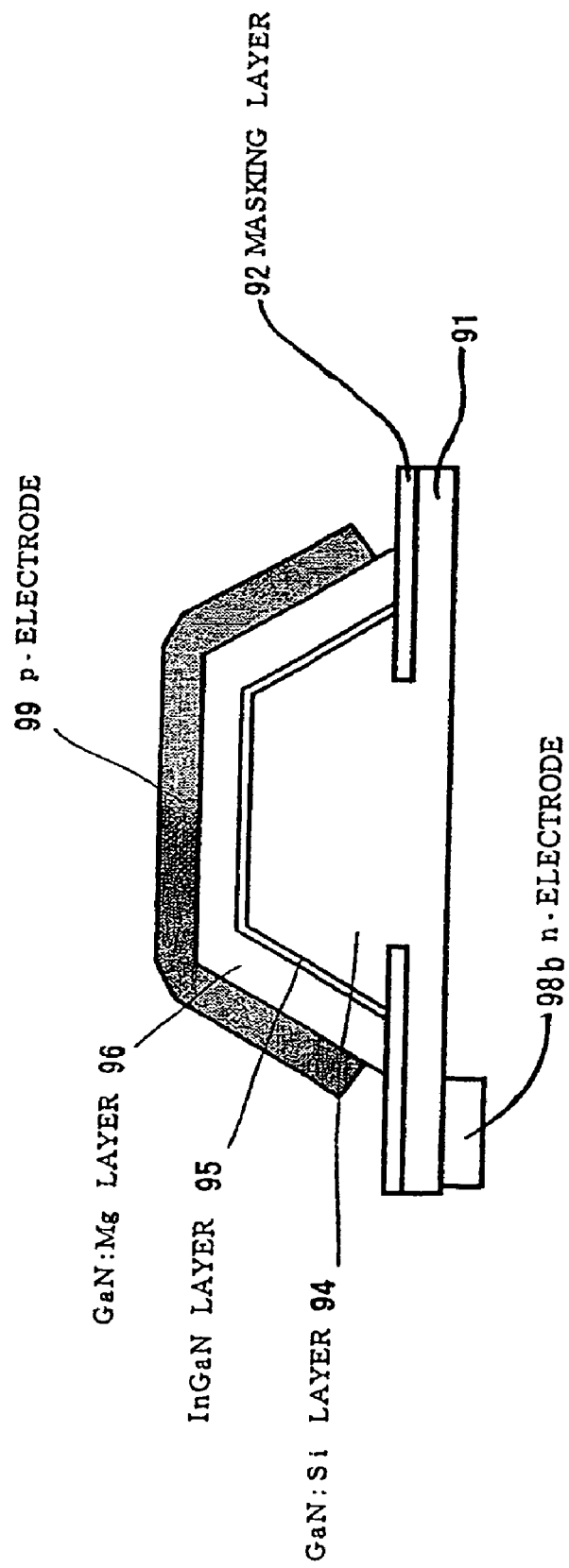
FIG. 52 is a sectional view showing the modified semiconductor light-emitting device in Example 8 of an embodiment of the present invention.

FIGS. 51 and 52 show another structure of the semiconductor light-emitting device of hexagonal prismoid structure. FIGS. 51A to 51B is a diagram showing the process of forming the electrode of the device. The semiconductor light-emitting device shown in FIGS. 51 and 52 is a modified example of the semiconductor light-emitting device shown in FIG. 50. It is characterized by the sapphire substrate 90 which is removed by irradiation with excimer laser and the n-electrode 98b which is formed on the reverse side of the silicon-doped GaN layer 91. On the grown layer, in the shape of hexagonal prismoid with a flat top are the silicon-doped GaN layer 94, the InGaN layer 95, and the magnesium-doped GaN layer 96 which entirely or partly extend to the masking layer 92 around the window region. On the outermost layer of them, the p-electrode 99 is formed.

The structure shown in FIGS. 51A, 51B and 52 is characterized by the n-electrode 98b which is formed on the reverse side of the silicon-doped GaN layer 91 outside the window region in the masking layer 92 through which light emerges. An advantage of this structure is that the size of the semiconductor light-emitting device is reduced and it is not necessary to form the contact region by opening the masking layer 92. This is convenient to production and size reduction. Also in the semiconductor light-emitting device of a hexagonal prismoid structure, the n-electrode 98b may be replaced by a transparent electrode of ITO film, thereby increasing the contact area and simplifying the manufacturing process.

Example 9

Figure 53:
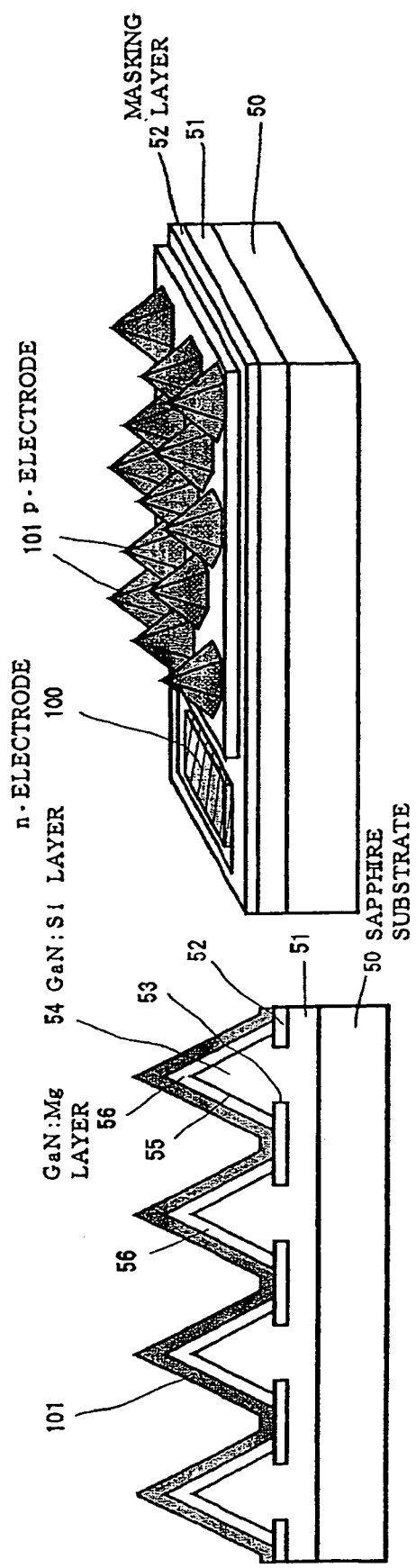

This example demonstrates a semiconductor light-emitting device in which the p-electrode is formed such that the surface of the substrate occupies a large area. Its production process and structure will be described with reference to FIGS. 53A and 53B.

The process in this example is the same as that described in Example 6 up to the stage in which the magnesium-doped GaN layer 56 is grown. Therefore, the parts involved up to this stage are given the same reference numerals but their explanation is omitted.

An opening is made in the masking layer 52 on the sapphire substrate 50. This opening is close to one side of the substrate 50. In this opening, the n-electrode 100 of Ti/Al/Pt/Au is formed by vapor deposition. This n-electrode 100 supplies current to the region composed of a plurality of hexagonal pyramids. The p-electrode 101 of Ni/Pt/Au or Ni(Pd)/Pt/Au is formed by vapor deposition. The p-electrode 101, covering a large area, permits each device to emit strong light. These devices function as a lighting system if they are given the same potential, or these devices function as an image display unit if the p-electrodes 101 are given independent signals. Moreover, these devices constitute a multicolor or full-color image display unit if they are so arranged as to correspond to the three primary colors. The image display unit or lighting system may be constructed of the above-mentioned devices only or a mixture of the above-mentioned devices and other devices produced in different ways.

All or part of the silicon-doped GaN layer 54, the InGaN layer 55, and the magnesium-doped GaN layer 56 extend to the masking layer 52 around the window region 53. The mask remaining unremoved relieves steps due to the selective growth and also separates the n-electrode 100 and p-electrode 101 from each other with certainty, thereby preventing short-circuiting. Another structure is also possible in which the InGaN layer 55 and the magnesium-doped GaN layer 56 come into direct contact with the masking layer 52. The advantage of this structure is that the layers' ends in direct contact with the masking layer 52 cover the active layer, thereby protecting the active layer from oxidation and other deterioration. Another advantage is an increased light emission area.

Example 10

Figure 54:
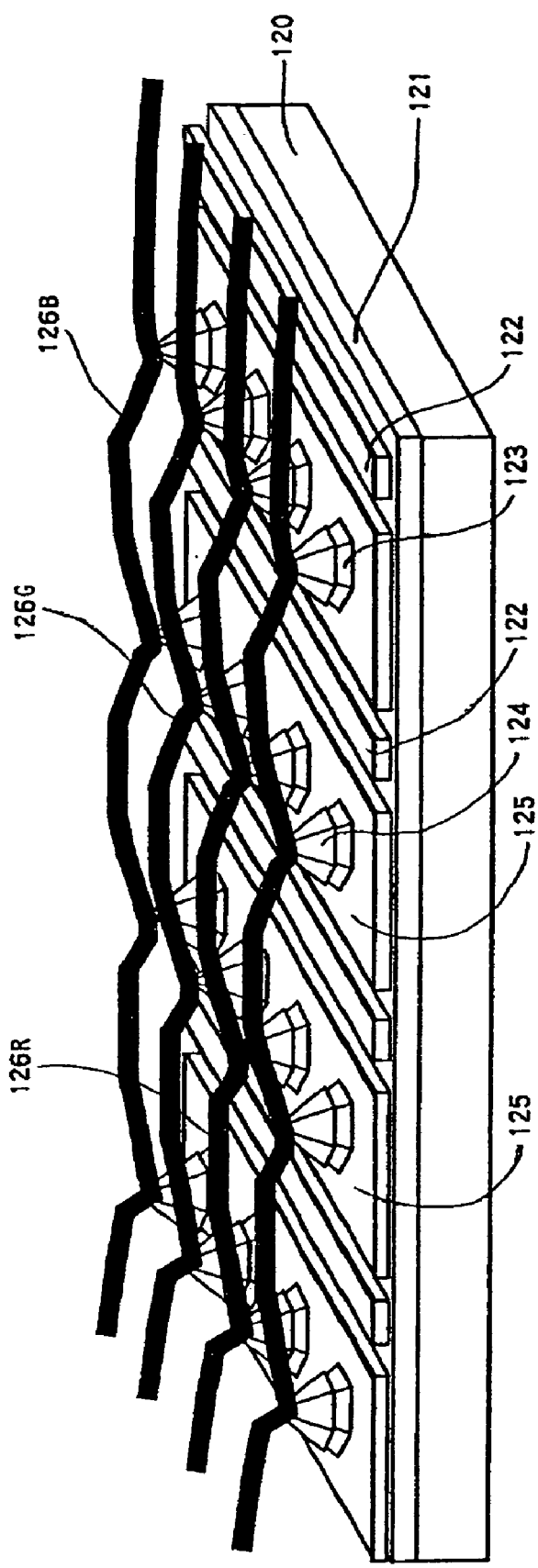
FIG. 54 is a partial perspective view showing an apparatus that utilizes the semiconductor light-emitting device in Example 10 of an embodiment of the present invention.

This example demonstrates an image display unit or a lighting system constructed of the semiconductor light-emitting devices obtained in the above-mentioned examples which are so arranged as to suit a simple matrix drive, as shown in FIG. 54. Each semiconductor light-emitting device is arranged, on the substrate 120, in such a manner that its region emitting red color, its region emitting blue color, and its region emitting green color are provided linearly. They are supplied with current through respective wires 126R, 126G, and 126B which are connected to the respective p-electrodes 124. The n-electrode 122 is a common electrode. If necessary, selective transistors may be formed to control pixels individually. The masking layer 125 remains on the substrate 120, so that it relieves steps on its underlying silicon-doped GaN layer 121.

The semiconductor light-emitting devices in each row for red color, blue color, and green color have active layers which are capable of emitting light with a first, second, and third wavelength, respectively. The devices will function as an image display unit for two-dimensional images if the wires 126R, 126G, and 126B are given signals independently. The devices will function as a lighting system if the wires 126R, 126G, and 126B are given identical signals.

Additionally, the process in the foregoing examples consists of forming a low-temperature buffer layer on the sapphire substrate, growing the GaN layer, forming the selective mask, and performing selective growth. The process may be so modified as to form the GaN layer directly on Si at about 900° C., or to form an AlN layer (5 nm thick) on Si at about 1000° C. and then grow GaN, or to use the GaN substrate and subsequently form the selective mask.

Example 11

This example demonstrates a semiconductor light-emitting device which has on a substrate for growth 131, with the C-plane (i.e. the (0001) plane), (for example, a sapphire substrate), an n-type GaN layer 132 (as an underlying layer for growth) grown by MOCVD, MOVPE or the like and a masking layer 133 (as a growth inhibiting film of silicon oxide, silicon nitride, or tungsten).

In the masking layer 133, a window region 134 which has a hexagonal opening is formed. In the window region 134, the crystal grown layer 135 (having a triangular cross section) is formed by selective growth. The crystal grown layer 135 is an n-type GaN layer or an AlGaN layer, for example, and has a cross section of an approximately regular triangle. It is hexagonal when viewed from above, and it takes the shape of a hexagonal pyramid as a whole.

The crystal grown layer 135 has side faces (which are the S-plane or an equivalent thereof) slanting to the principal plane of the substrate. On the crystal grown layer 135 is an n-type cladding layer with a controlled concentration, for example. On the n-type cladding layer are formed the active layer 136 and the second conductive layer 137 (which functions as a p-type cladding layer). The active layer 136 and the second conductive layer 137 are formed to cover the S-plane of the crystal grown layer 135. The active layer 136 is grown along the S-plane of the crystal grown layer 135, and it is not parallel to the principal plane of the substrate 131. The second conductive layer 137 is a p-type GaN layer or an AlGaN layer. An AlGaN layer may be formed on the active layer 136.

On the second conductive layer 137, the second electrode 139 (which functions as a p-electrode) is formed in the form of multi-layer metal film of Ni/Pt/Au or Ni(Pd)/Pt/Au. In the opening in the masking layer 133, the first electrode 138 (which functions as an n-electrode) is formed in the form of a multi-layer metal film of Ti/Al/Pt/Au, for example. The first electrode 138 and the second electrode 139 may be formed by vapor deposition, lift-off technique, or the like.

Figure 55:
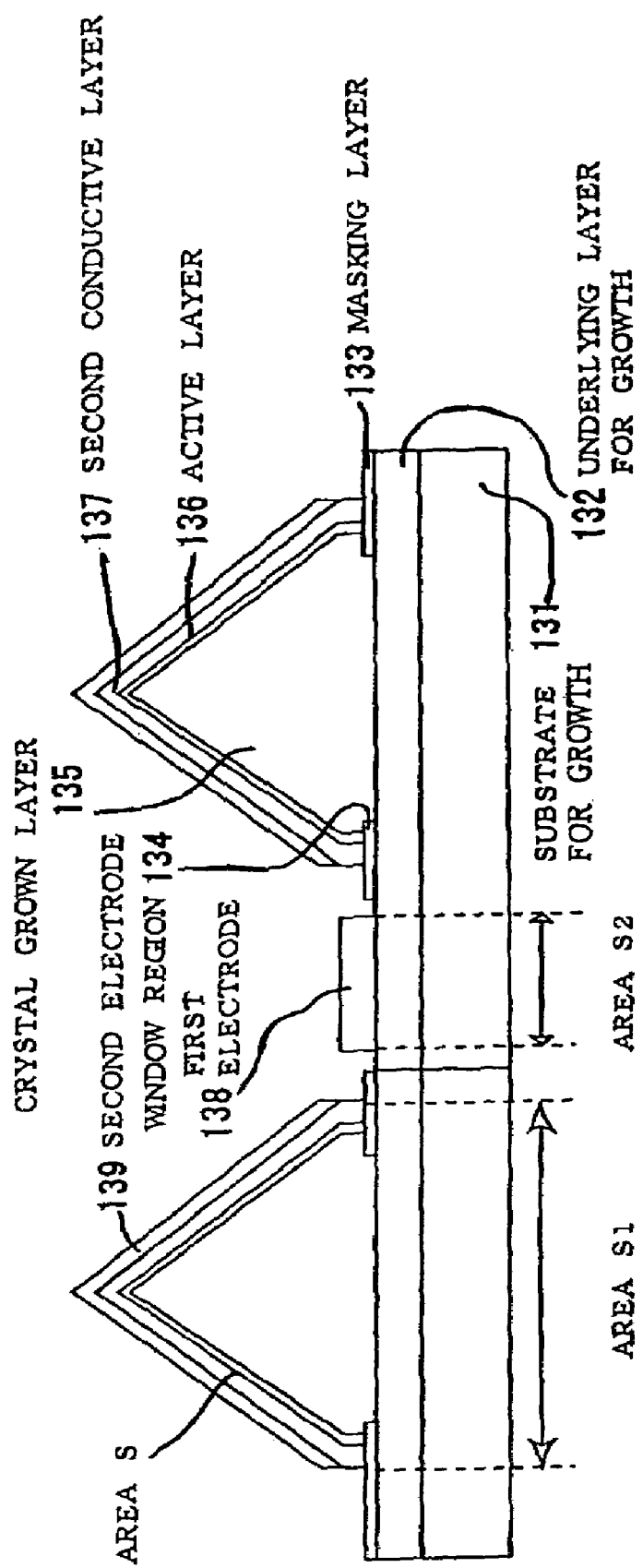
FIG. 55 is a sectional view showing the structure of the semiconductor light-emitting device in Example 11 of an embodiment of the present invention.

An advantage of the semiconductor light-emitting device in this example is that the active layer 136 has a large area functioning to relieve the current density injected into the active layer 136. In particular, the area S of the active layer 6 is sufficiently large because the active layer 136 extends along the S-plane of the crystal grown layer 135, not parallel to the principal plane of the substrate for growth 131. The area S of the active layer 6 may be larger than the sum of S1 and S2, where S2 is the area of the first electrode 138 and S1 is the area of the crystal grown layer 135 projected to the principal plane of the substrate, as shown in FIG. 55.

In the case where the device in this example is a light-emitting diode having the size of, for example, a 30 μm square, the area of S2 is about 20 μm×about 5 μm or about 100 μm2 and the area of S1 is about 20 μm×about 20 μm or about 400 μm2 at the largest. S2 is the region in which the first electrode comes into contact with the underlying conductive layer as the first conductive layer, and S1 is the projected region of the active layer. Therefore, by making the total area of the active layer equal to or larger than about 500 μm2 (i.e., S1+S2), it is possible to obtain the device structure according to the present invention.

Conversely, where the crystal grown layer 135 formed by selective growth is a quadrangular pyramid whose base is about a 20 μm square and whose side faces are formed at an angle of 45°, the total area of the active layer 136 which is uniformly formed on the side faces is about 20 μm×about 20 μm/cos 45° or about 566 μm2 (i.e., clearly bigger than about 500 μm2). The area S of the active layer increases even more when it is formed on the S-plane of a hexagonal pyramid (with an angle of about 62°).

Figure 56:
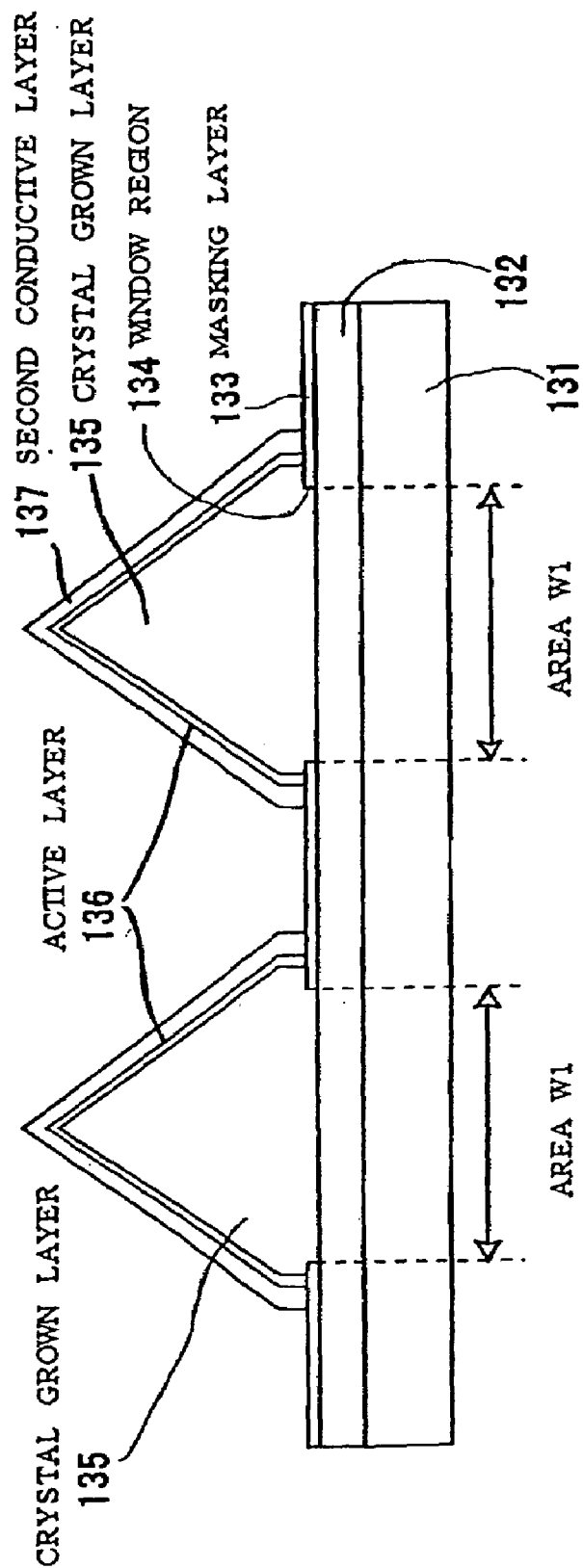
FIG. 56 is a sectional view illustrating the area W1 of the window region of the semiconductor light-emitting device in Example 11 of an embodiment of the present invention.
Figure 57:
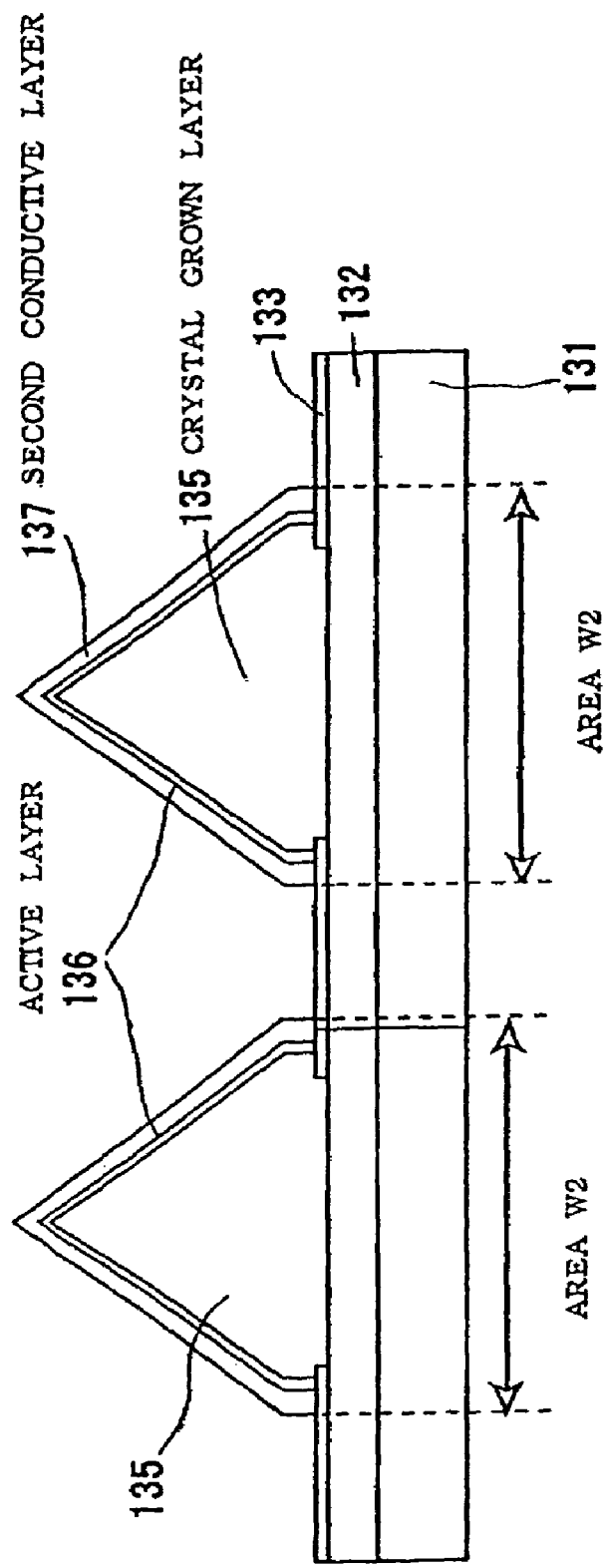
FIG. 57 is a sectional view illustrating the projected area W2 of the crystal grown layer of the semiconductor light-emitting device in Example 11 of an embodiment of the present invention.

FIGS. 56 and 57 show that when the area S of the active layer 136 is increased to relieve the brightness saturation, it becomes larger than the area W1 of the window region 133 (see FIG. 56) or the area W2 of the crystal grown layer projected to the principal plane of the substrate in its normal direction (see FIG. 57). When the active layer 136 extends along the S-plane of the crystal grown layer 135, not parallel to the principal plane of the substrate 131, the area S of the active layer 136 becomes larger than the area W1 or the projected area W2. In other words, the active layer 136 has a sufficient area, thereby effectively relieving brightness saturation and improving device reliability.

The light-emitting device constructed as shown in FIG. 55 offers an advantage that, in addition to the effect produced by the increased area of the active layer, the S-plane slanting to the principal plane of the substrate increases the number of bonds from nitrogen atoms to gallium atoms, thereby increasing the effective V/III ratio. Therefore, the resulting light-emitting device has improved performance. In addition, dislocations extending from the substrate bend and defects tend to decrease. The slant crystal plane slanting to the principal plane of the substrate prevents multiple reflection, thereby permitting the generated light to emerge efficiently. The structure in which the active layers 136 are isolated from one another obviates the necessity of etching the active layer 136, thereby eliminating damage to the active layers. Another advantage is that the effective area of the active layer 136 is not reduced by the electrode.

Example 12

Figure 58:
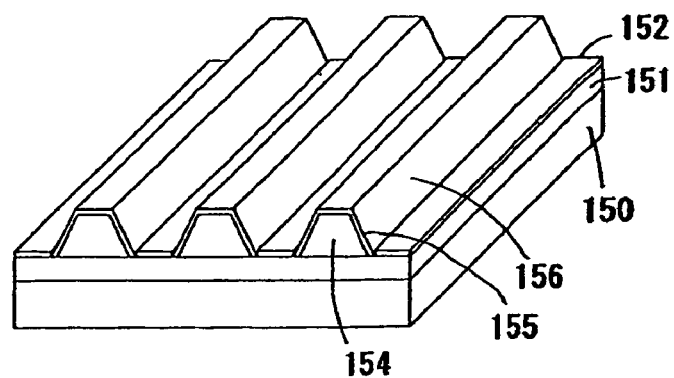
FIG. 58 is a perspective view showing the structure of the semiconductor light-emitting device in Example 12 of an embodiment of the present invention that is characterized by the crystal grown layer which is formed in a stripe pattern.

This example demonstrates a semiconductor light-emitting device in which the crystal grown layer 154 is formed in a stripe pattern on the substrate 150, as shown in FIG. 58. The semiconductor light-emitting device consists of the substrate for growth 150, the underlying layer for growth 151, the masking layer 152, and the crystal grown layer 154 in a stripe pattern which is formed in the window region in the masking layer 152. The crystal grown layer 154 has the side face 156 which is the S-plane. The active layer 155 is extendingly formed also on the slant side face 156, so that the area of the active layer 155 is larger than the projected area of the crystal grown layer 154, thereby effectively relieving brightness saturation and improving device reliability.

Example 13

Figure 59:
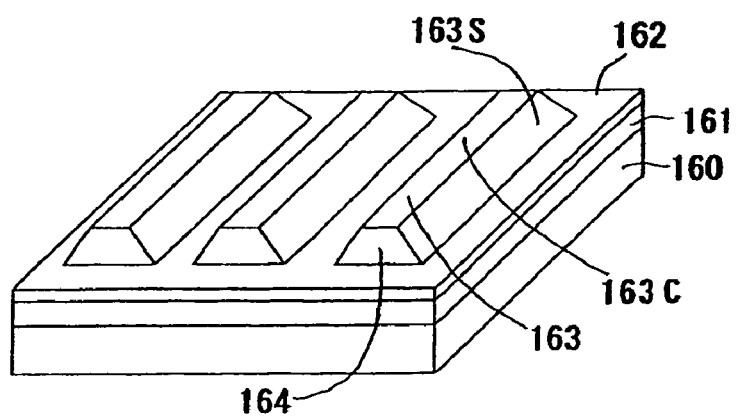
FIG. 59 is a perspective view showing the structure of the semiconductor light-emitting device in Example 13 of an embodiment of the present invention that is characterized by the crystal grown layer which is formed in a pattern of elongated quadrangular prismoids.

This example demonstrates a semiconductor light-emitting device in which the crystal grown layer 164 is formed in the shape of an elongated quadrangular prismoid on the substrate 160, as shown in FIG. 59. The semiconductor light-emitting device consists of the substrate for growth 160, the underlying layer for growth 161, the masking layer 162, and the crystal grown layer 164 formed in the shape of a stripe and an elongated quadrangular prismoid in the window region in the masking layer 162. The crystal grown layer 164 has the side face 163S which is the S-plane. The face 164 at the end in the lengthwise direction is the (11-22) plane. The top face 163C of the crystal grown layer 164 is the C-plane which is identical with the principal plane of the substrate. The active layer, which is not shown, extends over the slant side face 163S, the face 164, and the top face 163C, so that the area of the active layer is larger than the projected area of the crystal grown layer 164, thereby effectively relieving brightness saturation and improving device reliability.

Example 14

Figure 60:
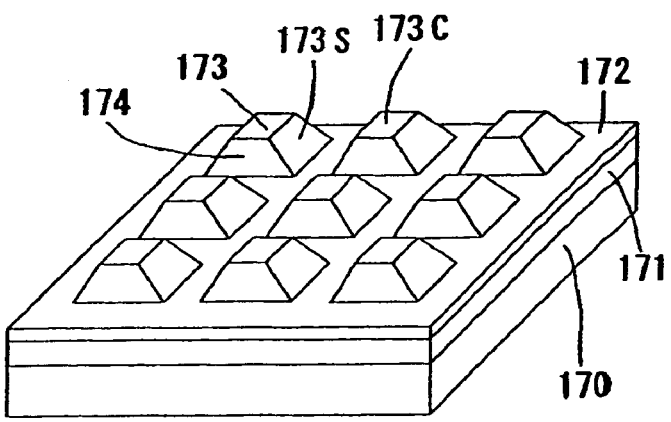
FIG. 60 is a perspective view showing the structure of the semiconductor light-emitting device in Example 14 of an embodiment of the present invention that is characterized by the crystal grown layer which is formed in a pattern of quadrangular prismoids.

This example demonstrates a semiconductor light-emitting device in which the crystal grown layer 174 is formed in the shape of a quadrangular trapezoid on the substrate for growth 170, as shown in FIG. 60. The semiconductor light-emitting device consists of the substrate for growth 170, the underlying layer for growth 171, the masking layer 172, and the crystal grown layer 173 which is formed in the shape of a quadrangular prismoid in the window region in the masking layer 172. The quadrangular prismoids are arranged in a matrix pattern. The crystal grown layer 173 has the slant side face 173S which is the S-plane and the other side face 174 which is the (11-22) plane. The top plane 173C of the crystal grown layer 173 is the C-plane which is identical (i.e. parallel) to the principal plane of the substrate. The active layer, which is not shown, extends over the slant side face 173S, the face 174, and the top face 173C, so that the area of the active layer is larger than the projected area of the crystal grown layer 173, thereby effectively relieving brightness saturation and improving device reliability.

Example 15

Figure 61:
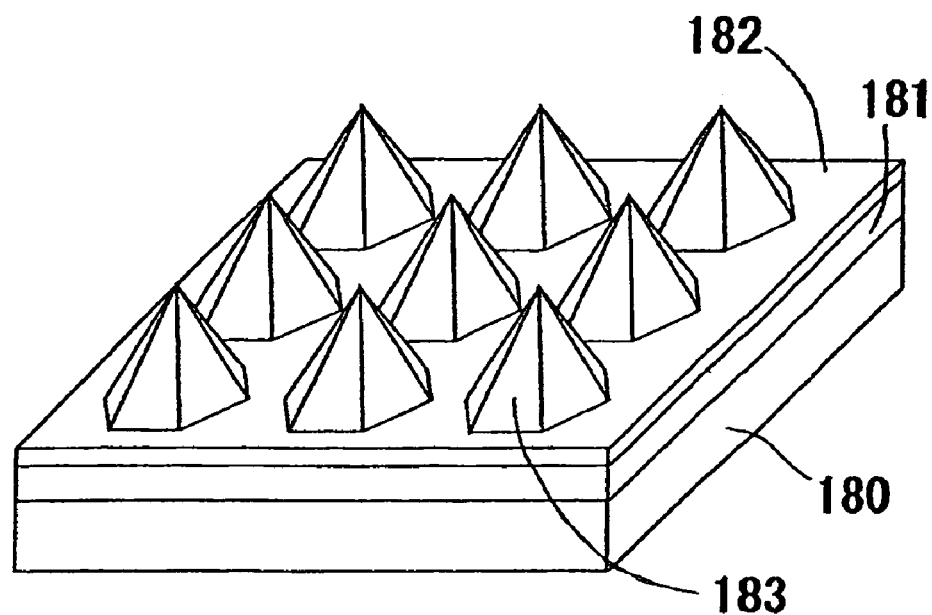
FIG. 61 is a perspective view showing the structure of the semiconductor light-emitting device Example 15 of an embodiment of the present invention that is characterized by the crystal grown layer which is formed in a pattern of hexagonal pyramids.

This example demonstrates a semiconductor light-emitting device in which the crystal grown layer 183 is formed in the shape of a hexagonal pyramid on the substrate for growth 180, as shown in FIG. 61. The semiconductor light-emitting device consists of the substrate for growth 180, the underlying layer for growth 181, the masking layer 182, and the crystal grown layer 183 which is formed in the shape of a hexagonal pyramid in the window region in the masking layer 182. The hexagonal pyramids are arranged in a matrix pattern. The crystal grown layer 183 has the slant side face which is the S-plane. The active layer, which is not shown, extends over the slant S-plane, so that the area of the active layer is larger than the projected area of the crystal grown layer 183. Refer to FIG. 55 and Example 11, for example, for a discussion regarding the relationship of the area of the active layer and the projected area of the crystal grown layer. This structure effectively relieves brightness saturation and improves device reliability.

Example 16

Figure 62:
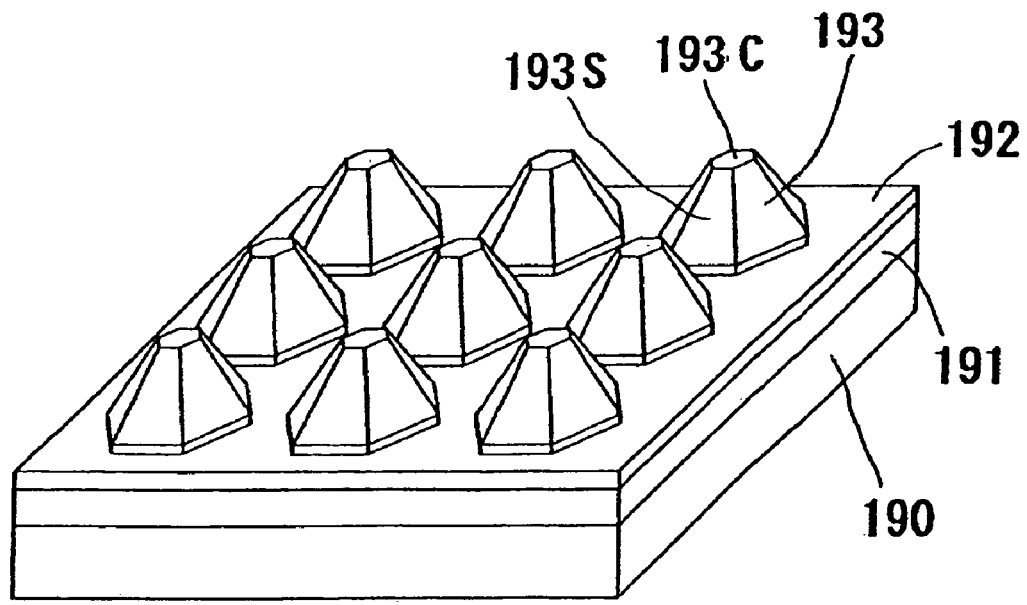
FIG. 62 is a perspective view showing the structure of the semiconductor light-emitting device Example 16 of an embodiment of the present invention that is characterized by the crystal grown layer which is formed in a pattern of hexagonal prismoids.

This example demonstrates a semiconductor light-emitting device in which the crystal grown layer 193 is formed in the shape of a hexagonal prismoid is formed on the substrate for growth 190, as shown in FIG. 62. The semiconductor light-emitting device consists of the substrate for growth 190, the underlying layer for growth 191, the masking layer 192, and the crystal grown layer 193 which is formed in the shape of a hexagonal prismoid in the window region in the masking layer 192. The hexagonal prismoids are arranged in a matrix pattern. The crystal grown layer 193 has the slant side face 193S which is the S-plane, and also has the top face 193C which is the C-plane identical to the principal plane of the substrate. The base of the hexagonal pyramid is the M-plane or the (1-100) plane at the low position (i.e. the crystal grown layer having the S-plane as a side face bends to encompass the M-plane at the base of the hexagonal pyramid). The active layer, which is not shown, extends over the slant S-plane and the C-plane, so that the area of the active layer is larger than the projected area of the crystal grown layer 193. This structure effectively relieves brightness saturation and improves device reliability.

Example 17

This example demonstrates the process for producing the semiconductor light-emitting device shown in FIG. 55. The process is described with reference to FIGS. 63 to 68.

Figure 63:
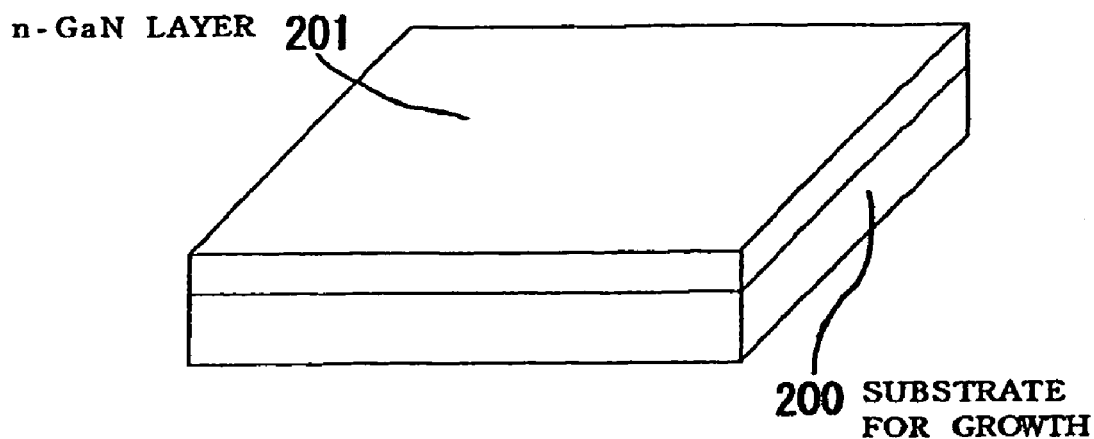
FIG. 63 is a perspective view showing the step of forming an underlying layer for growth in the production of the semiconductor light-emitting device in Example 17 of an embodiment of the present invention.

On the substrate for growth 200 (for example, a sapphire substrate) the n-type GaN layer 201 (as an underlying layer for growth) is formed by MOCVD or the like, as shown in FIG. 63. The n-type GaN layer 201 needs not be n-type initially. However, it is acceptable so long as its uppermost face is n-type. The desired n-type GaN layer 201 may be formed by doping with silicon, for instance.

Figure 64:
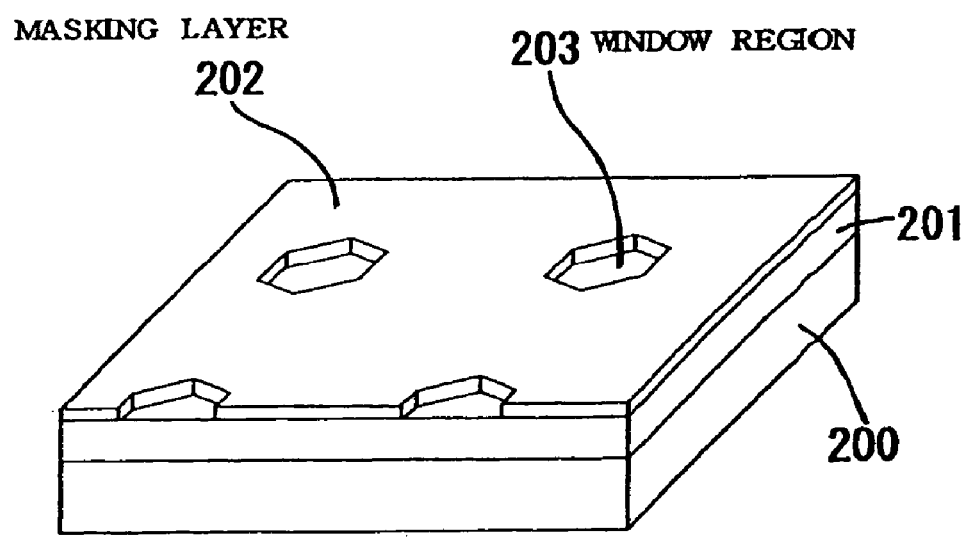
FIG. 64 is a perspective view showing the step of forming window regions in the production of the semiconductor light-emitting device in Example 17 of an embodiment of the present invention.

On the entire surface of the n-type GaN layer 201 the masking layer 202 is formed by CVD or the like, as shown in FIG. 64. The masking layer 202 is a silicon oxide film, silicon nitride film, tungsten film, or the like which functions as a growth inhibiting film. The masking layer 202 is partly removed to form a plurality of hexagonal window regions 203 corresponding to the regions in which the devices are formed.

Figure 65:
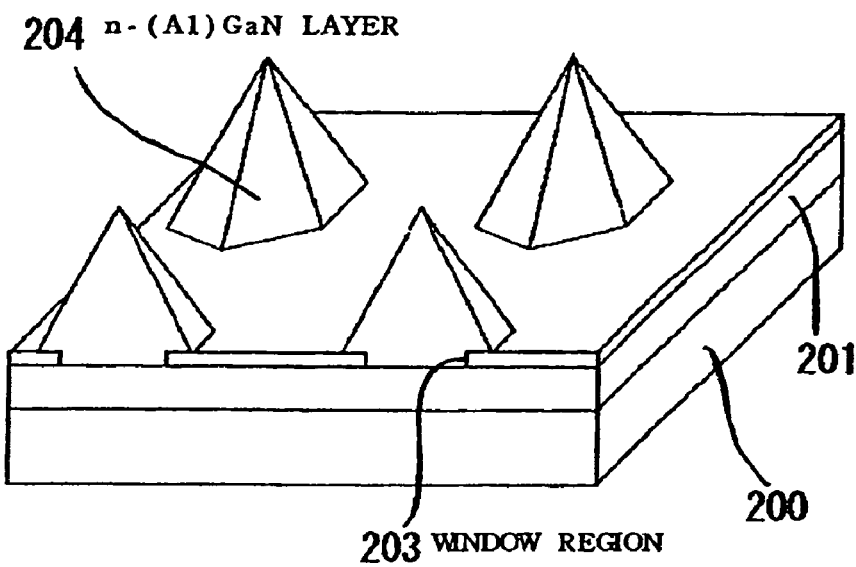
FIG. 65 is a perspective view showing the step of forming a crystal grown layer in the production of the semiconductor light-emitting device in Example 17 of an embodiment of the present invention.

Selective growth is carried out so as to form the n-type (Al)GaN layer 204 as the crystal grown layer in the window region 203, as shown in FIG. 65. This n-type (Al)GaN layer 204 also functions as a cladding layer, and it takes the shape of an approximately hexagonal pyramid. The slant side face is the S-plane.

Figure 66:
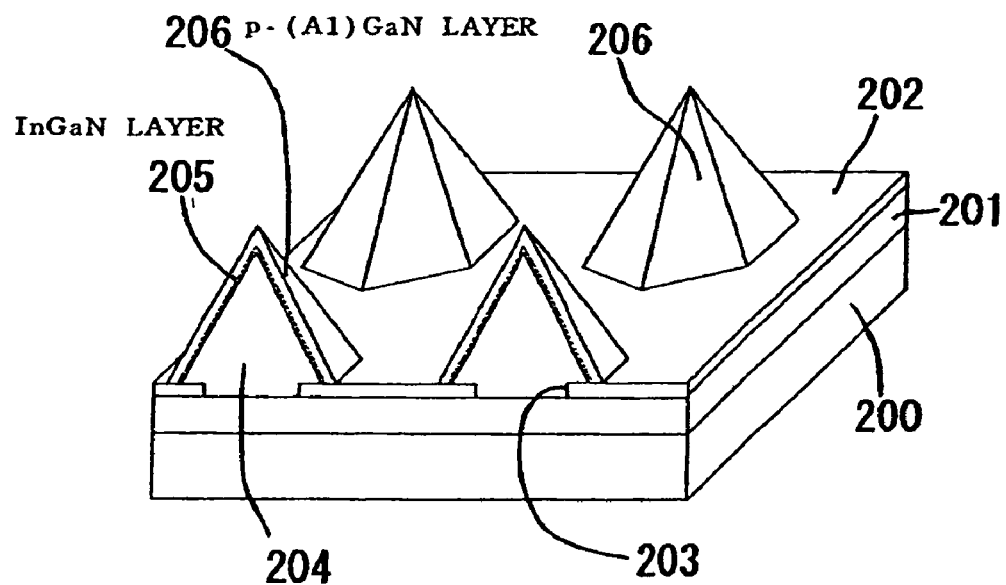
FIG. 66 is a perspective view showing the step of forming a layer of a second conductivity type in the production of the semiconductor light-emitting device in Example 17 of an embodiment of the present invention.

On the slant side face are formed the InGaN layer 205 (as an active layer) and the p-type (Al)GaN layer 206, as shown in FIG. 66. The InGaN layer 205 as an active layer extends broadly over the S-plane of the (Al)GaN layer 204 as the crystal grown layer, not parallel to the principal plane of the substrate for growth. The area S of the active layer is larger than the area of the window region 203 and the projected area of the crystal grown layer. It is possible to form an AlGaN layer on the InGaN layer 205.

Figure 67:
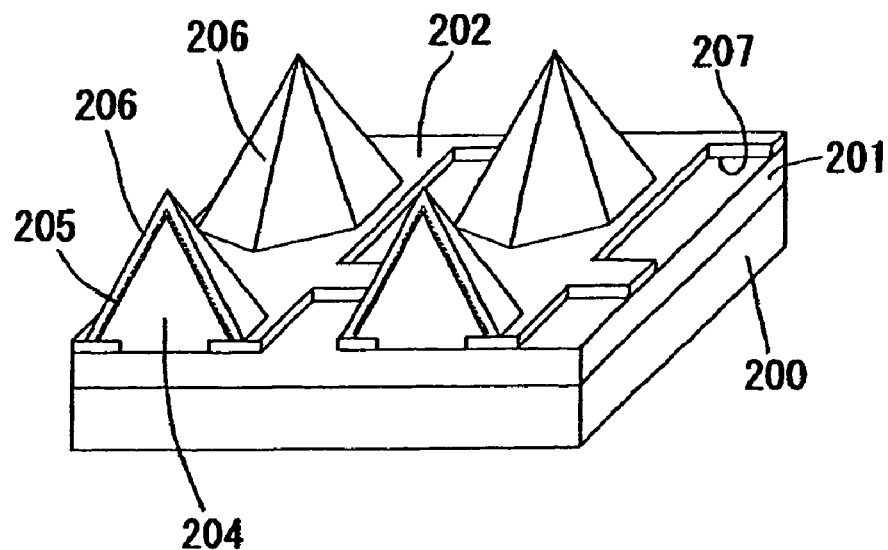
FIG. 67 is a perspective view showing the step of forming a contact region in the production of the semiconductor light-emitting device in Example 17 of an embodiment of the present invention.
Figure 68:
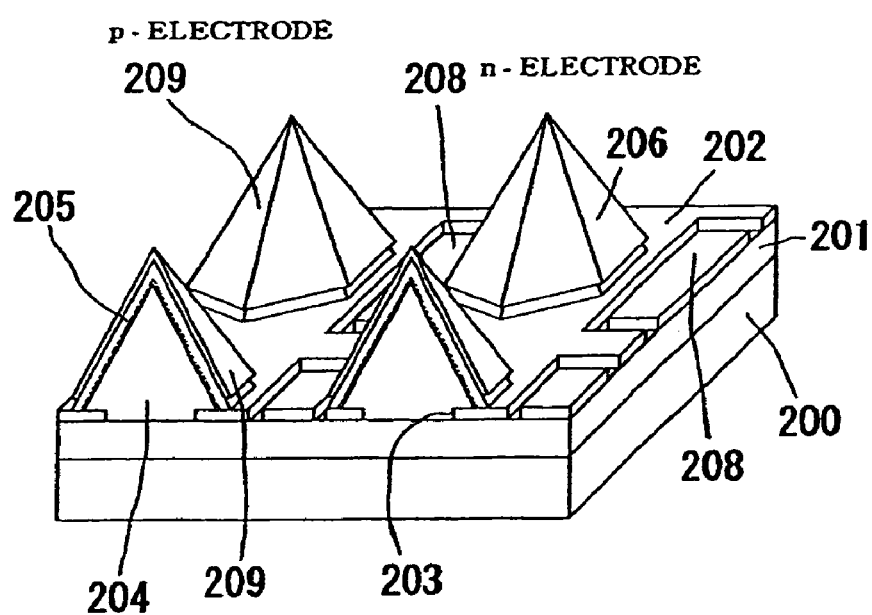
FIG. 68 is a perspective view showing the step of forming an electrode in the production of the semiconductor light-emitting device in Example 17 of an embodiment of the present invention.

When poly-GaN or the like is grown on the masking layer, unnecessary parts are removed by etching. The masking layer 202 is removed partly or entirely to form the n-side contact region 207, as shown in FIG. 67. The p-electrode 209 of Ni/Pt/Au or Ni(Pd)/Pt/Au is formed by vapor deposition or the like. The n-electrode 78 of Ti/Al/Pt/Au is formed in the contact region 207 by lift-off technique or the like (see FIG. 68). After alloying, the device on the substrate is completed.

The basic structures of the individual devices are so small that it is difficult to separate them from one another. However, it is only necessary to separate them into groups by dicing, cleavage and the like, each group consisting of devices arranged in one dimension or two dimensions. The internal basic structures of individual devices in each group may or may not be driven independently. The GaN crystals grown on the sapphire substrate can be peeled off from the sapphire substrate if the sapphire/GaN interface is subjected to UV laser abrasion through the sapphire, as reported by W. S. Wong et al. in APL-75-10, 1360-2. If the first grown film (the first conductive film) is removed by etching before or after laser abrasion, it is possible to form a single semiconductor light-emitting device having the basic structure according to an embodiment of the present invention.

As mentioned above, the process in this example offers the advantage that the S-plane can be formed easily by selective growth and the active layer can be formed on the crystal grown layer whose side face is the S-plane, thereby obtaining the active layer with a large area.

Example 18

Figure 69:
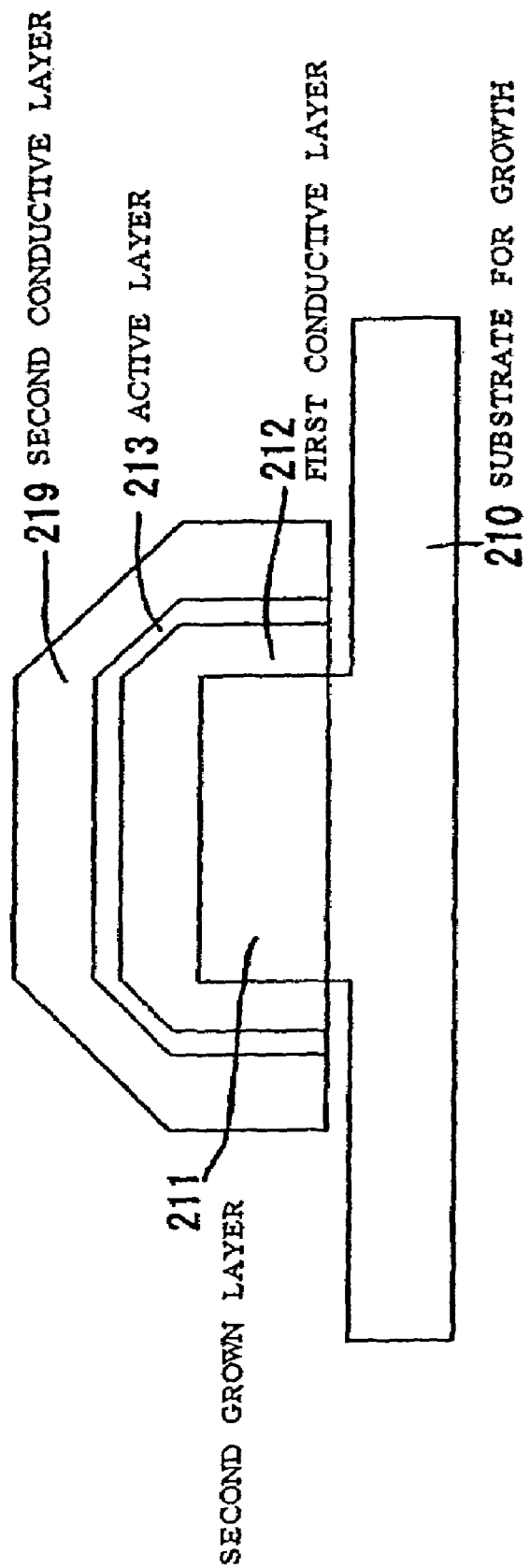
FIG. 69 is a sectional view showing the semiconductor light-emitting device in Example 18 of an embodiment of the present invention.

This example demonstrates a semiconductor light-emitting device having the structure as shown in FIG. 69. The device includes the substrate for growth 210, the second grown layer 211, the first conductive layer 211 (covering the second grown layer 211), the active layer 213, and the second conductive layer 219. Although there is not a masking layer or window regions, the area of the active layer 213 is made larger, by selective growth, than the projected area of the crystal grown layer, thereby effectively relieving brightness saturation and improving device reliability. In other words, even in the case where a growth inhibiting film (such as a masking layer) is not used, it is possible to form a stable plane and produce the same effect as that which would be obtained by forming a growth inhibiting film, if microfabrication is carried out by etching (for example, surface irregularities are formed on the substrate for growth or the crystal film which has been grown previously).

Additionally, according to an embodiment of the present invention, a hexagonal opening is most desirable as the window region in which the hexagonal pyramid is grown. However, the shape of the opening or the direction of the boundary of the opening is arbitrary because the stable plane is eventually formed by itself even in the case of a round opening. The present invention is applicable also to the structure in which the stable plane, such as the (11-22) plane and the (1-100) plane other than the (1-101) plane in a wurtzite crystal, is formed by itself.

At present, red LEDs are usually made from an AlGaInP compound of zincblende structure. This compound has stable planes such as the (011) plane, the (111) plane, and the (11-1) plane with respect to the (001) substrate. If it is grown under adequate conditions, it is possible to form the stable plane and the active layer thereon.

Example 19

Figure 70:
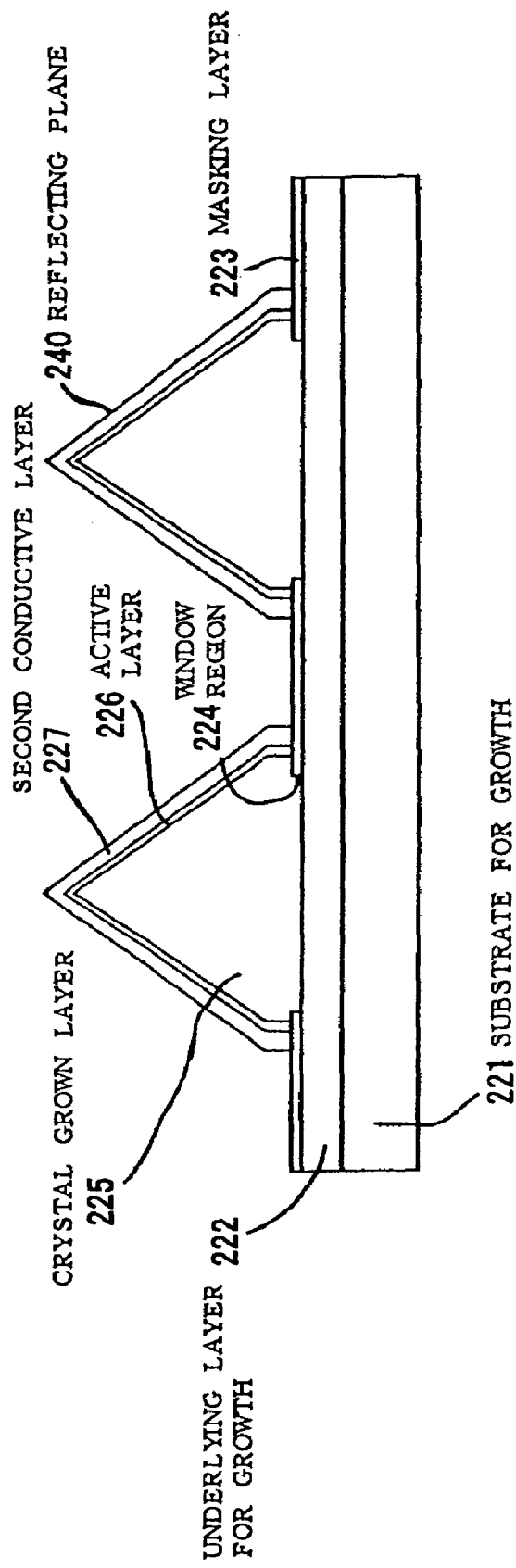
FIG. 70 is a sectional view showing the structure of the semiconductor light-emitting device in Example 19 of an embodiment of the present invention.

This example demonstrates a semiconductor light-emitting device as shown in FIG. 70, which is formed in the following manner. On substrate for growth 221 such as a sapphire substrate with the C-plane (i.e. the (0001) plane) the underlying layer 222 (which is an n-type GaN layer) is formed by MOCVD, MOVPE or the like.

On the underlying layer for growth 222, the masking layer 223 is formed as a growth inhibiting film, for example, a silicon oxide film, a silicon nitride film, a tungsten film, the line and combination thereof. In the masking layer 223, the window region 224 is formed as a hexagonal opening. In this window region 224, the crystal grown layer 225 is formed by selective growth, thereby obtaining a shape with a triangular cross section. This crystal grown layer 225 is an n-type GaN layer or AlGaN layer and has a cross section of an approximately regular triangle. It is hexagonal when viewed from above and it takes the shape of a hexagonal pyramid as a whole.

The crystal grown layer 225 has the crystal plane (or the S-plane or a plane equivalent thereto) slanting to the principal plane of the substrate. On the crystal grown layer 225, an n-type cladding layer is formed by adjusting the concentration of the outermost portion of the crystal grown layer 225. On the n-type cladding layer are formed the active layer 226 and the second conductive layer 227 (which functions as a p-type cladding layer). The active layer 226 and the second conductive layer 227 (which functions as a p-type cladding layer) are so formed as to cover the S-plane of the crystal grown layer 225. The active layer 226 is grown along the S-plane of the crystal grown layer 225 and it is not parallel to the principal plane of the substrate for growth 221. The second conductive layer 227 is a p-type GaN layer or an AlGaN layer. An AlGaN gap layer may be formed on the active layer 226. In this example, the surface of the second conductive layer 227 becomes the interface with the second electrode to be formed subsequently, and this interface functions as the reflecting plane 240 for light generated by the active layer 226.

On the second conductive layer 227, the second electrode (not shown in FIG. 70, which functions as a p-electrode), is formed in the form of a multi-layer metal film of Ni/Pt/Au. In the opening in the masking layer, the first electrode, which functions as an n-electrode, is formed in the form of a multi-layer metal film of Ti/Al/Pt/Au. The first and second electrodes may be formed by vapor deposition, lift-off technique or the like.

The semiconductor light-emitting device in this example is characterized by enabling part of the light generated within to emerge after reflection by the reflecting plane 240 which is parallel to the slant crystal plane. Since reflection improves the light emergence efficiency, the semiconductor light-emitting device has increased brightness. Moreover, the reflecting plane 240 is formed on the slant crystal plane which can be readily formed by itself by selective growth without additional etching.

Figure 71:
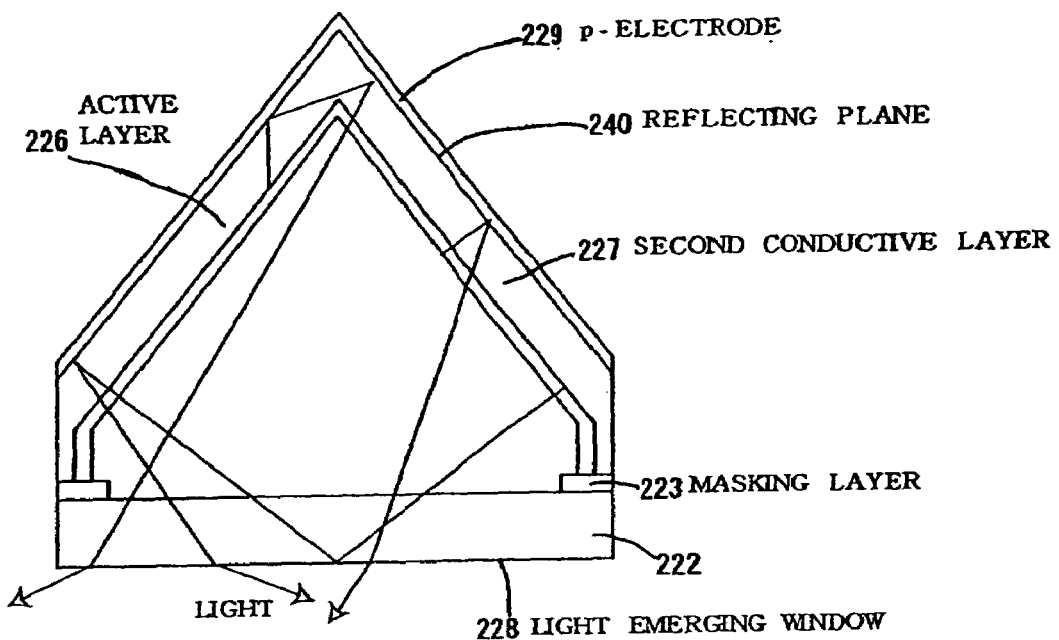
FIG. 71 is a sectional view showing a portion of the semiconductor light-emitting device in Example 19 of an embodiment of the present invention.

FIG. 71 is a sectional view showing major parts of the semiconductor light-emitting device. The device has its substrate for growth removed by irradiation with excimer laser through the reverse side, so that the bottom of the underlying layer for growth 222 functions as the light emerging window 228. The underlying layer for growth 222 is a silicon-doped GaN layer, which is connected to an n-electrode (not shown). As shown in FIG. 70, the light generated by the active layer 226 advances to the second conductive layer 227 to be reflected by the reflecting plane 240, and it eventually emerges from the light emerging window 228. The light generated by the active layer 226 also advances to the light emerging window 228. Thus, the light undergoes total reflection and is directed to the reflecting plane 240. The reflected light advances along the optical path altered on the basis of a relationship of a reflection angle to an incident angle, and emerges from the light emerging window 228 if the angle of incidence is smaller than the critical angle.

The mechanism of reflection will be explained in more detail below. The refractive index in the device is larger than that in the outside. Therefore, light with a large incident angle to the interface experiences total reflection. The condition of total reflection is as follows.

$$\phi c = \sin^{-1}(n1/n2)$$

(where, $\phi c$ denotes the critical incident angle to the interface, and n1 and n2 respectively denote the refractive index of the outside and the inside:

For example, φc is 24.6° when n1 is equal to 1 and n2 is equal to 2.4.

With the semiconductor light-emitting device constructed as shown in FIG. 1, a portion of the light generated by the active layer experiences total reflection by the window region and that portion of light experiences total reflection repeatedly, without emerging from the window. This does not occur in a semiconductor device made pursuant to an embodiment of the present invention because the reflecting plane 240 is inclined so that that a portion of the light which has experienced total reflection is reflected again by the reflecting plane and returned along the different optical path not involved with total reflection. Thus, the light emerges from the window, therefore improving light emergence efficiency and increasing brightness. Consequently, the semiconductor light-emitting device in this example has improved light emergence efficiency and high brightness.

Figure 72:
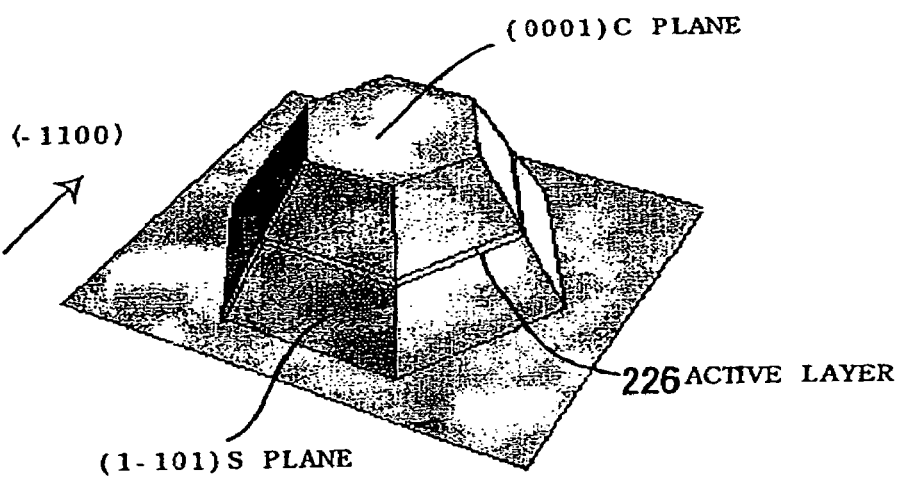
FIG. 72 is a perspective view showing the model of crystal grown layer that is used as the basis for calculations in production of the semiconductor light-emitting device in the Examples of an embodiment of the present invention.
Figure 73:
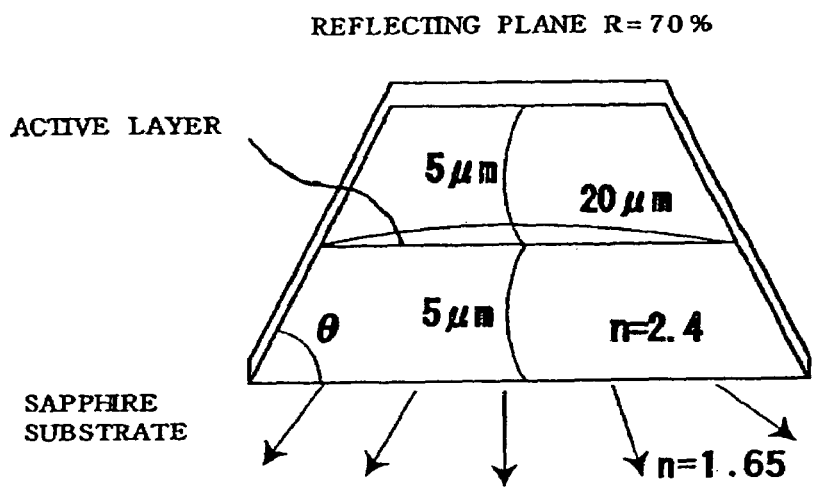
FIG. 73 is a schematic diagram showing the model which is used for calculations of angle dependence in production of the semiconductor light-emitting device in Examples of an embodiment of the present invention.
Figure 74:
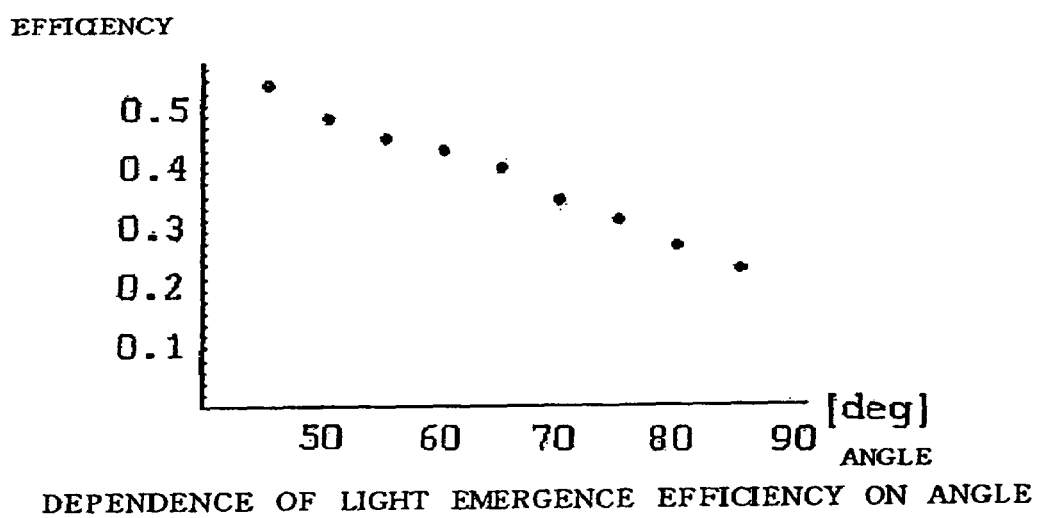
FIG. 74 is a line graph showing the angle dependence on the light emergence efficiency which is obtained from the above-mentioned calculations in accordance with an embodiment of the present invention.
Figure 75:
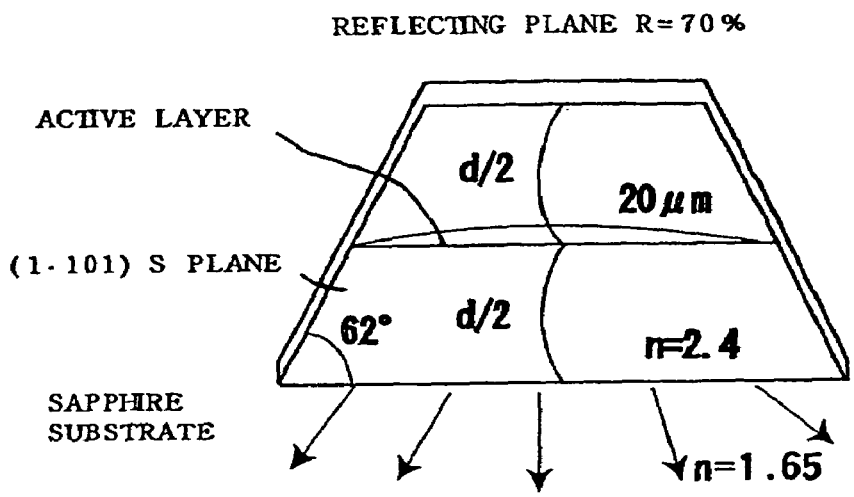
FIG. 75 is a schematic diagram showing the model which is used for calculations of height dependence in production of the semiconductor light-emitting device in Examples of an embodiment of the present invention.
Figure 76:
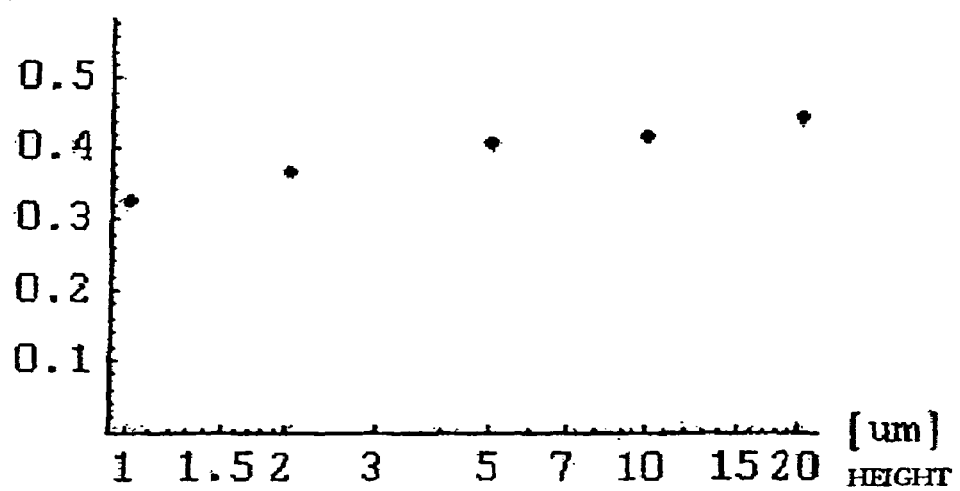
FIG. 76 is a line graph showing the height dependence on the light emergence efficiency which is obtained from the above-mentioned calculations in accordance with an embodiment of the present invention.

FIGS. 72 to 76 illustrate the results of simulation of the reflecting plane. FIG. 72 is a perspective view showing the model of the crystal grown layer which was used as the base of calculations. FIG. 73 is a diagram showing the model which was used to calculate the angle dependence. FIG. 74 is a diagram showing the dependence of angle on light emergence efficiency. FIG. 75 is a diagram showing the model which was used to calculate the height dependency. FIG. 76 is a diagram showing the dependence of height on light emergence efficiency.

The simulation is based on the assumption that the crystal grown layer has the flat C-plane at its top and also has the active layer which is not parallel to the principal plane of the substrate for growth. This assumption does not differ essentially from the actual one in light emergence efficiency. The angle dependence was simulated on the following assumption, as shown in FIG. 73. The sapphire substrate has a refractive index of n equal to 1.65. The active layer is 20 μm wide and is formed 5 μm above the substrate. The crystal grown layer has a refractive index of n equal to 2.4. The reflecting plane has a reflectivity of 70% and is formed at a height of 10 μm. On the basis of this assumption, the angle of reflection by the reflecting plane was calculated. The results are shown in FIG. 74. It is noted that improvement in light emergence efficiency is achieved in the range of about 50° to about 90°, with better results near about 50°.

The height dependence was simulated on the following assumption, as shown in FIG. 75. The sapphire substrate has a refractive index of n equal to 1.65. The active layer is 20 μm wide and is formed d/2 μm above the substrate. The crystal grown layer has a refractive index of n equal to 2.4. The reflecting plane has a reflectivity of 70%. The reflecting plane (S-plane) is formed at an angle of 62°. The results are shown in FIG. 76. It is noted that light emergence efficiency is improved as the height d increases. The results of the simulations shown in FIGS. 74 and 76 suggest that light emergence efficiency is improved as the angle θ of the side face is decreased and as the aspect ratio (the ratio of height d to the width of the device) is increased. In other words, the smaller the device size, the shorter the time required for crystal growth, and the smaller the device size, the more significant the effect.

The semiconductor light-emitting device in this example is characterized in that part of light generated in it emerges after reflection by the reflecting plane 240 which is parallel to the slant crystal plane. Since reflection by the reflecting plane 240 improves the emergence efficiency, the semiconductor light-emitting device has increased brightness. Moreover, the reflecting plane 240 is formed on the slant crystal plane which can be readily formed by itself by selective growth without additional etching.

The light-emitting device constructed as shown in FIG. 70 offers an advantage that, in addition to the effect produced by the increased area of the active layer, the S-plane slanting to the principal plane of the substrate increases the number of bonds from nitrogen atoms to gallium atoms, thereby increasing the effective V/III ratio. Therefore, the resulting light-emitting device has improved performance. In addition, it is believe that dislocations extending from the substrate can bend thereby decreasing defects. The slant crystal plane slanting to the principal plane of the substrate prevents multiple reflection, thereby permitting the generated light to emerge efficiently. The structure in which the active layers 226 are isolated or separated from one another which obviates the necessity of etching the active layer 226, thereby eliminating damages to the active layer. Another advantage is that the effective area of the active layer 226 is not reduced by the electrode.

Example 20

Figure 77:
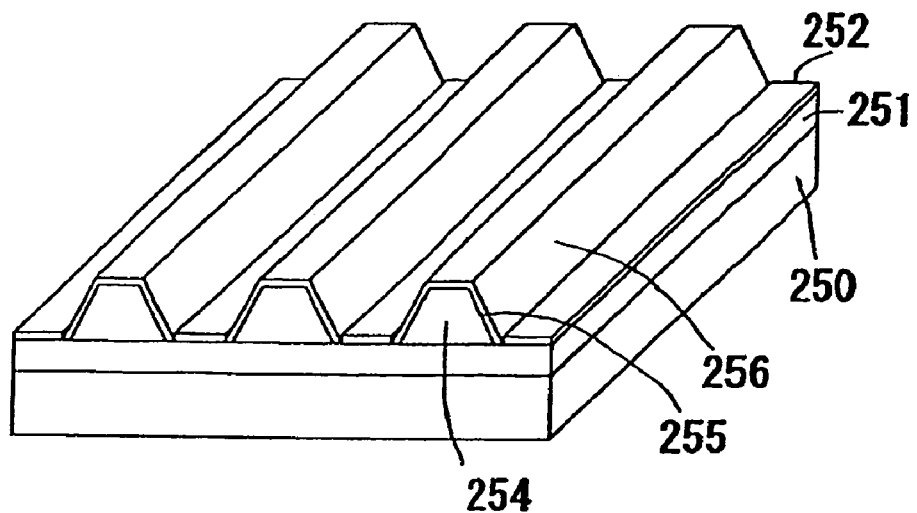
FIG. 77 is a perspective view showing the structure of the semiconductor light-emitting device in Example 20 of the present invention that is characterized by the crystal grown layer which is formed in a stripe pattern in accordance with an embodiment of the present invention.

This example demonstrates a semiconductor light-emitting device in which the crystal grown layer 254 on the substrate for growth 250 takes the shape of a stripe, as shown in FIG. 77. The device includes the substrate for growth 250, the underlying layer for growth 251, the masking layer 252, and the crystal grown layer 254 formed in the window region in the masking layer 252. The crystal grown layer 254 has the slant side face 256 as the S-plane, on which the active layer 255 is formed. The light generated by the device is reflected by the reflecting plane parallel to the S-plane, which improves light emergence efficiency. Therefore, the semiconductor light-emitting device has high brightness and the slant crystal grown layer as the base of the reflecting plane is readily formed by selective growth. Thus, the device effectively relieves brightness saturation and improves device reliability.

Example 21

Figure 78:
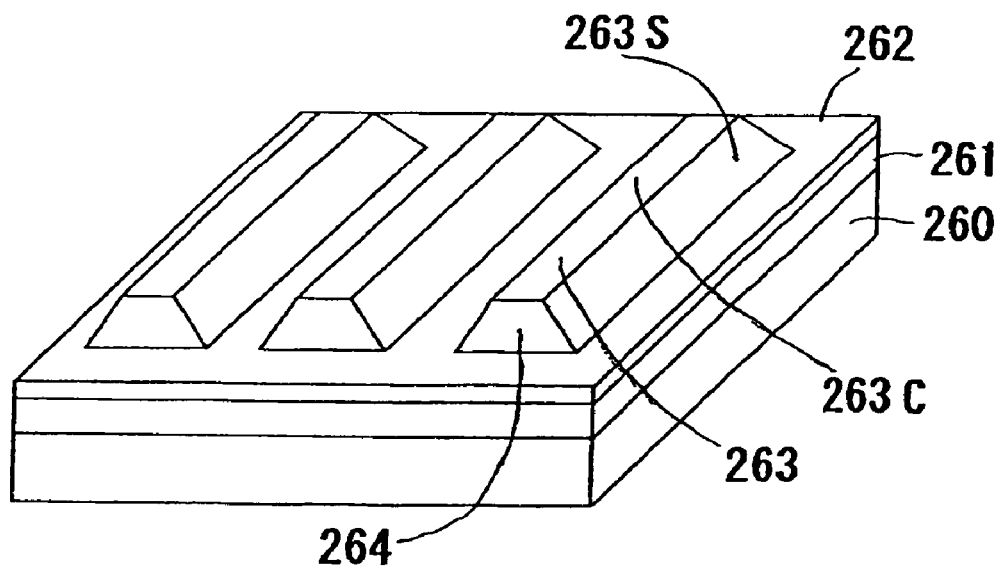
FIG. 78 is a perspective view showing the structure of the semiconductor light-emitting device in Example 21 of an embodiment of the present invention that is characterized by the crystal grown layer which is formed in a pattern of elongated quadrangular prismoids.

This example demonstrates a semiconductor light-emitting device in which the crystal grown layer 264 on the substrate for growth 260 takes the shape of an elongated prismoid, as shown in FIG. 78. The device includes the substrate for growth 260, the underlying layer for growth 261, the masking layer 262, and the crystal grown layer 264 formed in the window region in the masking layer 262. The crystal grown layer 264 has the slant side face 263S as the S-plane, the longitudinal end face 264 as the (11-22) plane, and the top face 263C as the C-plane (which is identical to the principal plane of the substrate). The active layer (which is not shown) is formed on the slant side face 263S, the end face 264, and the top face 263C. The light generated by the device is reflected by the reflecting plane parallel to the S-plane, which improves light emergence efficiency. Therefore, the semiconductor light-emitting device has high brightness and the slant crystal grown layer as the base of the reflecting plane is readily formed by selective growth. Thus, the device effectively relieves brightness saturation and improves device reliability.

Example 22

Figure 79:
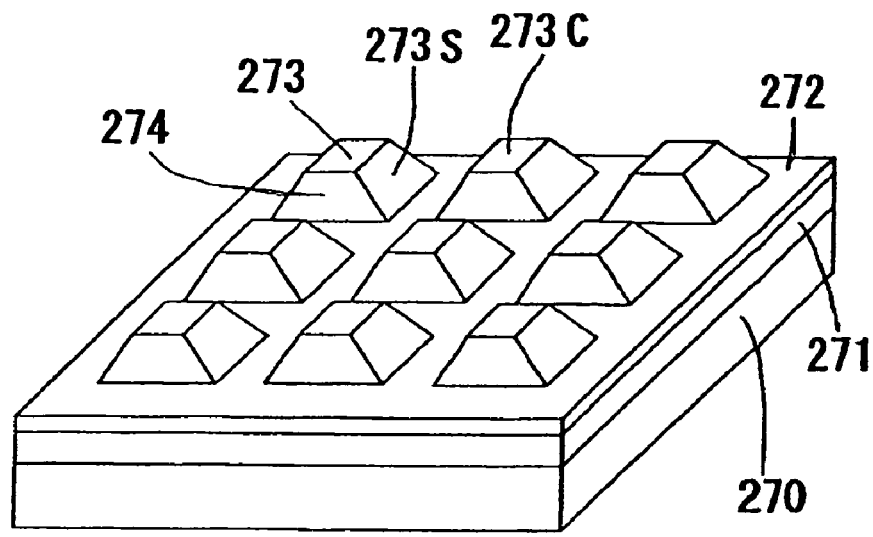
FIG. 79 is a perspective view showing the structure of the semiconductor light-emitting device in Example 22 of an embodiment of the present invention that is characterized by the crystal grown layer which is formed in a pattern of quadrangular prismoids.

This example demonstrates a semiconductor light-emitting device in which the crystal grown layer 274 on the substrate for growth 270 takes the shape of a quadrangular prismoid, as shown in FIG. 79. The device includes the substrate for growth 270, the underlying layer for growth 271 formed thereon, the masking layer 272, and the crystal grown layer 273 formed in the window region in the masking layer 272. The quadrangular prismoids are arranged in a matrix. The crystal grown layer 273 (in the shape of a quadrangular prismoid) has the slant side face 273S as the S-plane, another slant side face 274 as the (11-22) plane, and the top face 2753C as the C-plane (which is identical to the principal plane of the substrate). The active layer (which is not shown) is formed on the slant side face 273S, another face 274, and the top face 273C. The light generated by the device is reflected by the reflecting plane parallel to the S-plane, which improves light emergence efficiency. Therefore, the semiconductor light-emitting device has high brightness and the slant crystal grown layer as the base of the reflecting plane is readily formed by selective growth. Thus, the device effectively relieves brightness saturation and improves device reliability.

Example 23

Figure 80:
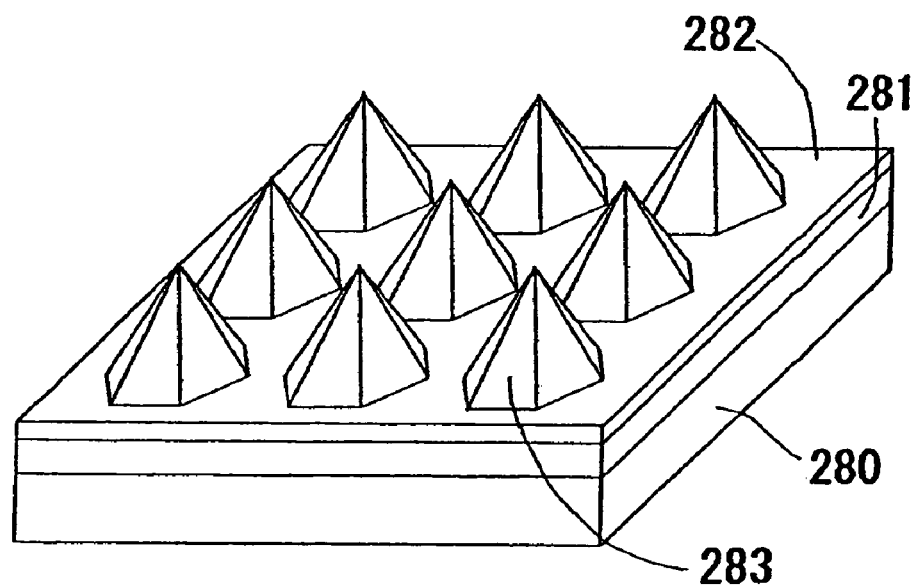
FIG. 80 is a perspective view showing the structure of the semiconductor light-emitting device Example 23 of an embodiment of the present invention that is characterized by the crystal grown layer which is formed in a pattern of hexagonal pyramids.

This example demonstrates a semiconductor light-emitting device in which the crystal grown layer 283 on the substrate for growth 280 takes the shape of a hexagonal pyramid, as shown in FIG. 80. The device includes the substrate for growth 280, the underlying layer for growth 281 formed thereon, the masking layer 282, and the crystal grown layer 283 formed in the window region in the masking layer 282. The hexagonal pyramids are arranged in a matrix. The crystal grown layer 283 (in the shape of a hexagonal pyramid) has the slant side faces as the S-plane. The hexagonal pyramid has the cross section as shown in FIG. 69. The active layer (which is not shown) is formed on the slant S-plane. The light generated by the device is reflected by the reflecting plane parallel to the S-plane, which improves light emergence efficiency. Therefore, the semiconductor light-emitting device has high brightness and the slant crystal grown layer as the base of the reflecting plane is readily formed by selective growth. Thus, the device effectively relieves brightness saturation and improves device reliability.

Example 24

Figure 81:
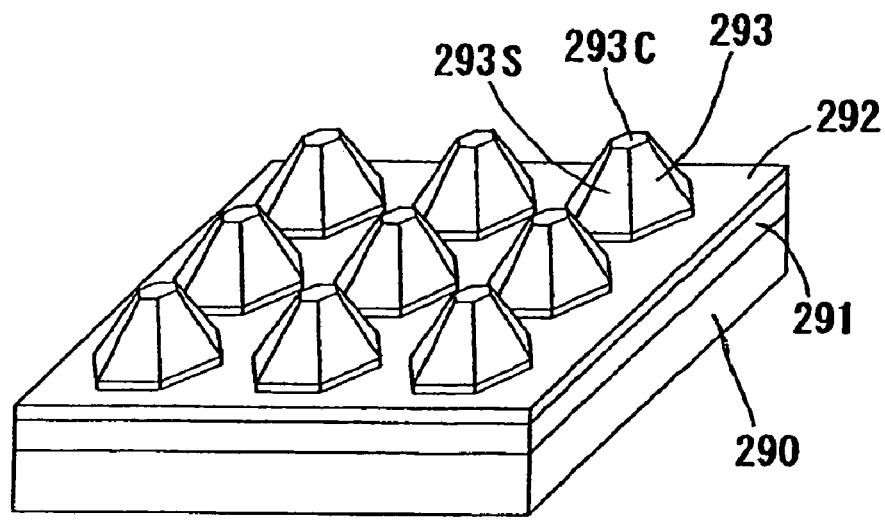
FIG. 81 is a perspective view showing the structure of the semiconductor light-emitting device in Example 24 of an embodiment of the present invention that is characterized by the crystal grown layer which is formed in a pattern of hexagonal prismoids.

This example demonstrates a semiconductor light-emitting device in which the crystal grown layer 293 on the substrate for growth 290 takes the shape of a hexagonal prismoid, as shown in FIG. 81. The device includes the substrate for growth 290, the underlying layer for growth 291 formed thereon, the masking layer 292, and the crystal grown layer 293 formed in the window region in the masking layer 292. The hexagonal prismoids are arranged in a matrix pattern. The crystal grown layer 293 (in the shape of a hexagonal prismoid) has the slant side faces 293S as the S-plane and the top face 293C as the C-plane which is identical with the principal plane of the substrate. The base of the hexagonal prismoid is the M-plane or the (1-100) plane, which is formed low (i.e., near the base of the hexagonal prismoid). The hexagonal prismoid has the cross section as shown in FIG. 69. The active layer (which is not shown) is formed on the slant S-plane and the C-plane. The light generated by the device is reflected by the reflecting plane parallel to the S-plane, which improves light emergence efficiency. Therefore, the semiconductor light-emitting device has high brightness and the slant crystal grown layer as the base of the reflecting plane is readily formed by selective growth. Thus, the device effectively relieves brightness saturation and improves device reliability.

Example 25

Figure 82:
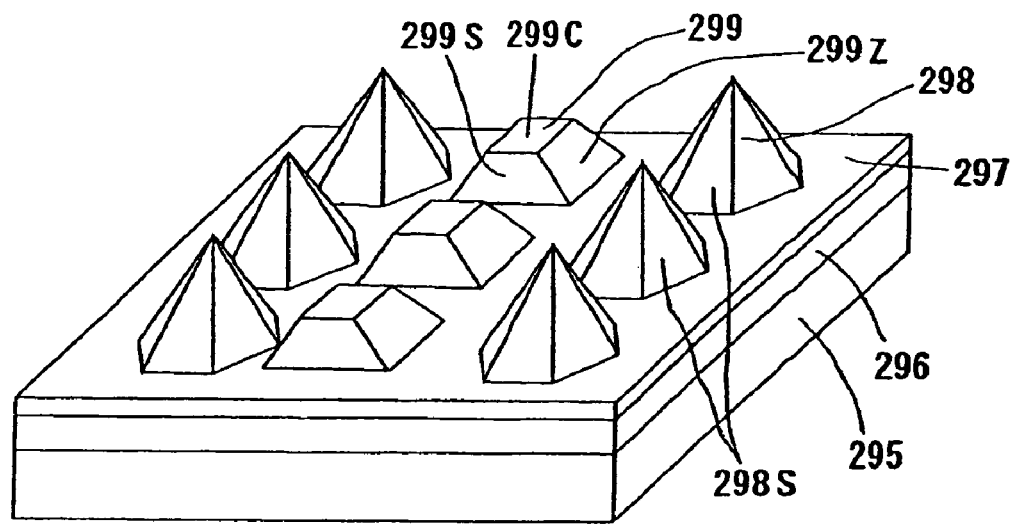
FIG. 82 is a perspective view showing the structure of the semiconductor light-emitting device in Example 25 of an embodiment of the present invention that is characterized by the crystal grown layer which is formed in a mixed pattern of hexagonal pyramids and quadrangular prismoids.

This example demonstrates a semiconductor light-emitting device in which the crystal grown layers 298 and 299 on the substrate for growth 295 take respectively the shape of a hexagonal pyramid and a quadrangular prismoid, as shown in FIG. 82. The device includes the substrate for growth 295, the underlying layer for growth 296 formed thereon, the masking layer 297, and the crystal grown layers 298 and 299 formed in the window region in the masking layer 297. The crystal grown layer 298 takes the shape of a hexagonal pyramid, and the crystal grown layer 299 takes the shape of a quadrangular prismoid. The hexagonal pyramids and quadrangular prismoids are arranged in a matrix, and they are arranged in line alternately.

The crystal grown layer 299 (in the shape of a quadrangular prismoid) has the slant side faces 299S as the S-plane, another slant faces 229Z as the (11-22) plane, and the top face 299C as the C-plane which is identical to the principal plane of the substrate. The crystal grown layer 298 (in the shape of a hexagonal pyramid) has the slant side faces 298S as the S-plane. The hexagonal pyramid has the cross section as shown in FIG. 69. The active layer (which is not shown) is formed on the slant S-plane and the C-plane. The light generated by the device is reflected by the reflecting plane parallel to the S-plane, which improves light emergence efficiency. Therefore, the semiconductor light-emitting device has high brightness and the slant crystal grown layer as the base of the reflecting plane is readily formed by selective growth. Thus, the device effectively relieves brightness saturation and improves device reliability.

Example 26

This example demonstrates a process for producing the above-mentioned semiconductor light-emitting device. The process will be described with reference to FIGS. 83 to 88.

Figure 83:
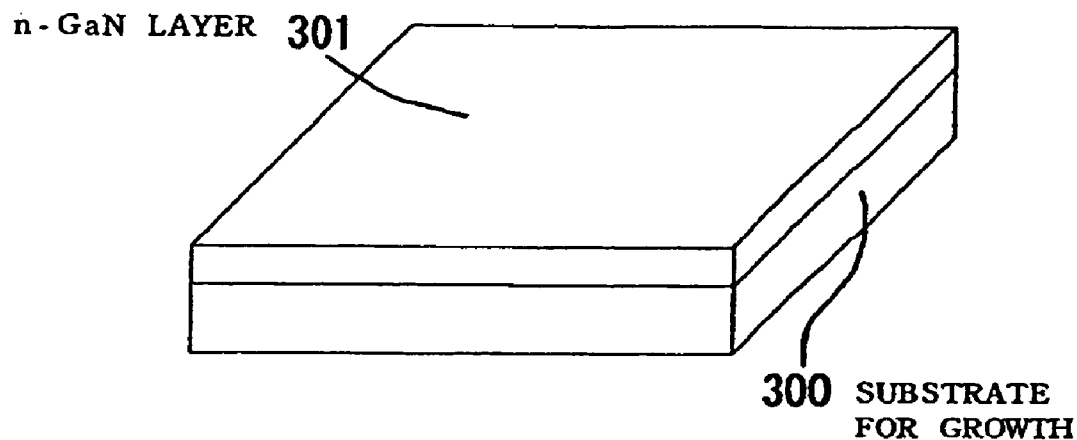
FIG. 83 is a perspective view showing the step of forming an underlying layer for growth in the production of the semiconductor light-emitting device in Example 25 of an embodiment of the present invention.

First, on a substrate for growth 300 such as a sapphire substrate the n-type GaN layer 301 is formed by MOCVD or the like as an underlying layer for growth, as shown in FIG. 83. The n-type GaN layer 301 needs not be n-type initially. However, it is acceptable so long as its uppermost surface is n-type. The desired n-type GaN layer 301 may be formed by doping with silicon, for instance.

Figure 84:
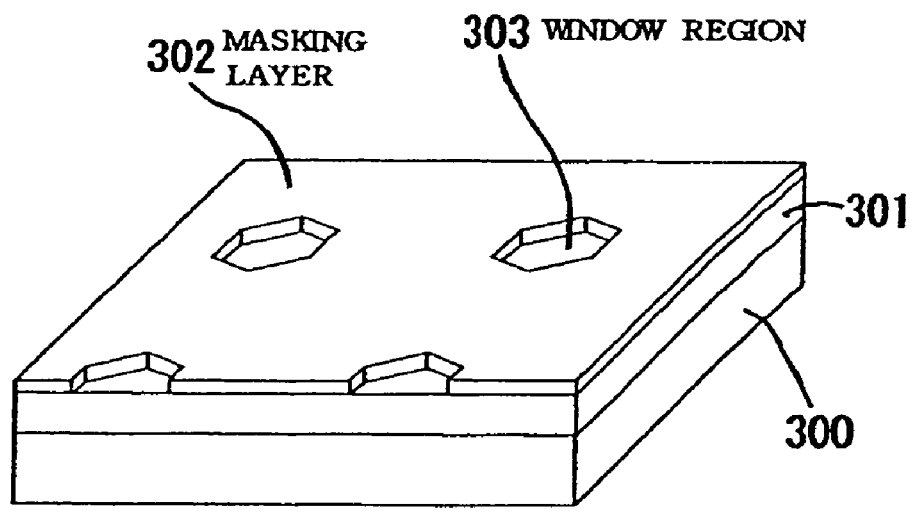
FIG. 84 is a perspective view showing the step of forming window regions in the production of the semiconductor light-emitting device in Example 25 of an embodiment of the present invention.
Figure 85:
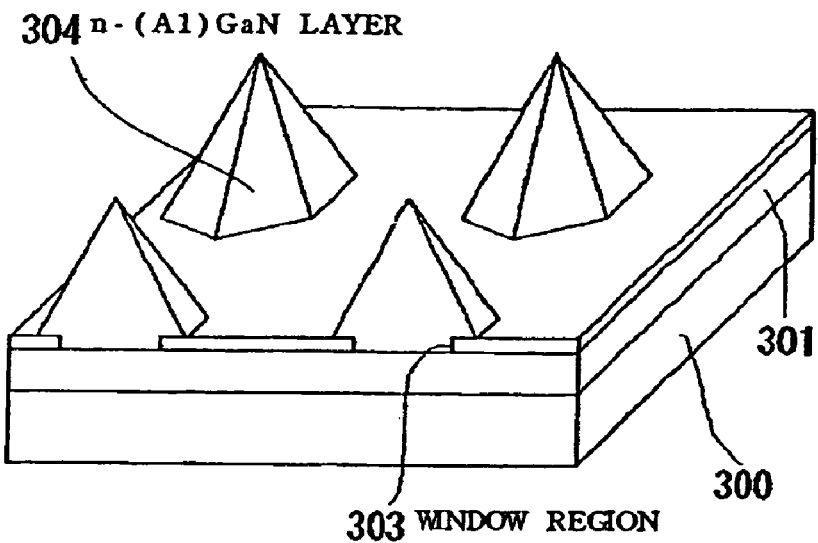
FIG. 85 is a perspective view showing the step of forming a crystal grown layer in the production of the semiconductor light-emitting device in Example 25 of an embodiment of the present invention.

Then, on the entire surface of the n-type GaN layer 301 the masking layer 302 is formed by CVD as a growth inhibiting film, such as a silicon oxide film, a silicon nitride film, a tungsten film, and the like. In the masking layer 302, the hexagonal window region 303, in which the device will be formed, is formed, as shown in FIG. 84.

Subsequently, selective growth is carried out such that the n-type (Al)GaN layer 304 (as the crystal grown layer) is grown from the window region 303. This n-type (Al)GaN layer 304, which takes the shape of an approximately hexagonal pyramid, functions also as a cladding layer. The slant side face is the S-plane.

Figure 86:
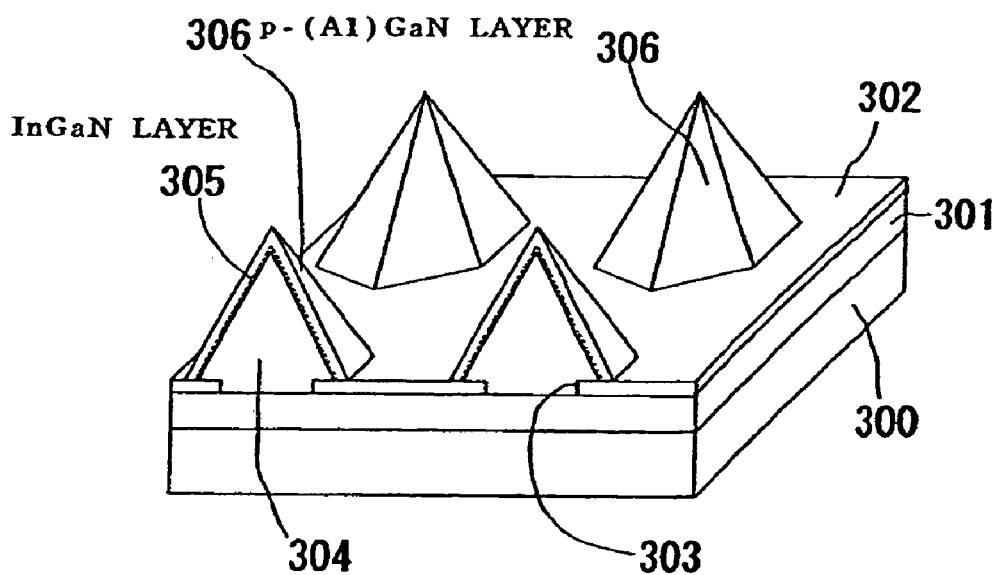
FIG. 86 is a perspective view showing the step of forming a layer of a second conductivity type in the production of the semiconductor light-emitting device in Example 25 of an embodiment of the present invention.
Figure 87:
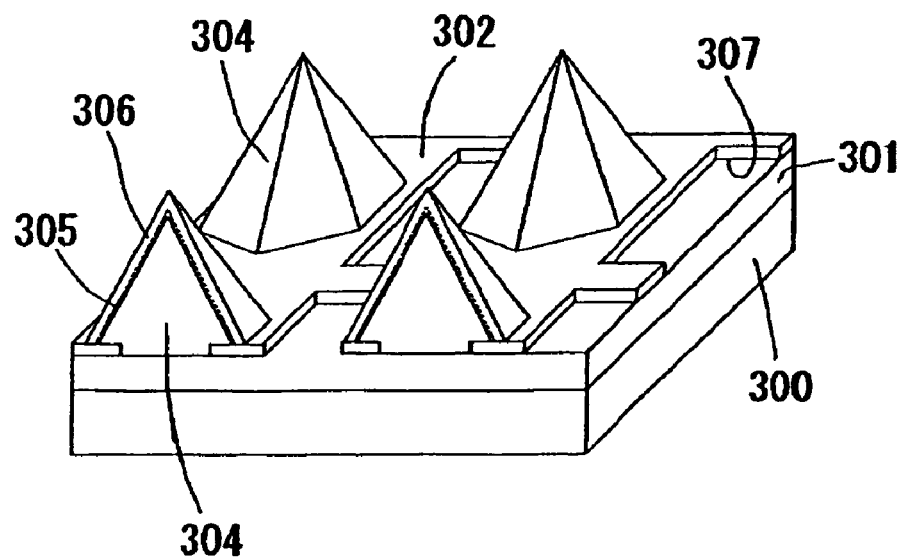
FIG. 87 is a perspective view showing the step of forming a contact region in the production of the semiconductor light-emitting device in Example 25 of an embodiment of the present invention.
Figure 88:
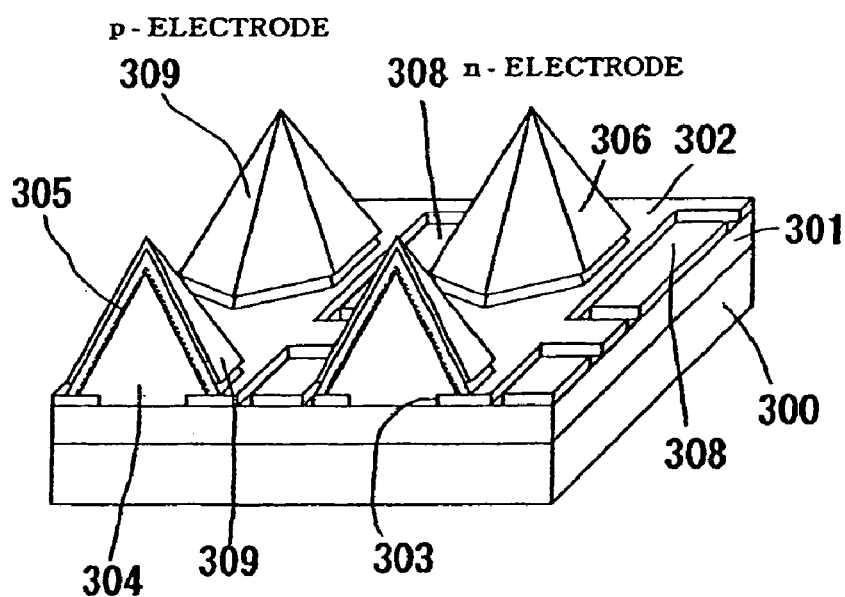
FIG. 88 is a perspective view showing the step of forming an electrode in the production of the semiconductor light-emitting device in Example 25 of an embodiment of the present invention.

On the slant side face, the InGaN layer 305 (as an active layer) and the p-type (Al)GaN layer 306, are formed as shown in FIG. 86. The InGaN layer 305 as an active layer extends broadly over the S-plane of the (Al)GaN layer 304 as the crystal grown layer, not parallel to the principal plane of the substrate for growth. The area S of the active layer is larger than the area of the window region 303 and the projected area of the crystal grown layer, and is formed with sufficient expanse. It is possible to form an AlGaN cap layer on the InGaN layer 305. The slant crystal face of the p-type (Al)GaN layer 306 functions as the reflecting plane.

Where poly-GaN is grown on the masking layer, unnecessary parts are removed by etching. The masking layer 302 is removed partly or entirely to form the n-side contact region 307, as shown in FIG. 87. The p-electrode 309 of Ni/Pt/Au is formed by vapor deposition or the like. The n-electrode 308 of Ti/Al/Pt/Au is formed in the contact region 307 by lift-off technique or the like (FIG. 88). After alloying, the device on the substrate is completed. Since the p-electrode 309 is formed on the p-type (Al)GaN layer 306 which functions as a reflecting plane or a reflecting region, it also functions as a reflecting film and a light-shielding film.

The individual devices are so small that it is difficult to separate them from one another. However, it is only necessary to separate them into groups by dicing, cleavage, or the like, each group including devices arranged in one dimension or two dimensions. Individual devices in each group may or may not be driven independently. The GaN crystals grown on the sapphire substrate can be peeled off from the sapphire substrate if the sapphire/GaN interface is subjected to UV laser abrasion through the sapphire, as reported by W. S. Wong et al. in APL-75-10, 1360-2. If the first grown film (the first conductive film) is removed by etching before or after laser abrasion, it is possible to form a single semiconductor light-emitting device having the basic structure according to an embodiment of the present invention.

As mentioned above, the process in this example offers an advantage that the S-plane can be formed easily by selective growth and the active layer can be formed on the crystal grown layer whose side face is the S-plane. Thus, it is possible to form the reflecting plane by itself. The light generated by the device is partly reflected by the reflecting plane parallel to the slant crystal plane formed by selective growth. This reflection improves light emergence efficiency and hence, the semiconductor light-emitting device has high brightness.

Example 27

Figure 89:
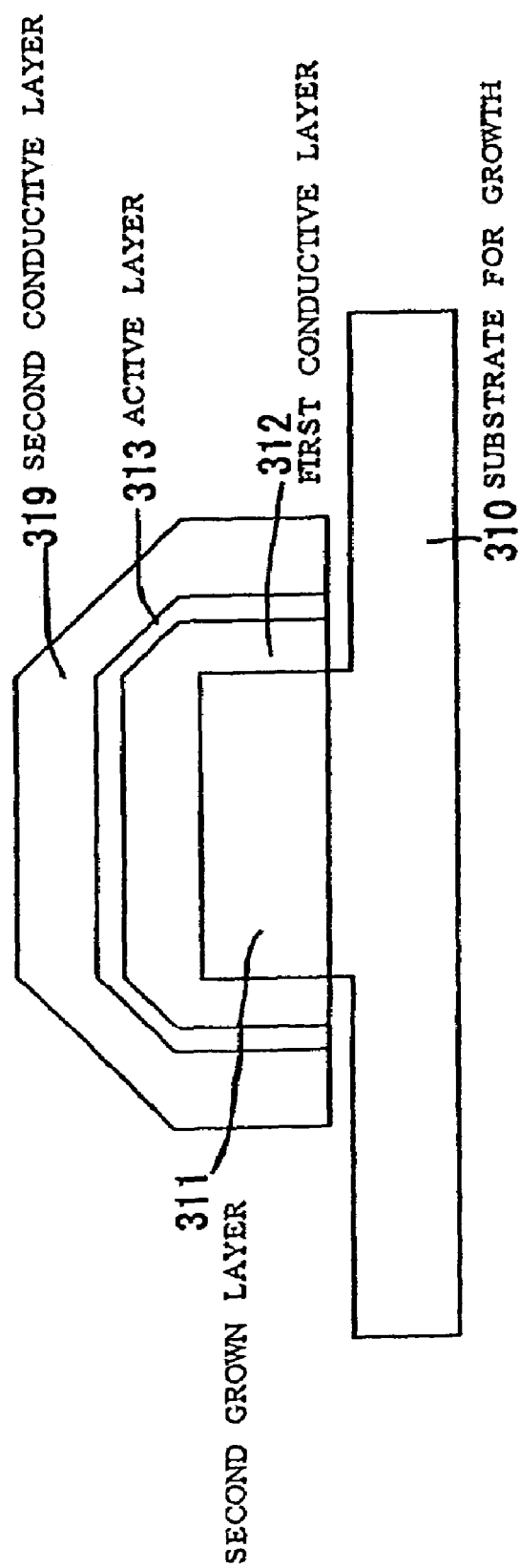
FIG. 89 is a sectional view showing the semiconductor light-emitting device in Example 26 of an embodiment of the present invention.

This example demonstrates a semiconductor light-emitting device having the structure as shown in FIG. 89. The device includes the substrate for growth 310, the second grown layer 311 formed partly thereon, the first conductive layer 311 (covering the second grown layer 311), the active layer 313, and the second conductive layer 319. Although there is not a masking layer or window regions, the area of the active layer 313 is larger than the projected area of the crystal grown layer, thereby effectively relieving brightness saturation and improving device reliability.

In other words, even if a growth inhibiting film (such as a masking layer) is not used, it is possible to form a stable surface and produce the same effect as that which would be obtained by forming a growth inhibiting film, if microfabrication is carried out by etching (for example, surface irregularities are formed on the substrate for growth or the crystal film which has been grown previously).

Additionally, according to an embodiment of the present invention, a hexagonal opening is most desirable as the window region in which the hexagonal pyramid is grown. However, the shape of the opening or the direction of the boundary of the opening is arbitrary because the stable plane is eventually formed by itself even with growth through a round opening. The present invention is applicable also to the structure in which the stable plane, such as the (11-22) plane and the (1-100) plane other than the (1-101) plane in a wurtzite crystal, is formed by itself.

At present, red LEDs are usually made from an AlGaInP compound of zincblende structure. This compound has stable planes such as the (011) plane and the (111) plane with respect to the (001) substrate. If it is grown under adequate conditions, it is possible to form the stable plane and the active layer thereon.

The advantage of the semiconductor light-emitting device and its production process according to an embodiment of the present invention is that it is possible to increase the effective V/III ratio by utilizing the slant crystal plane slanting to the principal plane of the substrate. This permits more atoms constituting the compound crystal to be taken up and decreases the fluctuation of light emission. Moreover, it is possible to suppress the dissociation of nitrogen atoms and improve crystal properties, thereby decreasing the density of point defects. This prevents brightness from becoming saturated when the light-emitting device is supplied with a strong current. The slant crystal plane slanting to the principal plane of the substrate prevents multiple reflection and hence, permits the generated light to emerge efficiently.

The selective growth to form the crystal layer as the slant crystal plane (such as the S-plane) gives minute devices in a small range. Thus, it is possible to densely arrange the devices or to separate the devices from one another by dicing or the like. Part of the stable plane resulting from selective growth is flat on the atomic scale; it has no fluctuation in brightness and it permits light emission with a narrow half width. Therefore, this plane can be applied to semiconductor light-emitting diodes as well as semiconductor lasers.

The semiconductor light-emitting device according to an embodiment of the present invention is characterized in that part of light emerging from it is one which has been reflected by the reflecting plane which is formed by selective growth parallel to the slant crystal plane. Reflection improves light emergence efficiency and hence, the semiconductor light-emitting device has high brightness. The slant crystal layer as the base of the reflecting plane is readily formed by selective growth without additional production steps such as etching. Moreover, the active layer parallel to the slant crystal plane has a large effective area, which leads to reduced resistance, reduced heat generation, and improved reliability. With a large effective area, the active layer has a reduced load per unit area, which contributes to high brightness and high reliability. This produces its pronounced effect in the case of miniaturized devices. The semiconductor light-emitting device of the present invention is characterized by the large area possessed by the active layer, conductive layer, and electrode. The slant crystal plane helps improve the light emergence efficiency.

One feature of the semiconductor light-emitting device and its production process according to an embodiment of the present invention is that the cladding layer of a first conductivity type, the active layer, and the cladding layer of a second conductivity type partly or entirely extend to the masking layer around the opening. An advantage of this structure (with the masking layer remaining) is that the laterally grown part is held by a support which does not disappear. Moreover, the masking layer relieves steps due to the selectively grown structure. The masking layer, functioning as a supporting layer of the first grown layer, also keeps the p-electrode and the n-electrode apart with certainty, thereby preventing short-circuiting, even when the substrate is stripped off by laser irradiation.

The semiconductor light-emitting device of the present invention may be constructed such that the cladding layer of a first conductivity type, the active layer, and the cladding layer of a second conductivity type entirely cover the second grown layer and the ends of the cladding layer of a first conductivity type, the active layer, and the cladding layer of a second conductivity type come into direct contact with the masking layer. This structure protects the active layer from oxidation and other deterioration and also produces an effect of increasing the light emission area.

An advantage of the semiconductor light-emitting device according to an embodiment of the present invention is that the selective growth to form the crystal layer as the slant crystal plane gives minute devices in a small range. Thus it is possible to densely arrange the devices or to separate the devices from one another by dicing or the like. Part of the stable plane resulting from selective growth is flat on the atomic scale; it has no fluctuation in brightness and it permits light emission with a narrow half width. Therefore, this plane can be applied to semiconductor light-emitting diodes as well as semiconductor lasers.

Another advantage of the semiconductor light-emitting device of the present invention is that the active layer has a large effective area, which leads to reduced resistance, reduced heat generation, and improved reliability. With a large effective area, the active layer has a reduced load per unit area, which contributes to high brightness and high reliability. This produces its pronounced effect in the case of miniaturized devices. The semiconductor light-emitting device of the present invention is characterized by the large area possessed by the active layer, conductive layer, and electrode. The slant crystal plane helps improve the light emergence efficiency.

Although the present invention has been described with reference to specific embodiments, those of skill in the art will recognize that changes may be made thereto without departing from the spirit and scope of the invention as set forth in the hereafter appended claims.

The invention is claimed as follows:

1. A lighting system comprising:
a plurality of semiconductor light-emitting device arranged so as to emit light in response to a signal, each of the semiconductor light-emitting devices comprising a substrate including a substrate surface positioned along a surface plane, a crystal layer including a crystal surface oriented along a crystal surface plane diagonally intersecting the substrate surface plane, and a first conductive layer, an active layer, and a second conductive layer each formed along at least a portion of the crystal surface, wherein the crystal surface plane comprises a plane having a plane orientation inclined at an angle ranging from about 5 to about 6 degrees with respect to at least one of a S-plane and a (11-22) plane.

* * * * *